(12) United States Patent
Badehi et al.

(10) Patent No.: US 8,043,877 B2
(45) Date of Patent: Oct. 25, 2011

(54) ELECTRO-OPTIC INTEGRATED CIRCUITS AND METHODS FOR THE PRODUCTION THEREOF

(75) Inventors: Avner Badehi, Harei Yehuda (IL); Sylvie Rockman, Zichron Ya'akov (IL)

(73) Assignee: Xloom Communications, Ltd., Tel Aviv (IL)

( * ) Notice: Subject to any disclaimer, the term of this patent is extended or adjusted under 35 U.S.C. 154(b) by 359 days.

(21) Appl. No.: 12/198,867

(22) Filed: Aug. 26, 2008

(65) Prior Publication Data

US 2009/0246905 A1    Oct. 1, 2009

Related U.S. Application Data

(63) Continuation of application No. 11/365,328, filed on Feb. 28, 2006, now abandoned.

(60) Provisional application No. 60/373,415, filed on Apr. 16, 2002.

(51) Int. Cl.
 *H01L 21/00* (2006.01)
(52) U.S. Cl. ................ 438/29; 438/69; 438/72
(58) Field of Classification Search ............ 438/29, 438/69, 72
 See application file for complete search history.

(56) References Cited

U.S. PATENT DOCUMENTS

| | | | |
|---|---|---|---|
| 3,968,360 | A | 7/1976 | Monnier |
| 4,117,329 | A | 9/1978 | Kruer et al. |
| 4,168,883 | A | 9/1979 | MacLeod et al. |
| 4,351,051 | A | 9/1982 | van Alem et al. |
| 4,386,821 | A | 6/1983 | Simon et al. |
| 4,399,541 | A | 8/1983 | Kovats et al. |
| 4,451,119 | A | 5/1984 | Meyers et al. |
| 4,602,158 | A | 7/1986 | Barrett |
| 4,615,031 | A | 9/1986 | Eales et al. |
| 4,689,246 | A | 8/1987 | Barrett |
| 4,750,799 | A | 6/1988 | Kawachi et al. |
| 4,778,242 | A | 10/1988 | Ota et al. |
| 4,810,053 | A | 3/1989 | Woith |
| 4,826,272 | A * | 5/1989 | Pimpinella et al. ......... 385/92 |
| 4,988,159 | A | 1/1991 | Turner et al. |
| 4,989,930 | A | 2/1991 | Nakagawa et al. |
| 4,989,943 | A | 2/1991 | Yoshinaga et al. |

(Continued)

FOREIGN PATENT DOCUMENTS

EP    1008880    6/2000

(Continued)

OTHER PUBLICATIONS

International Search Report PCT/IL2003/00833 dated Jul. 27, 2004, 1 Page.

(Continued)

*Primary Examiner* — James Mitchell
(74) *Attorney, Agent, or Firm* — Perkins Coie LLP

(57) ABSTRACT

An electro-optic integrated circuit including an integrated circuit substrate at least one optical signal providing element and at least one discrete reflecting optical element mounted onto the integrated circuit substrate, cooperating with the at least one optical signal providing element and being operative to direct light from the at least one optical signal providing element. An electro-optic integrated circuit including an integrated circuit substrate, at least one optical signal receiving element and at least one discrete reflecting optical element mounted onto the integrated circuit substrate and cooperating with the at least one optical signal receiving element and being operative to direct light to the at least one optical signal receiving element.

31 Claims, 71 Drawing Sheets

U.S. PATENT DOCUMENTS

| | | | |
|---|---|---|---|
| 5,044,720 A | | 9/1991 | Haley et al. |
| 5,172,206 A | | 12/1992 | Iizuka et al. |
| 5,179,609 A | * | 1/1993 | Blonder et al. ............... 385/89 |
| 5,195,150 A | | 3/1993 | Stegmueller et al. |
| 5,200,631 A | | 4/1993 | Austin et al. |
| 5,231,686 A | | 7/1993 | Rabinovich |
| 5,400,419 A | | 3/1995 | Heinen et al. |
| 5,424,573 A | | 6/1995 | Kato et al. |
| 5,436,503 A | | 7/1995 | Kunitomo et al. |
| 5,446,814 A | | 8/1995 | Kuo et al. |
| 5,455,455 A | | 10/1995 | Badehi et al. |
| 5,485,540 A | | 1/1996 | Eda et al. |
| 5,547,906 A | | 8/1996 | Badehi et al. |
| 5,550,408 A | | 8/1996 | Kunitomo et al. |
| 5,600,741 A | | 2/1997 | Hauer et al. |
| 5,641,996 A | | 6/1997 | Omoya et al. |
| 5,644,667 A | * | 7/1997 | Tabuchi ....................... 385/49 |
| 5,716,759 A | | 2/1998 | Badehi et al. |
| 5,764,832 A | | 6/1998 | Tabuchi et al. |
| 5,771,218 A | | 6/1998 | Feldman et al. |
| 5,785,874 A | | 7/1998 | Eda et al. |
| 5,818,990 A | | 10/1998 | Steijer et al. |
| 5,841,591 A | | 11/1998 | Zhu et al. |
| 5,844,320 A | | 12/1998 | Ono et al. |
| 5,872,762 A | | 2/1999 | Feldman et al. |
| 5,886,971 A | | 3/1999 | Feldman et al. |
| 5,912,872 A | | 6/1999 | Feldman et al. |
| 5,933,551 A | | 8/1999 | Boudreau et al. |
| 5,972,232 A | * | 10/1999 | Lee et al. ....................... 216/24 |
| 5,980,663 A | | 11/1999 | Badehi et al. |
| 5,987,202 A | | 11/1999 | Gruenwald et al. |
| 6,022,758 A | | 2/2000 | Badehi et al. |
| 6,040,235 A | | 3/2000 | Badehi et al. |
| 6,052,498 A | | 4/2000 | Paniccia |
| 6,058,228 A | | 5/2000 | Fasanella et al. |
| 6,061,169 A | | 5/2000 | Feldman et al. |
| 6,071,652 A | | 6/2000 | Feldman et al. |
| 6,075,908 A | | 6/2000 | Paniccia et al. |
| 6,096,155 A | | 8/2000 | Harden et al. |
| 6,103,551 A | | 8/2000 | Ono et al. |
| 6,104,690 A | | 8/2000 | Feldman et al. |
| 6,115,521 A | * | 9/2000 | Tran et al. ....................... 385/52 |
| 6,117,707 A | | 9/2000 | Badehi et al. |
| 6,180,945 B1 | | 1/2001 | Barton et al. |
| 6,214,642 B1 | | 4/2001 | Chen et al. |
| 6,234,688 B1 | | 5/2001 | Boger et al. |
| 6,235,141 B1 | | 5/2001 | Feldman et al. |
| 6,295,156 B1 | | 9/2001 | Feldman et al. |
| 6,343,171 B1 | | 1/2002 | Yoshimura et al. |
| 6,396,981 B1 | | 5/2002 | Won et al. |
| 6,406,196 B1 | | 6/2002 | Uno et al. |
| 6,450,704 B1 | | 9/2002 | O'Connor et al. |
| 6,456,761 B2 | | 9/2002 | Yap et al. |
| 6,466,349 B1 | | 10/2002 | Valley et al. |
| 6,483,969 B1 | | 11/2002 | Yap et al. |
| 6,509,066 B1 | | 1/2003 | Jost |
| 6,605,806 B2 | | 8/2003 | Walmsley et al. |
| 6,611,635 B1 | | 8/2003 | Yoshimura et al. |
| 6,684,007 B2 | | 1/2004 | Yoshimura et al. |
| 6,690,845 B1 | | 2/2004 | Yoshimura et al. |
| 6,706,546 B2 | | 3/2004 | Yoshimura et al. |
| 6,741,781 B2 | | 5/2004 | Furuyama et al. |
| 6,785,447 B2 | | 8/2004 | Yoshimura et al. |
| 6,792,179 B2 | | 9/2004 | Lu et al. |
| 6,798,953 B1 | | 9/2004 | Cohen et al. |
| 6,819,836 B2 | | 11/2004 | Murali |
| 6,843,608 B2 | | 1/2005 | O'Connor et al. |
| 6,845,184 B1 | | 1/2005 | Yoshimura et al. |
| 6,869,229 B2 | | 3/2005 | Reedy et al. |
| 6,921,956 B2 | | 7/2005 | Yang et al. |
| 6,952,504 B2 | | 10/2005 | Bi et al. |
| 6,968,109 B2 | | 11/2005 | Furuyama et al. |
| 2001/0004413 A1 | | 6/2001 | Aihara |
| 2002/0025122 A1 | | 2/2002 | Ouchi et al. |
| 2002/0185588 A1 | | 12/2002 | Wagner et al. |
| 2003/0042493 A1 | | 3/2003 | Kazakevich |
| 2003/0118288 A1 | | 6/2003 | Korenaga et al. |
| 2003/0138219 A1 | | 7/2003 | O'Toole et al. |
| 2004/0021214 A1 | | 2/2004 | Badehi et al. |
| 2004/0067025 A1 | * | 4/2004 | Haraguchi et al. ............... 385/49 |
| 2004/0179791 A1 | * | 9/2004 | Robert et al. ....................... 385/88 |
| 2006/0022289 A1 | | 2/2006 | Badhei et al. |
| 2006/0145279 A1 | | 7/2006 | Badehi et al. |
| 2007/0013017 A1 | | 1/2007 | Badehi et al. |
| 2009/0034085 A1 | | 2/2009 | Badehi et al. |

FOREIGN PATENT DOCUMENTS

| | | |
|---|---|---|
| WO | WO-2003088286 | 10/2003 |
| WO | WO-2005036226 | 4/2005 |

OTHER PUBLICATIONS

International Search Report PCT/IL2003/00308 dated Jul. 2, 2004, 2 Pages.

European Supplementary Search Report EP 03 75 3903, dated Feb. 29, 2008, 1 Page.

OptoCube 40 3.35 Gb/s Channel Speed 850nm Reciever Array 12 Channel Parallel Optical Receivers and OptoCube 40 3.35 Gb/s Channel Speed 850nm Receiver Array 12 Channel Parallel Optical Transmitters from Corona Optical Systems, Inc., USA, 2004.

* cited by examiner

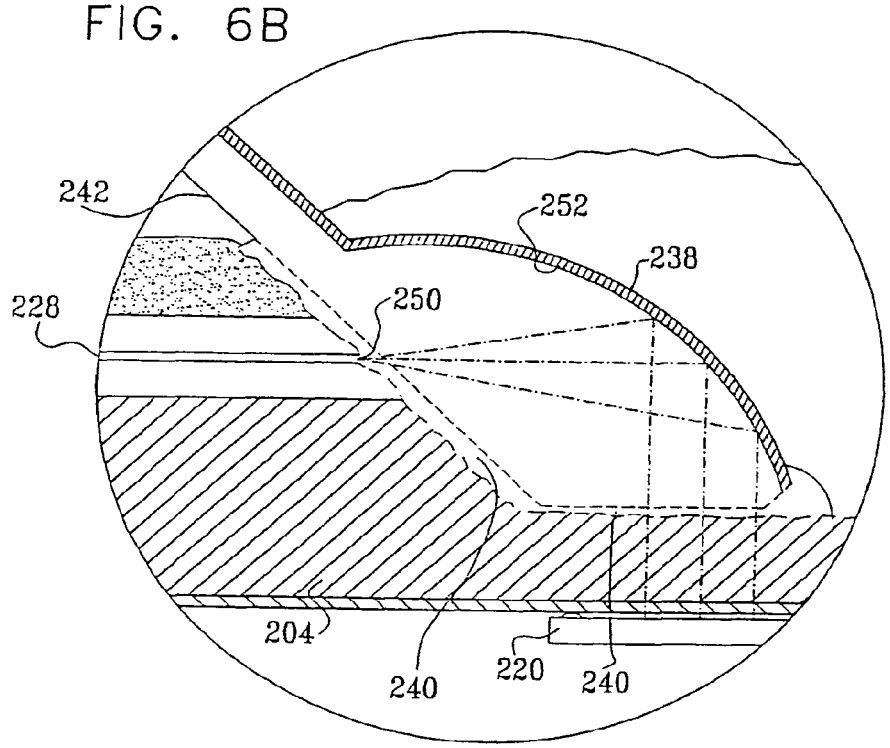
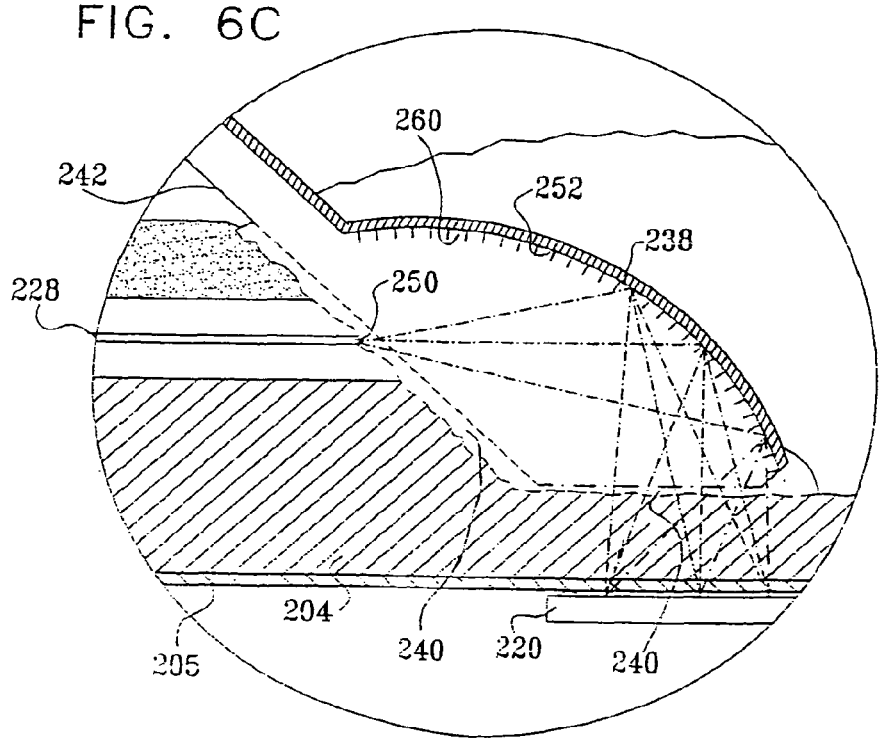

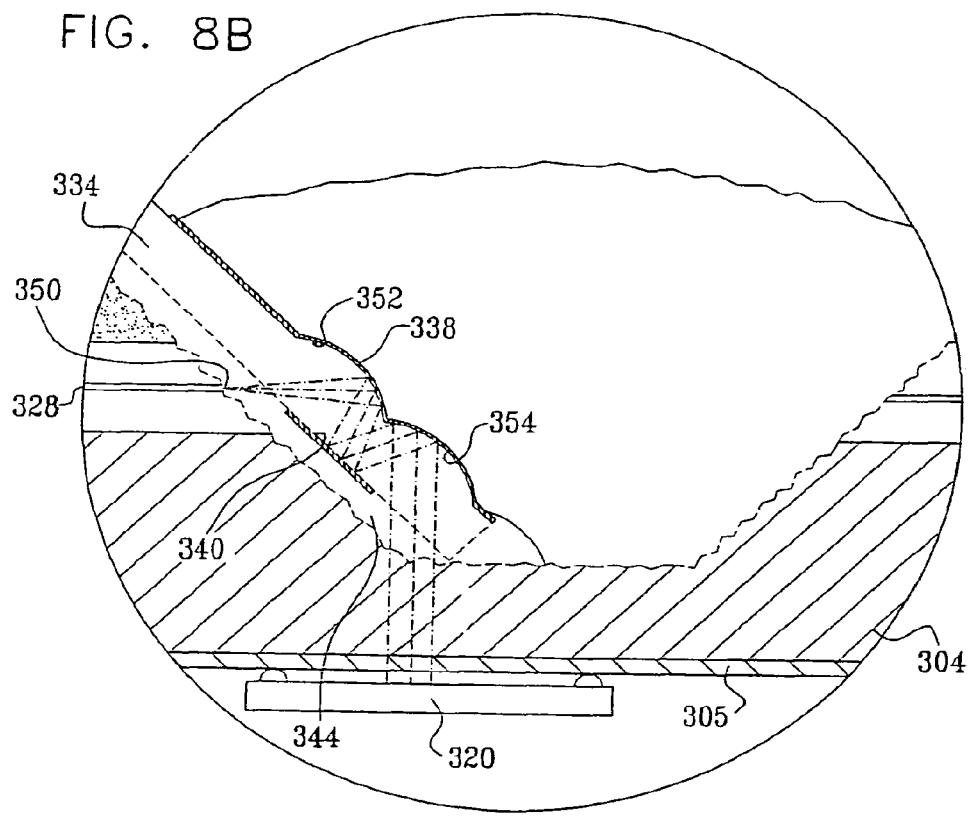
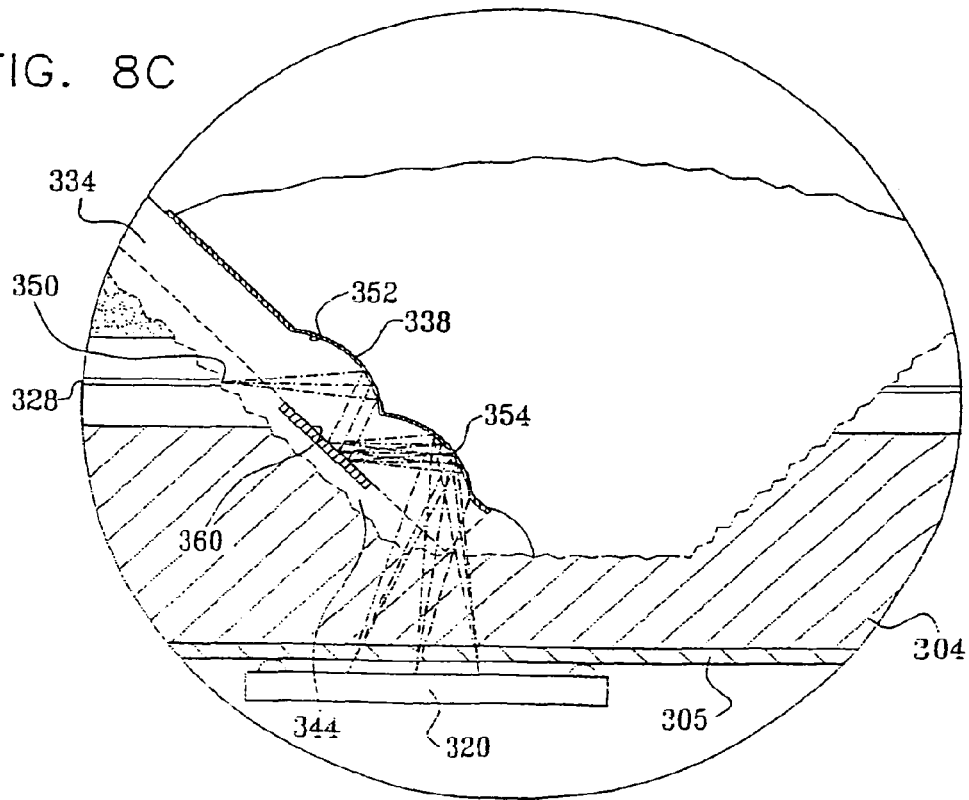

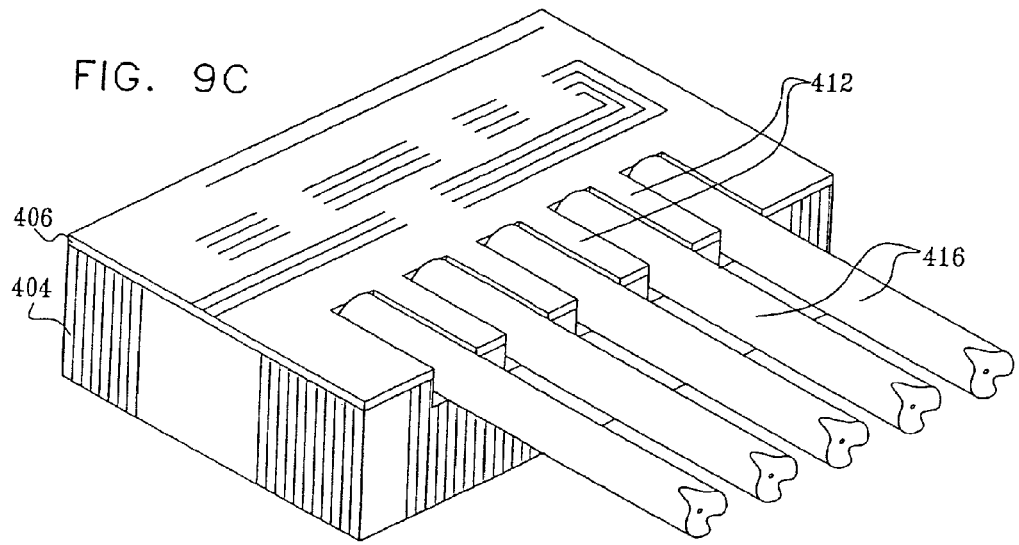
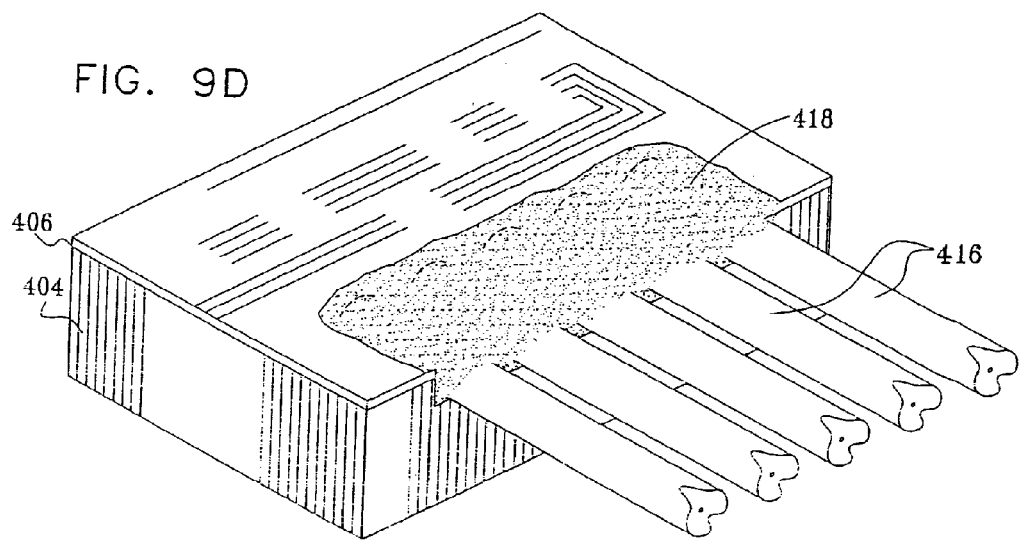

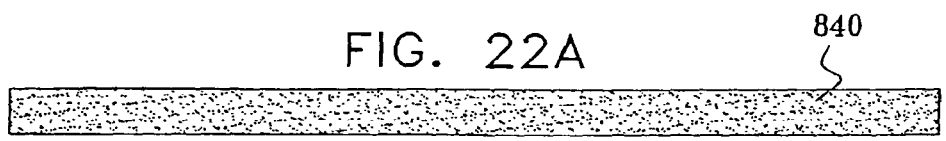
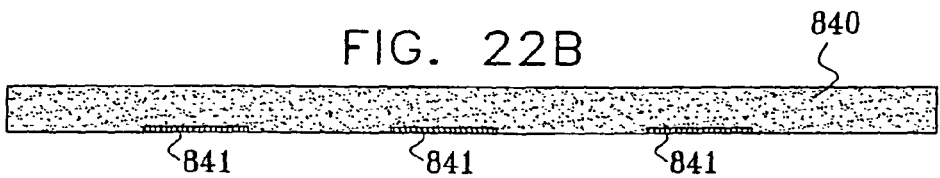
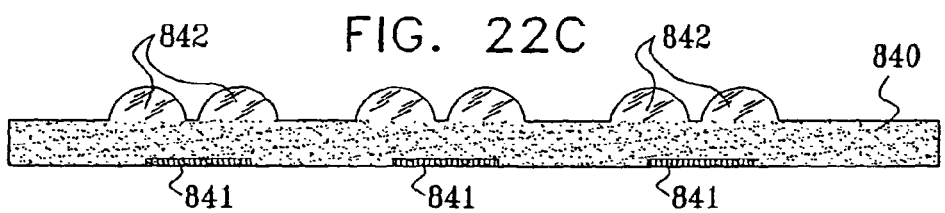
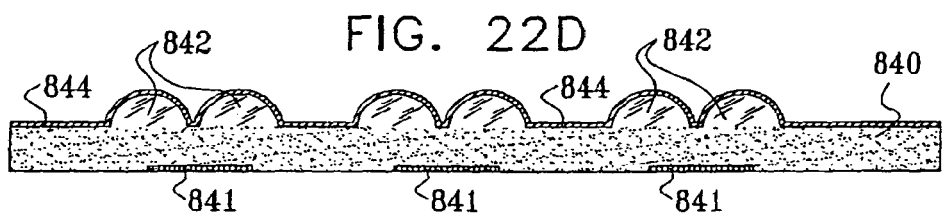
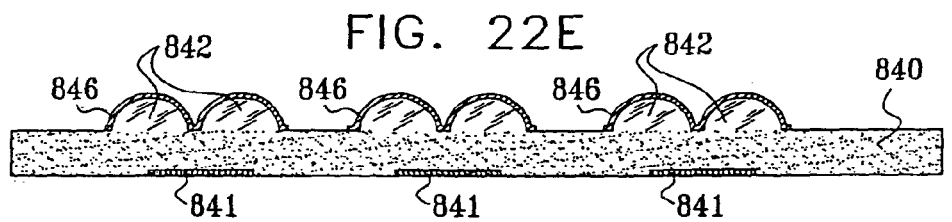
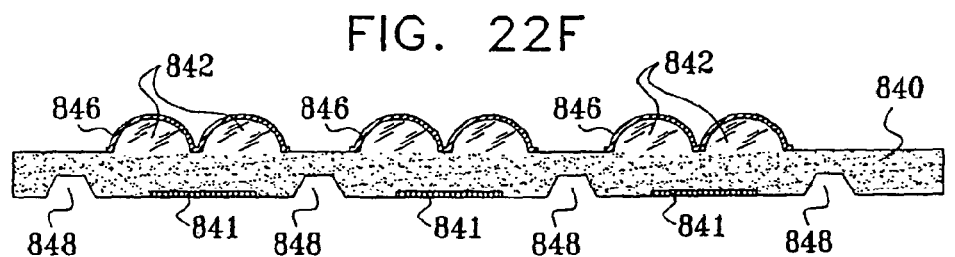
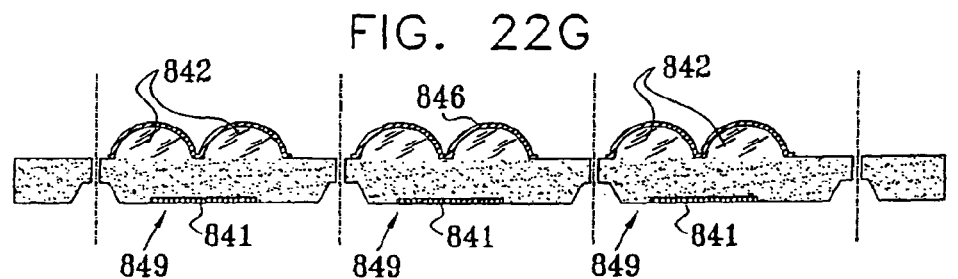

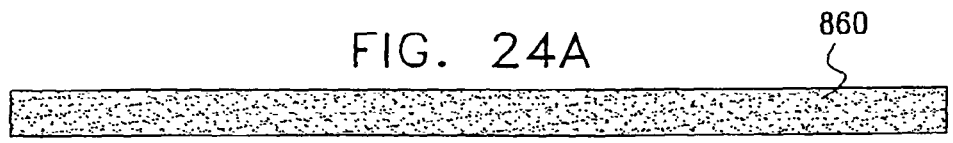
FIG. 24A
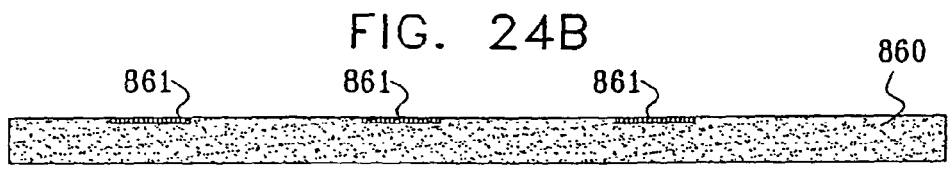
FIG. 24B
FIG. 24C
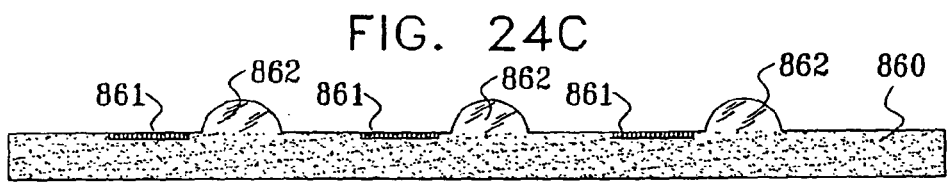
FIG. 24D
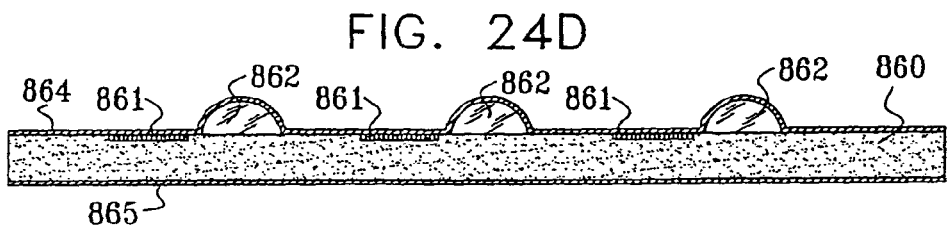
FIG. 24E
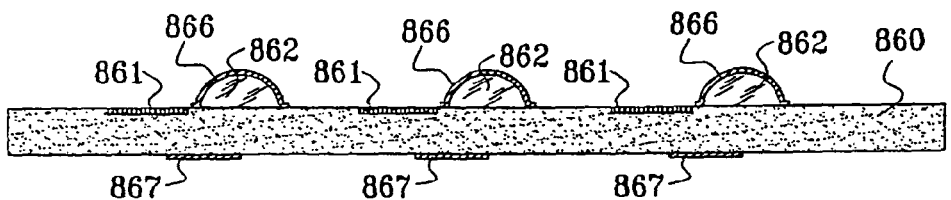
FIG. 24F
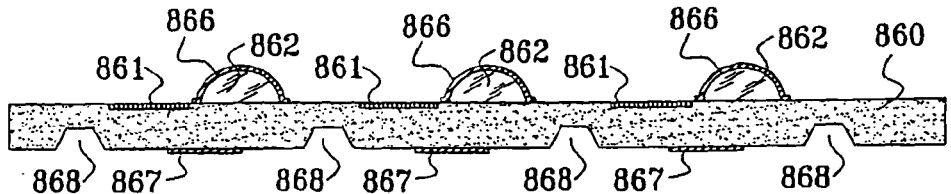
FIG. 24G
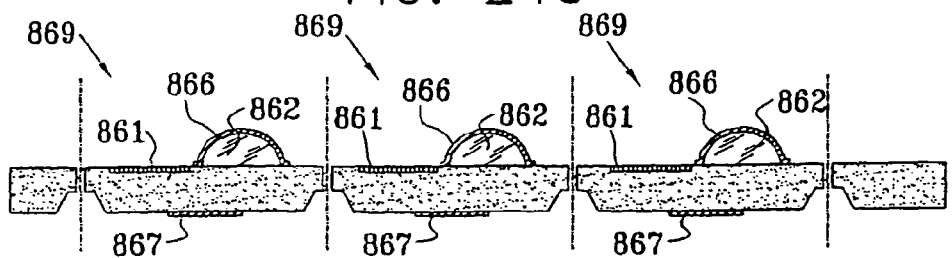

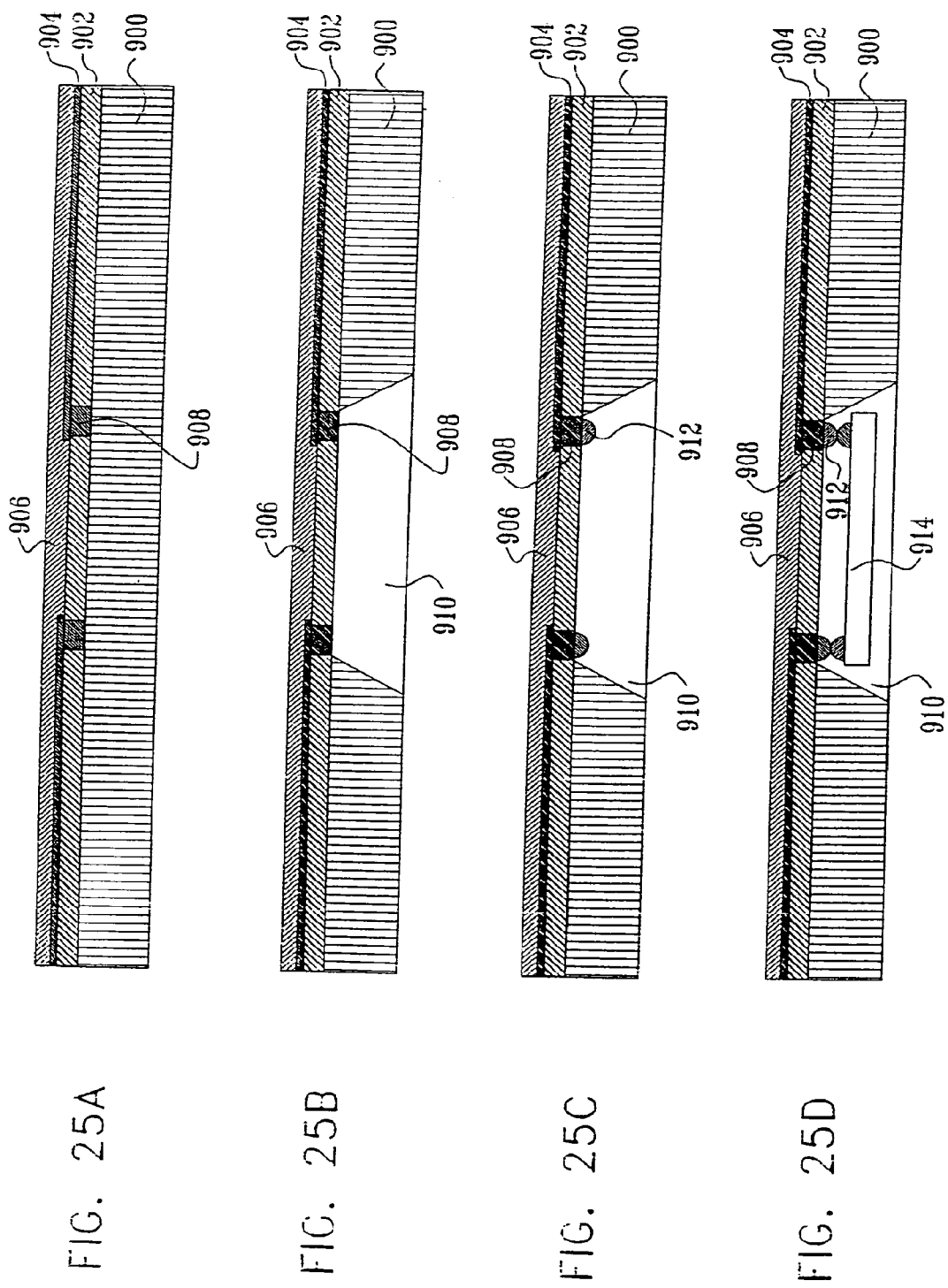

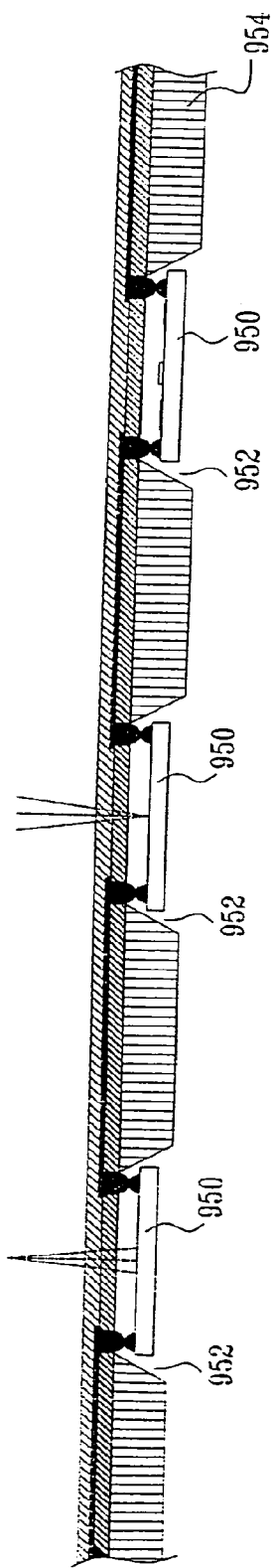
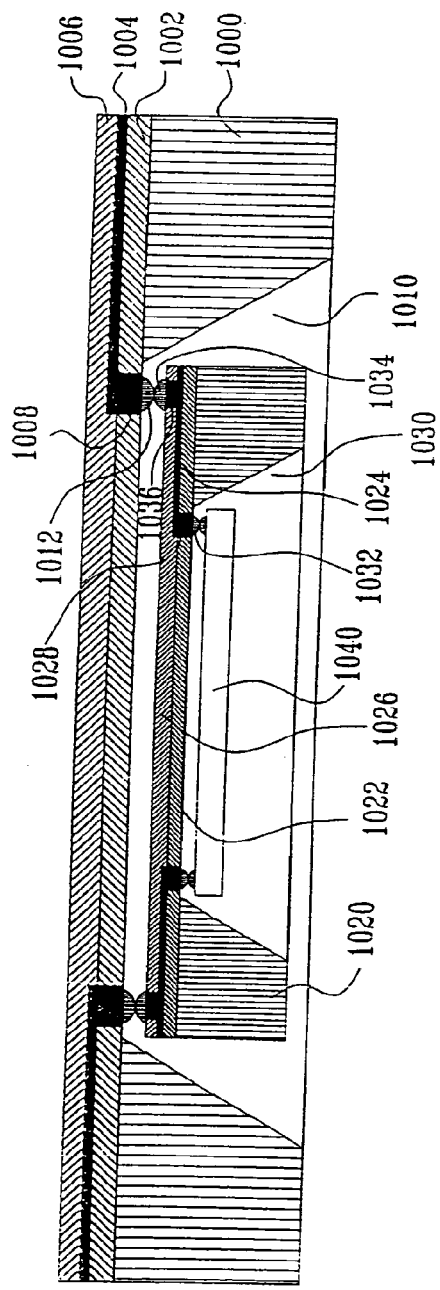

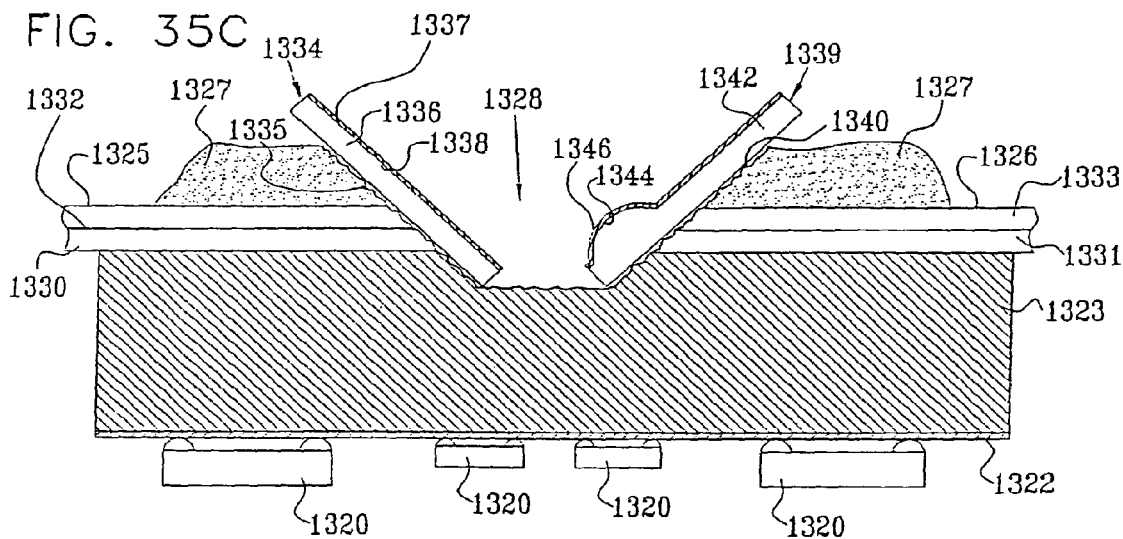
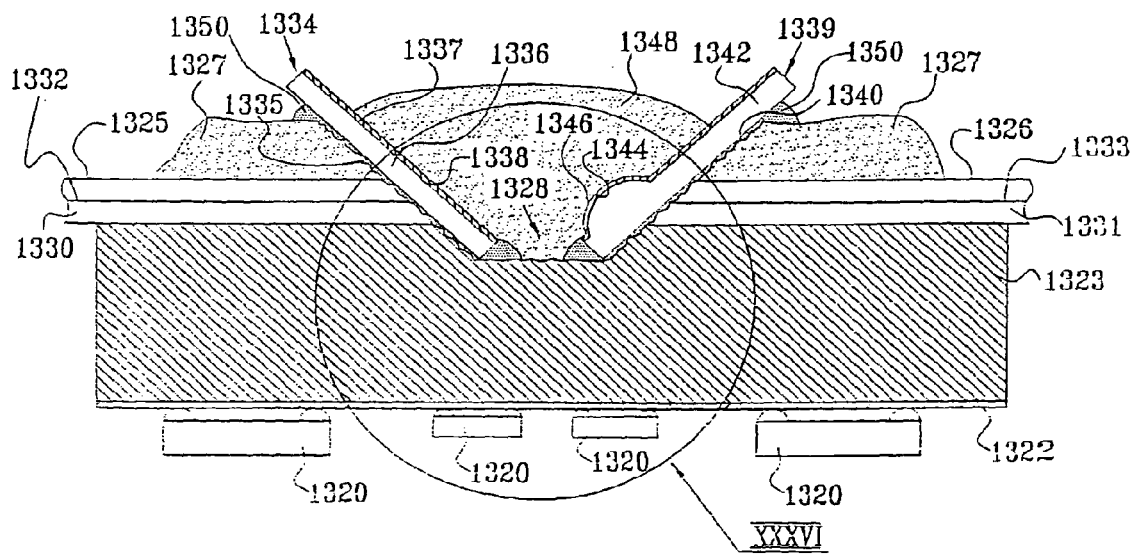

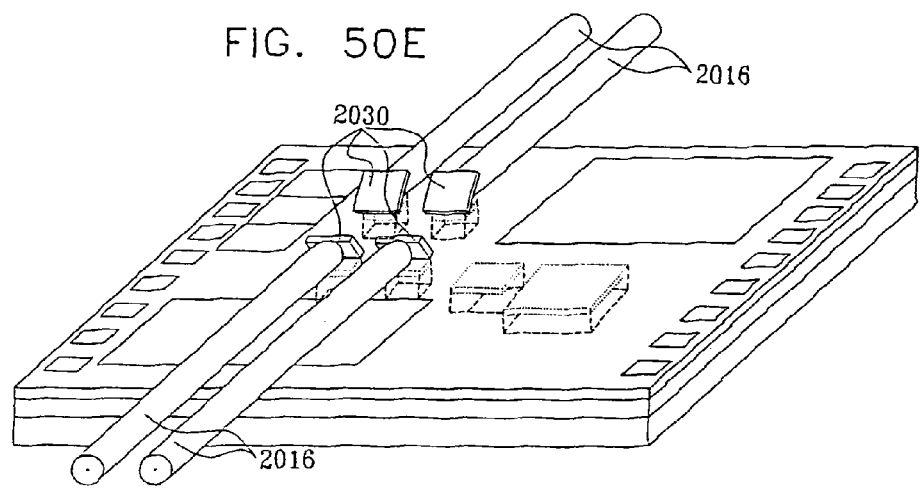
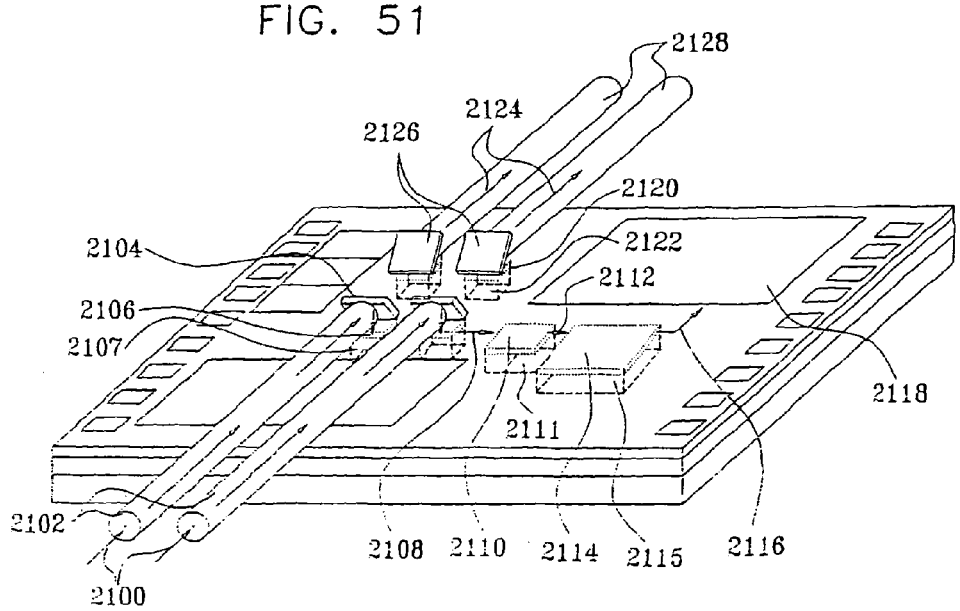

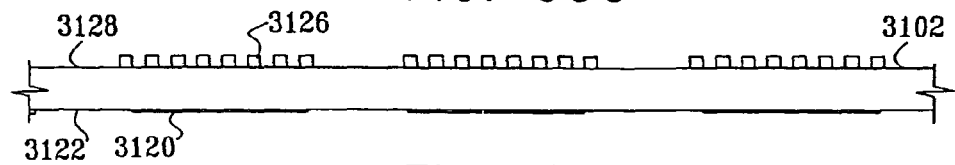
FIG. 53C
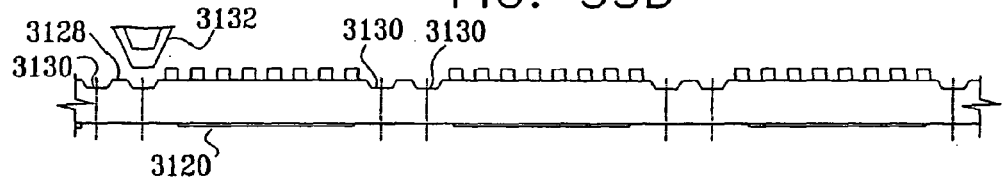
FIG. 53D
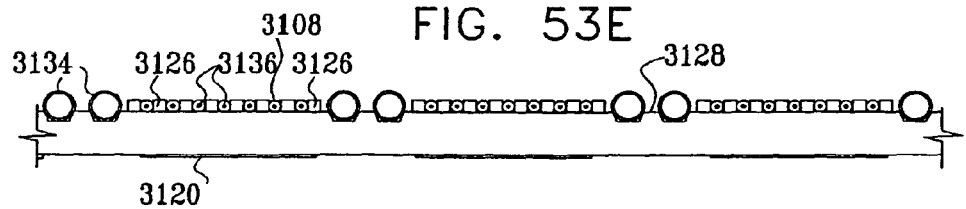
FIG. 53E
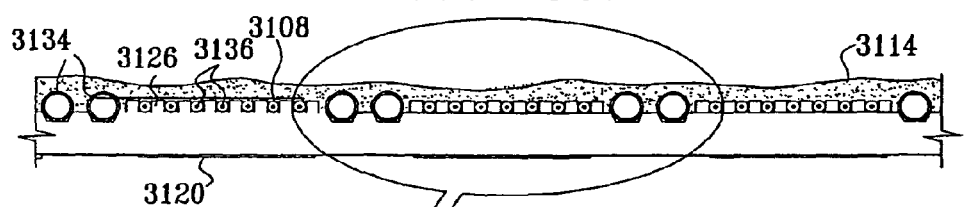
FIG. 53F
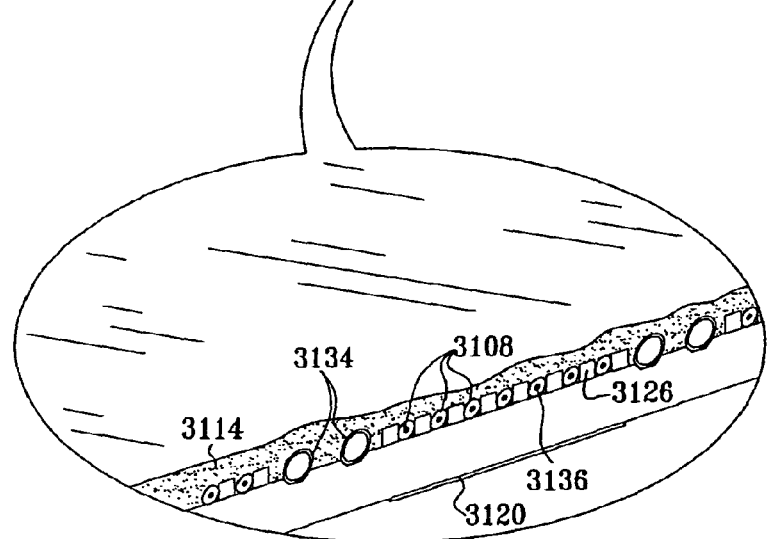

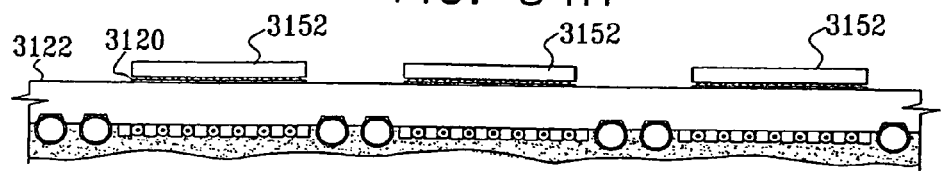
FIG. 54H
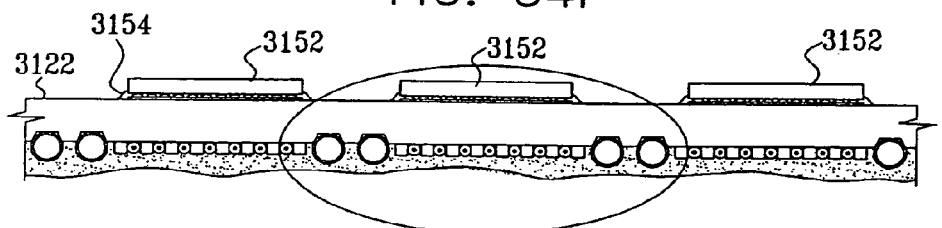
FIG. 54I
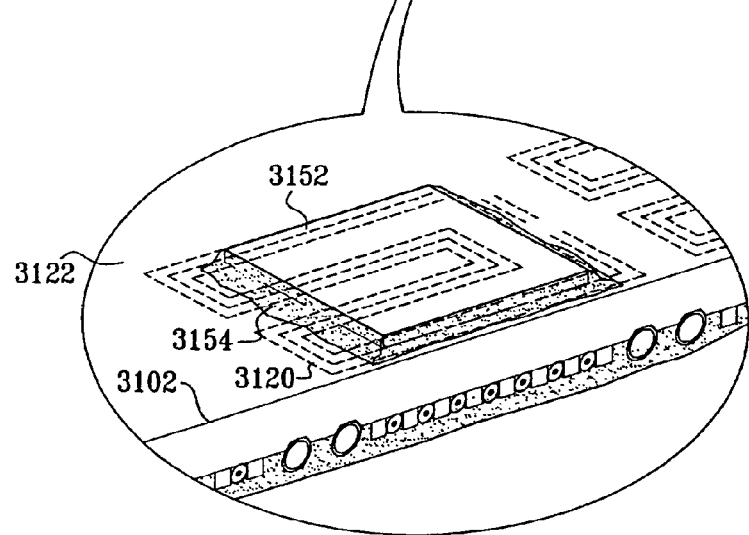
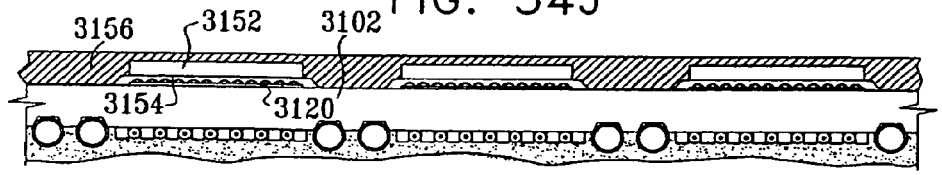
FIG. 54J

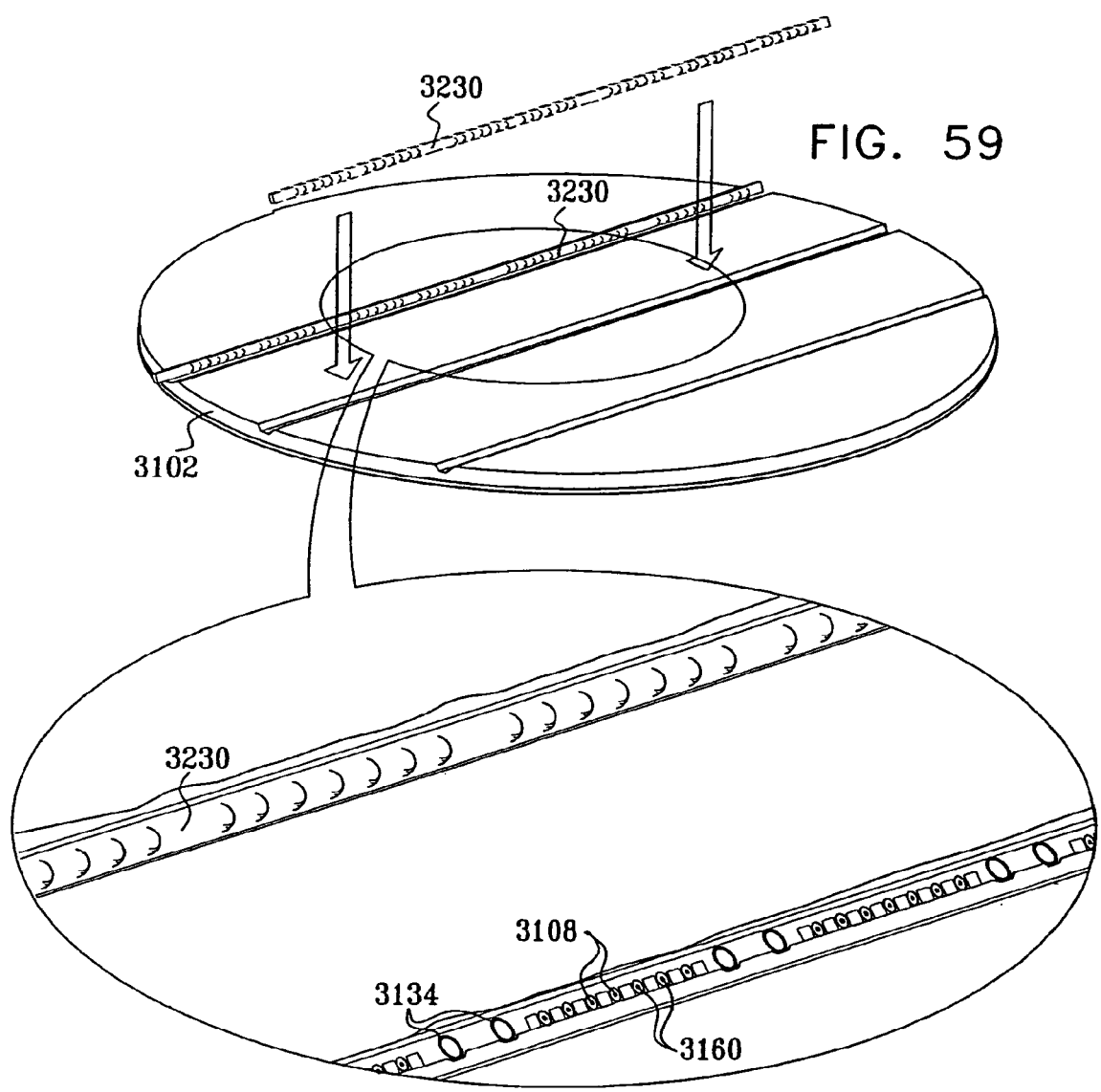

ELECTRO-OPTIC INTEGRATED CIRCUITS AND METHODS FOR THE PRODUCTION THEREOF

REFERENCE TO CO-PENDING APPLICATIONS

This application is a continuation of U.S. patent application Ser. No. 11/365,328, filed Feb. 28, 2006, now abandoned entitled: ELECTRO-OPTIC INTEGRATED CIRCUITS WITH CONNECTORS AND METHODS FOR THE PRODUCTION THEREOF which claims priority to U.S. patent application Ser. No. 10/314,088, filed Dec. 6, 2002, entitled "ELECTRO-OPTIC INTEGRATED CIRCUITS WITH CONNECTORS AND METHODS FOR THE PRODUCTION THEREOF" which claims priority of U.S. Provisional Patent Application Ser. No. 60/373,415, filed on Apr. 16, 2002, entitled "ELECTRO-OPTIC INTEGRATED CIRCUITS AND METHODS FOR THE PRODUCTION THEREOF", the contents of which are incorporated by reference.

FIELD OF THE INVENTION

The present invention relates to electro-optic integrated circuits and methods for the production thereof generally and more particularly to wafer level manufacture of chip level electro-optic integrated circuits.

BACKGROUND OF THE INVENTION

The following U.S. patents of the present inventor represent the current state of the art.

U.S. Pat. Nos. 6,117,707; 6,040,235, 6,022,758; 5,980,663; 5,716,759, 5,547,906 and 5,455,455.

The following, U.S. patents represent the current state of the art relevant to stud bump mounting of electrical circuits:

U.S. Pat. Nos. 6,214,642; 6,103,551; 5,844,320; 5,641,996; 5,550,408 and 5,436,503.

Additionally, the following patents are believed to represent the current state of the art:

U.S. Pat. Nos. 4,168,883; 4,351,051; 4,386,821; 4,399,541; 4,615,031; 4,810,053; 4,988,1599; 4,989,930; 4,989,943; 5,044,720; 5,231,686; 5,841,591; 6,052,498; 6,058,228; 6,234,688; 5,886,971; 5,912,872; 5,933,551; 6,061,169; 6,071,652; 6,096,155; 6,104,690; 6,235,141; 6,295,156; 5,771,218 and 5,872,762.

A transceiver incorporating a connector is known in the art as shown in product descriptions for OptoCube 40 3.35 Gb/s. Channel Speed 850 nm Receiver Array 12 Channel Parallel Optical Receivers and OptoCube 40 3.35 Gb/s Channel Speed 850 nm VCSEL Array 12 Channel Parallel Optical Transmitters from Corona Optical Systems. Inc. 450 Eisenhower Lane North, Lombardi, Ill., 60418, USA.

SUMMARY OF THE INVENTION

The present invention seeks to provide improved electro-optic integrated circuits and methods for production thereof.

There is thus provided, in accordance with a preferred embodiment of the present invention, an electro-optic integrated circuit including an integrated circuit substrate, at least one optical signal providing element and at least one discrete reflecting, optical element, mounted onto the integrated circuit substrate, cooperating with the at least one optical signal providing element and being operative to direct light from the at least one optical signal providing element.

There is also provided, in accordance with another preferred embodiment of the present invention, an electro-optic integrated circuit including an integrated circuit substrate, at least one optical signal receiving element and at least one discrete reflecting optical element mounted onto the integrated circuit substrate and cooperating with the at least one optical signal receiving element and being operative to direct light to the at least one optical signal receiving element.

There is further provided, in accordance with yet another preferred embodiment of the present invention, an electro-optic integrated circuit including an integrated circuit substrate defining a planar surface, at least one optical signal providing element and at least one reflecting optical element having an optical axis which is neither parallel nor perpendicular to the planar surface, the element cooperating, with the at least one optical signal providing element and being operative to direct light from the at least one optical signal providing element.

There is also provided, in accordance with still another preferred embodiment of the present invention, an electro-optic integrated circuit including an integrated circuit substrate defining a planar surface, at least one optical signal receiving element and at least one reflecting optical element: having an optical axis which is neither parallel nor perpendicular to the planar surface, the element cooperating with the at least one optical signal receiving element and being operative to direct light to the at least one optical signal receiving element.

There is further provided, in accordance with another preferred embodiment of the present invention, a method for producing an electro-optic integrated circuit including providing an integrated circuit substrate, mounting at least one optical signal providing element onto the integrated circuit substrate, mounting at least one optical signal receiving element onto the integrated circuit substrate and providing optical alignment, between the at least one optical signal providing element and the at least one optical signal receiving element, subsequent to mounting thereof, by suitable positioning along an optical path extending therebetween, an intermediate optical element and fixing the intermediate optical element to the integrated circuit substrate.

In accordance with a further preferred embodiment of the present invention, the intermediate optical element, when fixed to the substrate, has an optical axis which is neither parallel nor perpendicular to a planar surface of the integrated circuit substrate.

There is also provided, in accordance with yet another preferred embodiment of the present invention, a method for producing an electro-optic integrated circuit including providing an integrated circuit substrate, mounting at least one optical signal providing element on the integrated circuit substrate and mounting at least one discrete reflecting optical element onto the integrated circuit substrate to cooperate with the at least one optical signal providing element and to direct light from the at least one optical signal providing element.

There is further provided, in accordance with still another preferred embodiment of the present invention, a method for producing an electro-optic integrated circuit including providing an integrated circuit substrate, mounting at least one optical signal receiving element on the integrated circuit substrate and mounting at least one discrete reflecting optical element onto the integrated circuit substrate to cooperate with the at least one optical signal receiving element and to direct light to the at least one optical signal receiving element.

There is also provided, in accordance with another preferred embodiment of the present invention, a method for producing an electro-optic integrated circuit including providing an integrated circuit substrate defining a planar surface, mounting at least one optical signal providing element on the integrated circuit substrate and mounting at least one reflecting optical element onto the integrated circuit substrate to cooperate with the at least one optical signal providing element and to direct light from the at least one optical signal providing element, wherein an optical axis of the at least one reflecting optical element is neither parallel nor perpendicular to the planar surface.

There is further provided, in accordance with yet another preferred embodiment of the present invention, a method for producing an electro-optic integrated circuit including providing an integrated circuit substrate defining a planar surface, mounting at least one optical signal receiving element on the integrated circuit substrate and mounting at least one reflecting optical element onto the integrated circuit substrate to cooperate with the at least one optical signal receiving element and to direct light to the at least one optical signal receiving element, wherein an optical axis of the at least one reflecting optical element is neither parallel nor perpendicular to the planar surface.

In accordance with a preferred embodiment of the present invention, the at least one optical element includes a flat reflective surface. Additionally, the at least one optical element includes a concave mirror. Alternatively, the at least one optical element includes a partially flat and partially concave mirror. Additionally, the partially concave mirror includes a mirror with multiple concave reflective surfaces.

In accordance with another preferred embodiment, the at least one optical element includes a reflective grating. Additionally, the at least one optical element includes reflective elements formed on opposite surfaces of an optical substrate. Preferably, at least one of the reflective elements includes a flat reflective surface. Alternatively, at least one of the reflective elements includes a concave mirror. Alternatively or additionally, at least one of the reflective elements includes a partially flat and partially concave mirror. Additionally, the mirror includes a mirror with multiple concave reflective surfaces. Alternatively, at least one of the reflective elements includes a reflective grating.

Preferably, the at least one optical element is operative to focus light received from the optical signal providing element. Alternatively, the at least one optical element is operative to collimate light received from the optical signal providing element. In accordance with another preferred embodiment, the at least one optical element is operative to focus at least one of multiple colors of light received from the optical signal providing element. Additionally or alternatively, the at least one optical element is operative to collimate at least one of multiple colors of light received from the optical signal providing element. In accordance with another preferred embodiment, the at least one optical element is operative to enhance the optical properties of light received from the optical signal providing element.

In accordance with a preferred embodiment, the optical signal providing element includes an optical fiber. Alternatively, the optical signal providing element includes a laser diode. Additionally or alternatively, the optical signal providing element includes a waveguide. In accordance with another preferred embodiment, the optical signal providing element includes an array waveguide grating. Alternatively, the optical signal providing element includes a semiconductor optical amplifier.

Preferably, the optical signal providing element is operative to convert an electrical signal to an optical signal. Alternatively, the optical signal providing element is operative to transmit an optical signal. Additionally, the optical signal providing element also includes an optical signal receiving element. In accordance with another preferred embodiment, the optical signal providing element is operative to generate an optical signal.

In accordance with a preferred embodiment of the present invention, the integrated circuit substrate includes gallium arsenide. Alternatively, the integrated circuit substrate includes indium phosphide.

In accordance with another preferred embodiment of the present invention, the integrated circuit includes at least one optical signal providing element and at least one optical element receiving element, the at least one discrete reflecting optical element cooperating with the at least one optical signal providing element and the at least one optical signal receiving element and being operative to direct light from the at least one signal providing element to the at least one optical signal receiving element.

Preferably, the at least one optical signal receiving element includes an optical fiber. Alternatively, the at least one optical signal receiving element includes a laser diode. Additionally or alternatively, the at least one optical signal receiving element includes a diode detector.

In accordance with a preferred embodiment of the present invention, the at least one optical signal receiving element is operative to convert an optical signal to an electrical signal. Additionally, the at least one optical signal receiving element is operative to transmit an optical signal. Alternatively, the at least one optical signal receiving element also includes an optical signal providing element.

Preferably, the at least one reflecting optical element is operative to focus light received by the optical signal receiving element. Alternatively, the at least one reflecting optical element is operative to collimate light received by the optical signal receiving element. In accordance with another preferred embodiment, the at least one reflecting optical element is operative to focus at least one of multiple colors of light received by the optical signal receiving element. Additionally or alternatively, the at least one reflecting optical element is operative to collimate at least one of multiple colors of light received by the optical signal receiving element. In accordance with another preferred embodiment, the at least one reflecting optical element is operative to enhance the optical properties of light received by the optical signal receiving element.

There is also provided, in accordance with another preferred embodiment of the present invention, an integrated circuit including a first integrated circuit substrate having first and second planar surfaces, the first planar surface having first electrical circuitry formed thereon and the second planar surface having formed therein at least one recess and at least one second integrated circuit substrate having second electrical circuitry formed thereon, the at least one second integrated circuit substrate being located at least partially in the at least one recess, the second electrical circuitry communicating with the first electrical circuitry.

There is further provided, in accordance with yet another preferred embodiment of the present invention, an integrated circuit including a first integrated circuit substrate having first electrical circuitry formed thereon and having formed therein at least one recess and at least one second integrated circuit substrate having second electrical circuitry formed thereon, the at least one second integrated circuit substrate being located at least partially in the at least one recess, the second electrical circuitry communicating with the first electrical circuitry.

There is also provided, in accordance with still another preferred embodiment of the present invention, a method for producing an integrated circuit including providing a first integrated circuit substrate, with first and second planar surfaces, forming first electrical circuitry on the first planar surface, forming at least one recess in the second planar surface, providing at least one second integrated circuit substrate, forming second electrical circuitry on the at least one second integrated circuit substrate and locating the at least one second integrated circuit substrate at least partially in the at least one recess, the second electrical circuitry communicating with the first electrical circuitry.

There is further provided, in accordance with another preferred embodiment of the present invention, a method for producing an integrated circuit including providing a first integrated circuit substrate, forming first electrical circuitry on the first substrate, forming at least one recess in the first substrate, providing at least one second integrated circuit substrate, forming second electrical circuitry on the at least one second integrated circuit substrate and locating the at least one second integrated Circuit substrate at least partially in the at least one recess, the second electrical circuitry communicating with the first electrical circuitry.

Preferably, the first electrical circuitry includes electro-optic components. Additionally, the second electrical circuitry includes electro-optic components. In accordance with a preferred embodiment, the second electrical circuitry communicating with the first electrical circuitry includes communicating via an optical communication path. Additionally, the optical communication path includes optical coupling through free space.

There is also provided, in accordance with still another preferred embodiment of the present invention, an integrated circuit including a first integrated circuit substrate having first and second planar surfaces, the first planar surface having first electrical circuitry formed thereon and the second planar surface having formed therein at least one recess and at least one second substrate, the at least one second substrate being located at least partially in the at least one recess, the second substrate containing at least one element communicating with the first electrical circuitry.

There is further provided, in accordance with another preferred embodiment, an integrated circuit including a first integrated circuit substrate, having electrical circuitry formed thereon and having formed therein at least one recess and at least one second substrate, the at least one second substrate being located at least partially in the at least one recess, the second substrate containing at least one element communicating with the electrical circuitry.

There is also provided, in accordance with yet another preferred embodiment, a method for producing an integrated circuit including providing a first integrated circuit substrate, with first and second planar surfaces, forming first electrical circuitry on the first planar surface, forming at least one recess in the second planar surface, providing at least one second substrate and locating the at least one second substrate at least partially in the at least one recess, the second substrate containing at least one element communicating with the first electrical circuitry.

There is further provided, in accordance with still another preferred embodiment, a method for producing an integrated circuit including providing a first integrated circuit substrate, forming electrical circuitry on the first substrate, forming at least one recess in the first substrate, providing at least one second substrate and locating the at least one second substrate at least partially in the at least one recess, the second substrate containing at least one element communicating with the electrical circuitry.

In accordance with a preferred embodiment, the first electrical circuitry includes electro-optic components. Additionally, the at least one element includes electro-optic components. Preferably, the at least one element communicating with the first electrical circuitry includes communicating via an optical communication path. Additionally, the optical communication path includes optical coupling through free space.

There is yet further provided, in accordance with another preferred embodiment of the present invention, an integrated circuit including a silicon integrated circuit substrate having electrical signal processing circuitry formed thereon and at least one discrete optical element mounted thereon, the electrical signal processing circuitry including an electrical signal input and an electrical signal output and the at least one discrete optical element including an optical-input and an optical output.

There is also provided, in accordance with yet another preferred embodiment of the present invention, a method for producing an integrated circuit including providing a silicon integrated circuit substrate, forming electrical signal processing circuitry on the substrate and mounting at least one discrete optical element on the substrate, the electrical signal processing circuitry including an electrical signal input and an electrical signal output and the at least one discrete optical element including an optical input and an optical output.

Preferably, the optical element is operative to convert the electrical signal output into the optical input. Alternatively, the electrical signal processing circuitry is operative to convert the optical output into the electrical signal input. In accordance still another preferred embodiment, the electrical signal processing circuitry and the discrete optical element are located on a single planar surface of the substrate. Alternatively, the electrical signal processing circuitry and the discrete optical element are located on different planar surfaces of the substrate.

There is also provided in accordance with still another preferred embodiment of the present invention, an optical connector including a plurality of optical elements defining at least one optical input path and at least one optical output path, the at least one optical input path and the at least one optical output path being non-coaxial.

There is further provided in accordance with another preferred embodiment of the present invention, a method for producing an optical connector including providing a plurality of optical elements, defining at least one optical input path through at least one of the plurality of optical elements and defining at least one optical output path through at least one of the plurality of optical elements, the at least one optical input path and the at least one optical output path being non-coaxial.

Preferably, at least one of the plurality of optical elements includes a flat reflective surface. Additionally, at least one of the plurality of optical elements includes a concave mirror Additionally or alternatively, at least one of the plurality of optical elements includes a partially flat and partially concave mirror. Alternatively, at least one of the plurality of optical elements includes a mirror with multiple concave reflective surfaces. Additionally or alternatively, at least one of the plurality of optical elements includes a reflective grating. Additionally, at least one of the plurality of optical elements includes reflective elements formed on opposite surfaces of an optical substrate.

In accordance with a preferred embodiment, at least one of the plurality of optical elements is operative to focus light. Alternatively, at least one of the plurality of optical elements is operative to collimate light. Additionally, at least one of the plurality of optical elements is operative to focus at least one of multiple colors of light. Additionally or alternatively, at least one of the plurality of optical elements is operative to collimate at least one of multiple colors of light. Alternatively, at least one of the plurality of optical elements is operative to enhance the optical properties of light.

Preferably, at least one of the plurality of optical elements includes an optical fiber. Additionally, at least one of the plurality of optical elements includes a laser diode. Alternatively, at least one of the plurality of optical elements includes a diode detector.

There is further provided in accordance with still another preferred embodiment of the present invention an optical reflector including an optical substrate, at least one microlens formed on a surface of the optical substrate and a first reflective surface formed over the at least one microlens.

There is still further provided in accordance with yet another preferred embodiment of the present invention a method for producing an optical reflector including providing an optical substrate, forming at least one microlens on a surface of the optical substrate, coating the at least one microlens with a reflective material and dicing the substrate.

Preferably, the first reflective surface is also formed over at least a portion of the surface of the optical substrate. Alternatively, at least a portion of the first reflective surface includes a grating. Preferably, the first reflective surface includes aluminum.

In accordance with another preferred embodiment, the optical reflector also includes at least one second reflective surface formed on at least a portion of an opposite surface of the substrate. Additionally, at least a portion of the second reflective surface includes a grating. Preferably, the second reflective surface includes aluminum.

In accordance with yet another preferred embodiment, the optical relector also includes a notch formed in the opposite surface of the substrate.

Preferably, the at least one microlens includes photoresist. Alternatively, the fit least one microlens is formed by photolithography and thermal reflow forming. Additionally, the at least one microlens is formed by photolithography using a grey scale mask forming. Alternatively, the at least one microlens is formed by jet printing formation.

In accordance with still another preferred embodiment, the at least one microlens has an index of refraction which is identical to that of the optical substrate. Alternatively, the at least one microlens has an index of refraction which closely approximates that of the optical substrate.

There is also provided in accordance with another preferred embodiment of the present invention a packaged electro-optic circuit having integrally formed therein an optical connector and electrical connections.

There is further provided in accordance with yet another preferred embodiment of the present invention a method for wafer scale production of an electro-optic circuit having integrally formed therein an optical connector and electrical connections including wafer scale formation of a multiplicity of electro-optic circuits onto a substrate, wafer scale provision of at least one optical waveguide on the substrate, wafer scale mounting of at least one integrated circuit component onto the substrate, wafer scale formation of at least one optical pathway providing an optical connection between the at least one integrated circuit component and the at least one optical waveguide, wafer scale formation of at least one mechanical connector guide on the substrate, wafer scale formation of at least one packaging layer over at least one surface of the substrate, and thereafter, dicing the substrate to define a multiplicity of electro-optic circuits, each having integrally formed therein an optical connector.

Preferably, the at least one optical fiber defines a connector interface.

There is still further provided in accordance with still another embodiment of the present invention a method of mounting an integrated circuit onto an electrical circuit including forming an integrated circuit with a multiplicity of electrical connection pads which generally lie along a surface of the integrated circuit, forming an electrical circuit with a multiplicity of electrical connection contacts which generally protrude from a surface of the electrical circuit and employing at least a conductive adhesive to electrically and mechanically join the multiplicity of electrical connection pads to the multiplicity of electrical connection contacts.

Preferably, the method also includes providing an underfill layer.

BRIEF DESCRIPTION OF THE DRAWINGS

The present invention will be appreciated more fully from the following detailed description, taken in conjunction with the drawings in which:

FIGS. 6A, 6B and 6C are enlarged simplified optical illustrations of a portion of FIG. 5D in accordance with preferred embodiments of the present invention;

FIGS. 8A, 8B and 8C are enlarged simplified optical illustrations of a portion of FIG. 7 in accordance with other embodiments of the present invention;

FIGS. 9A, 9B, 9C, 9D and 9E are simplified pictorial illustrations of initial stages in the production of an electro-optic integrated circuit constructed and operative in accordance with yet another preferred embodiment of the present invention;

FIGS. 22A, 22B, 22C, 22D, 22E, 22F and 22G are simplified illustrations of a method for fabricating optical elements employed in the embodiments of FIGS. 1A-8C in accordance with a further embodiment of the present invention;

FIGS. 24A, 24B, 24C, 24D, 24E, 24F and 24G are simplified illustrations of a method for fabricating optical elements employed in the embodiments of FIGS. 1A-17C in accordance with a still further embodiment of the present invention;

FIGS. 25A, 25B, 25C and 25D are simplified illustrations of multiple stages in the production of a multi-chip module in accordance with a preferred embodiment of the present invention;

FIG. 29 is a simplified illustration of a multi-chip module of the type referenced in FIGS. 25A-25D, including multiple elements located in multiple recesses formed within a substrate;

FIG. 30 is a simplified illustration of a multi-chip module of the type referenced in FIGS. 25A-25D, including multiple stacked elements located in recesses formed within substrates;

FIGS. 35A, 35B, 35C and 35D are simplified sectional illustrations of stages in the production of an electro-optic integrated assembly in accordance with a preferred embodiment of the present invention;

FIGS. 50A, 50B, 50C, 50D and 50E are simplified pictorial illustrations of stages in the production of an electro-optic integrated circuit constructed and operative in accordance with still another preferred embodiment of the present invention;

FIG. 51 is a simplified functional illustration of a preferred embodiment of the structure of FIG. 50E;

FIGS. 53A-53F are simplified pictorial and sectional illustrations of a first plurality of stages in the manufacture of the packaged electro-optic circuit of FIGS. 52A and 52B;

FIGS. 54A-54J are simplified pictorial and sectional illustrations of a second plurality of stages in the manufacture of the packaged electro-optic circuit of FIGS. 52A and 52B;

FIG. 59 is a simplified pictorial illustration corresponding to sectional illustration 55D;

DETAILED DESCRIPTION OF PREFERRED EMBODIMENTS

Figure 1A:
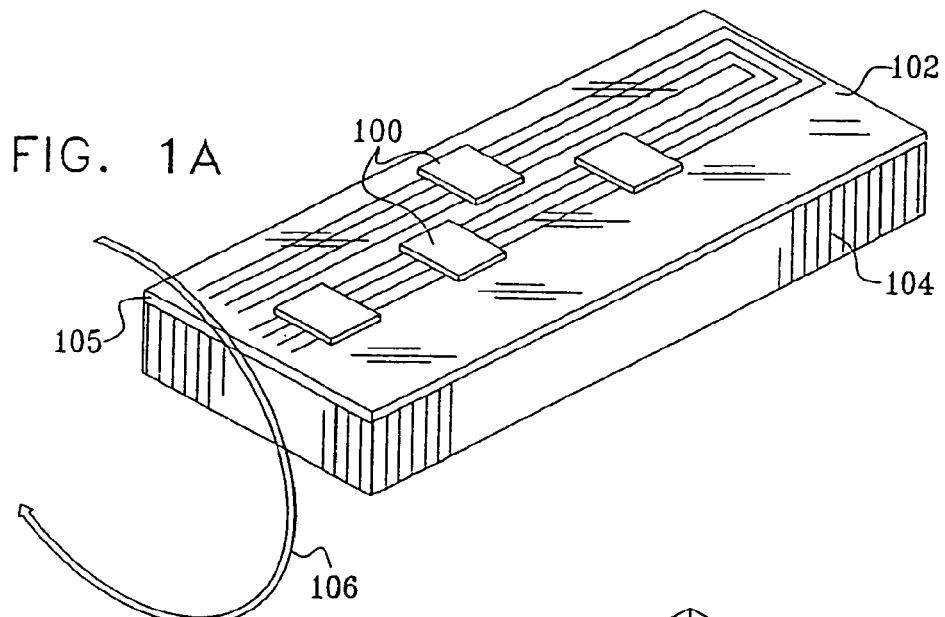
FIGS. 1A, 1B, 1C, 1D and 1E are simplified pictorial illustrations of initial stages in the production of an electro-optic integrated circuit constructed and operative in accordance with a preferred embodiment of the present invention.
Figure 1B:
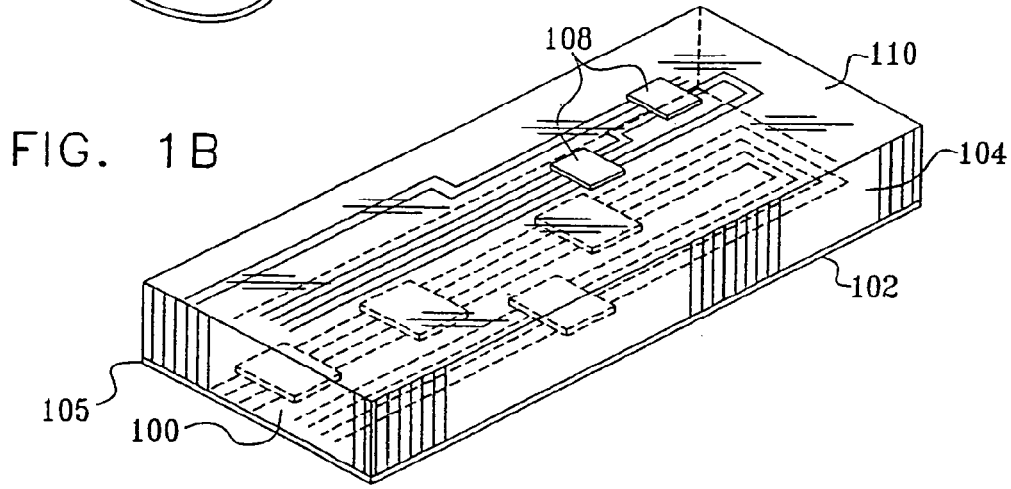

Reference is now made to FIGS. 1A, 1B, 1C, 1D and 1E, which are simplified pictorial illustrations of initial stages in the production of an electro-optic integrated circuit constructed and operative in accordance with a preferred embodiment of the present invention. As seen in FIG. 1A, one or more electrical circuits 100 are preferably formed onto a first surface 102 of a substrate 104, preferably a silicon substrate or a substrate that is generally transparent to light within at least part of the wavelength range of 600-1650 nm, typically of thickness between 200-800 microns. The electrical circuits 100 are preferably formed by conventional photolithographic techniques employed in the production of integrated circuits, and included within a planarized layer 105 formed onto substrate 104. The substrate preferably is then turned over, as indicated by an arrow 106, and one or more electrical circuits 108 are formed on an opposite surface 110 of substrate 104, as shown in FIG. 1B.

Figure 1C:
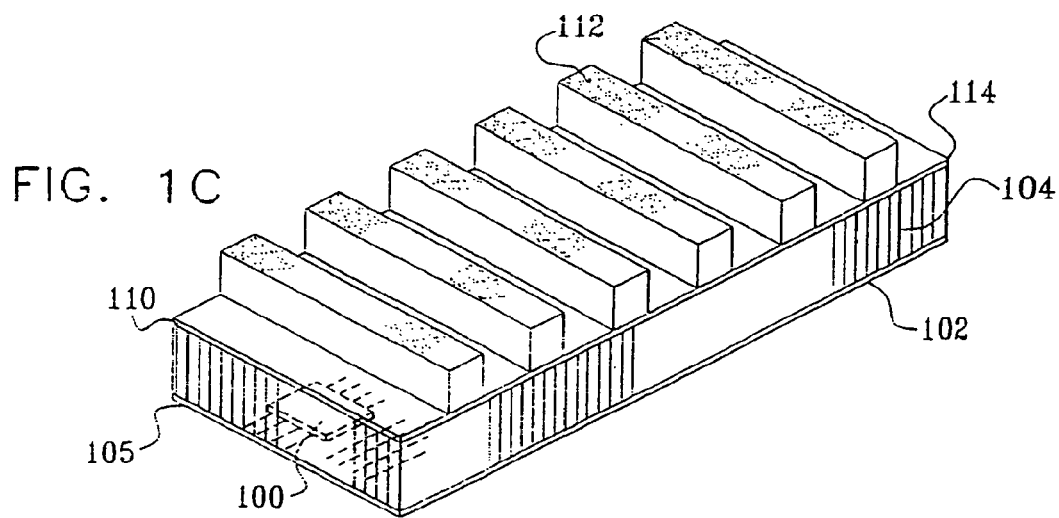
Figure 1D:
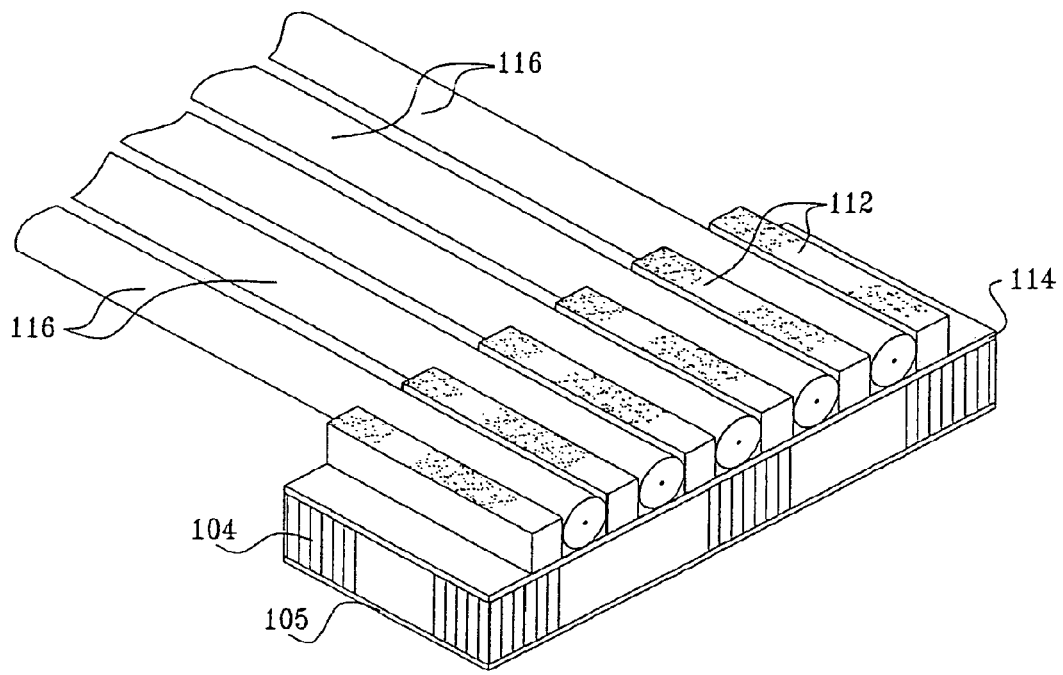

Referring now to FIG. 1C, preferably, following formation of electrical circuits 100 and 108 on respective surfaces 102 and 110 of substrate 104, an array of parallel, spaced, elongate optical fiber positioning elements 112 is preferably formed, such as by conventional photolithographic techniques, over a planarized layer 114 including electrical circuits 108 (FIG. 1B). As seen in FIG. 1D, an array of optical fibers 116 is disposed over layer 114, each fiber being positioned between adjacent positioning elements 112. The fibers are fixed in place relative to positioning elements 112 and to layer 114 of substrate 104 by means of a suitable adhesive 118, preferably epoxy, as seen in FIG. 1E.

Figure 1E:
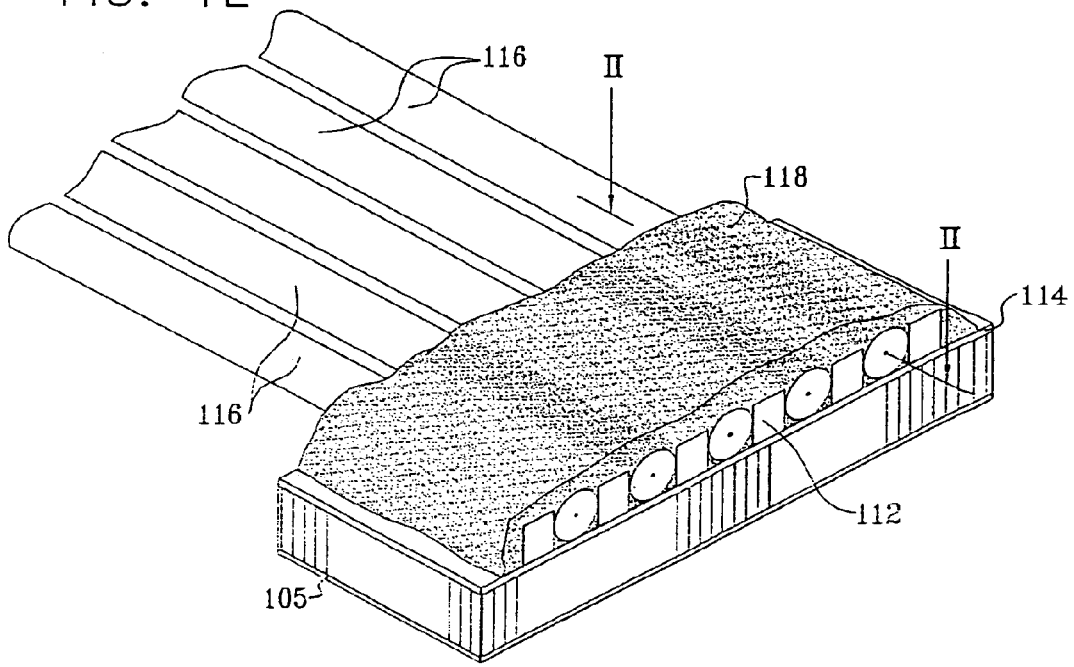
Figure 2A:
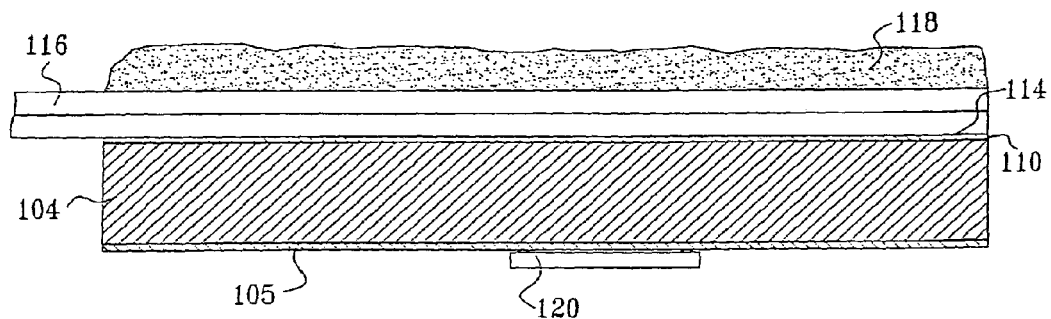
FIGS. 2A, 2B, 2C, and 2D are simplified sectional illustrations of further stages in the production of the electro-optic integrated circuit referenced in FIGS. 1A-1E.

Reference is now made to FIGS. 2A, 2B, 2C, and 2D, which are simplified sectional illustrations, taken along the lines II-II in FIG. 1E, of further stages in the production of an electro-optic integrated circuit. As seen in FIG. 2A, electro-optic components 120, such as diode lasers, are mounted onto electrical circuit 100 (not shown), included within planarized layer 105. It is appreciated that electro-optic components 120 may be any suitable electro-optic component, such as a laser diode, diode detector, waveguide, array waveguide grating or a semiconductor optical amplifier.

Figure 2B:
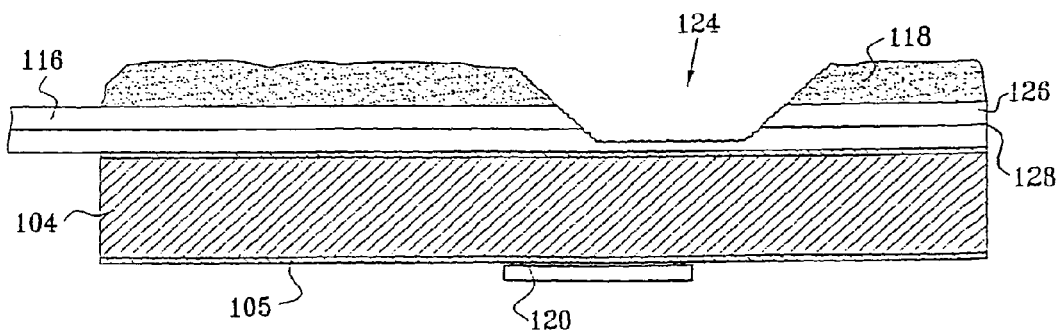

As shown in FIG. 2B, a transverse notch 124 is preferably formed, at least partially overlapping the locations of the electro-optic components 120 and extending through the adhesive 118 and partially through each optical fiber 116. Specifically, in this embodiment, the notch 124 extends through part of the cladding 126 of each fiber 116 and entirely through the core 128 of each fiber. It is appreciated that the surfaces defined by the notch 124 are relatively rough, as shown.

Figure 2C:
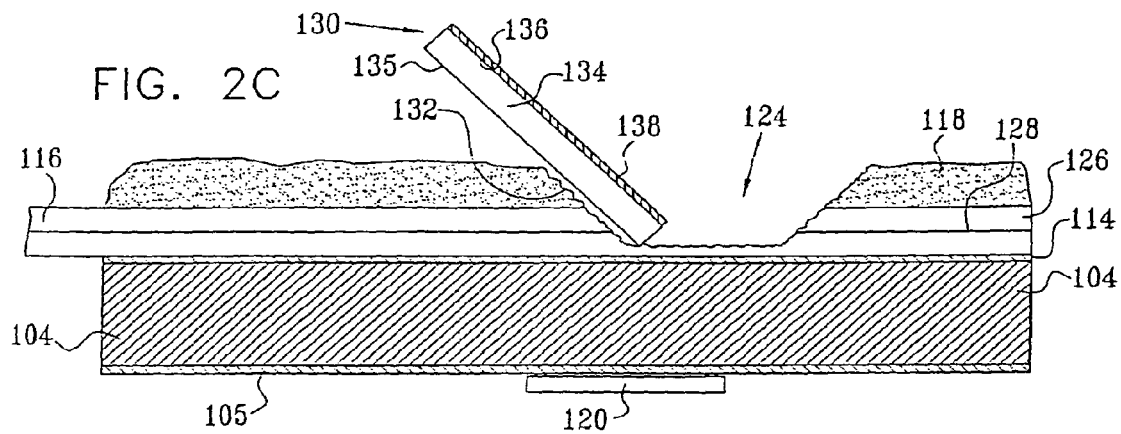
Figure 2D:
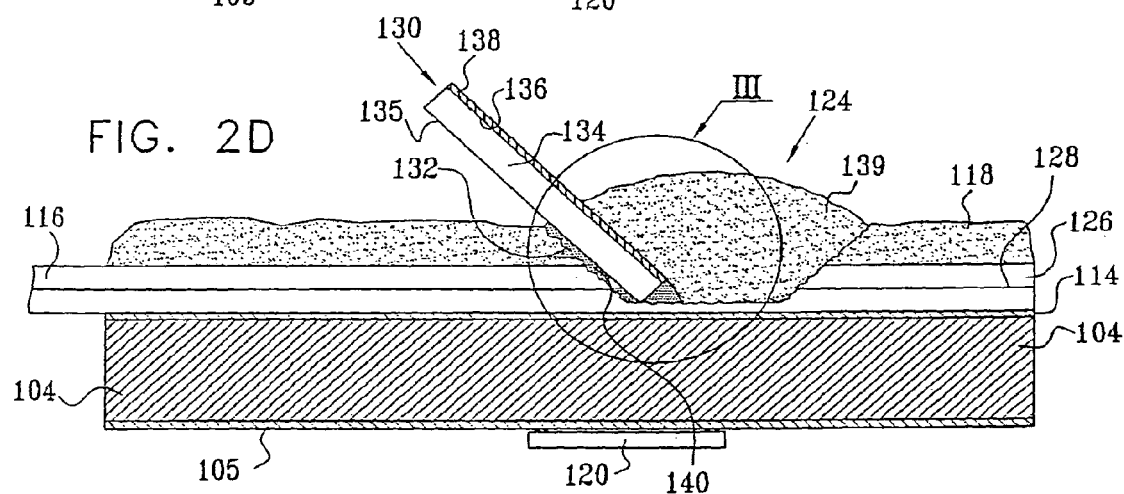

Turning now to FIG. 2C, it is seen that a mirror 130 is preferably mounted parallel to one of the rough inclined surfaces 132 defined by notch 124. Mirror 130 preferably comprises a glass substrate 134, with a surface 135 facing surface 132 defined by notch 124, having formed on an opposite surface 136 thereof, a metallic layer or a dichroic filter layer 138. As seen in FIG. 2D, preferably, the mirror 130 is securely held in place partially by any suitable adhesive 139, such as epoxy, and partially by an optical adhesive 140, such as OG 146, manufactured by Epoxy Technology, 14 Fortune Drive, Billerica, Mass. 01821, USA, whose refractive index, preferably, is precisely matched to that of the cores 128 of the optical fibers 116. It is appreciated that optical adhesive 140 may be employed throughout instead of adhesive 139. The adhesive 140 preferably fills the interstices between the roughened surface 132 defined by notch 124 and surface 135 of mirror 130.

Figure 3:
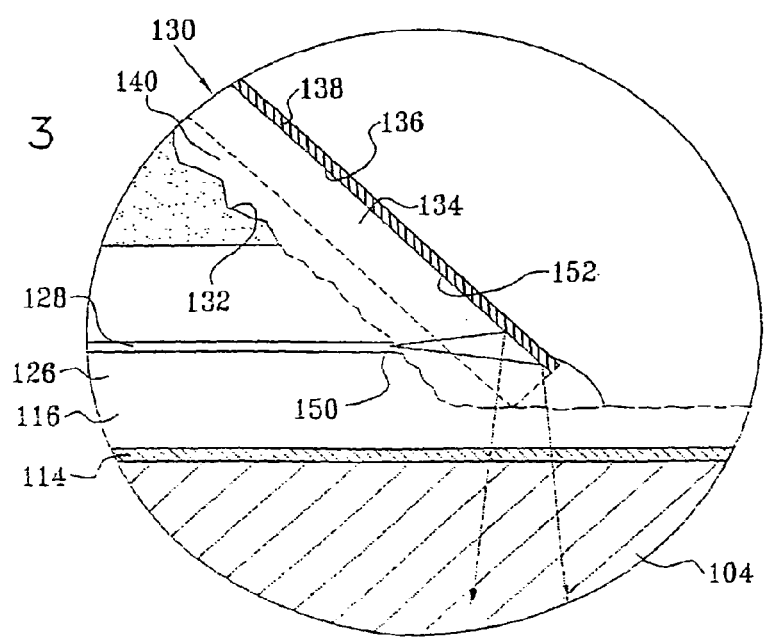
FIG. 3 is an enlarged simplified optical illustration of a portion of FIG. 2D.

Reference is now made to FIG. 3, which is an enlarged simplified optical illustration of a portion of FIG. 2D. Here it is seen that a generally uninterrupted optical path is defined for light, preferably in the wavelength range of 600-1650 nm, from an end 150 of a core 128, through adhesive 140 and substrate 134 to a reflective surface 152 of layer 138 of mirror 130 and thence through substrate 134, adhesive 140 and cladding 126, through layer 114 and substrate 104, which are substantially transparent to this light. It is noted that the index of refraction of adhesive 140 is close to but not identical to that of cladding 126 and substrate 134. It is noted that mirror 130 typically reflects light onto electro-optic component 120 (FIG. 2D), without focusing or collimating the light.

Figure 4A:
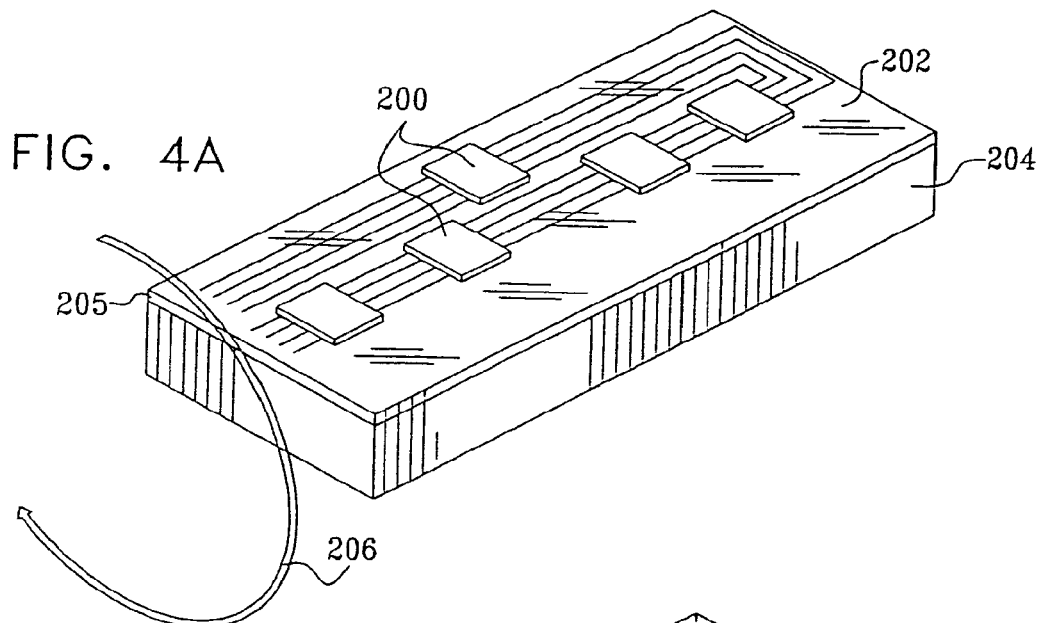
FIGS. 4A, 4B, 4C, 4D and 4E are simplified pictorial illustrations of initial stages in the production of an electro-optic integrated circuit constructed and operative in accordance with another preferred embodiment of the present invention.
Figure 4B:
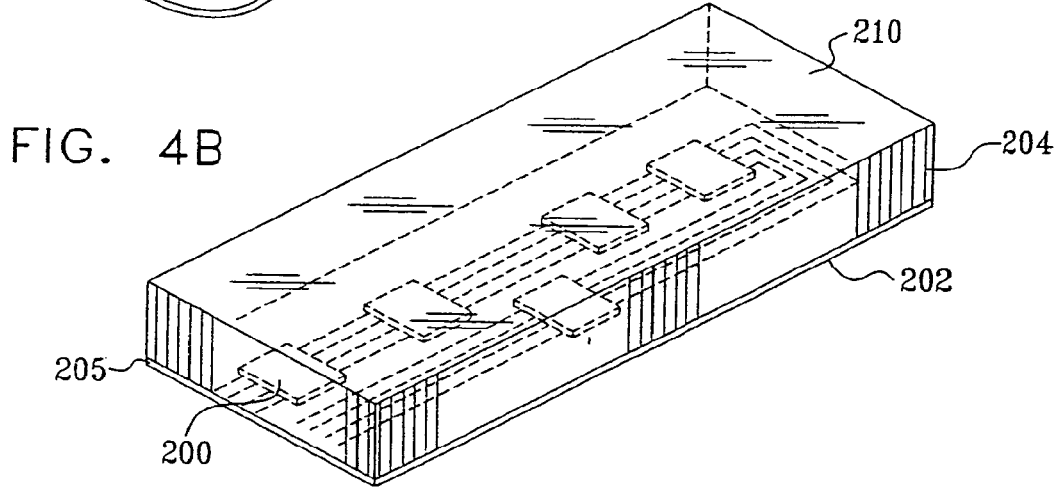

Reference is now made to FIGS. 4A, 4B, 4C, 4D and 4E, which are simplified pictorial illustrations of initial stages in the production of an electro-optic integrated circuit constructed and operative in accordance with a preferred embodiment of the present invention. As seen in FIG. 4A, one or more electrical circuits 200 are preferably formed onto a first surface 202 of a substrate 204, preferably a substrate that is generally transparent to light within at least part of the wavelength range of 400-1650 nm, typically of thickness between 200-1000 microns. The electrical circuits 200 are preferably formed by conventional photolithographic techniques employed in the production of integrated circuits, and included within a planarized layer 205 formed onto substrate 404. The substrate preferably is then turned over, as indicated by an arrow 206, and as shown in FIG. 4B.

Figure 4C:
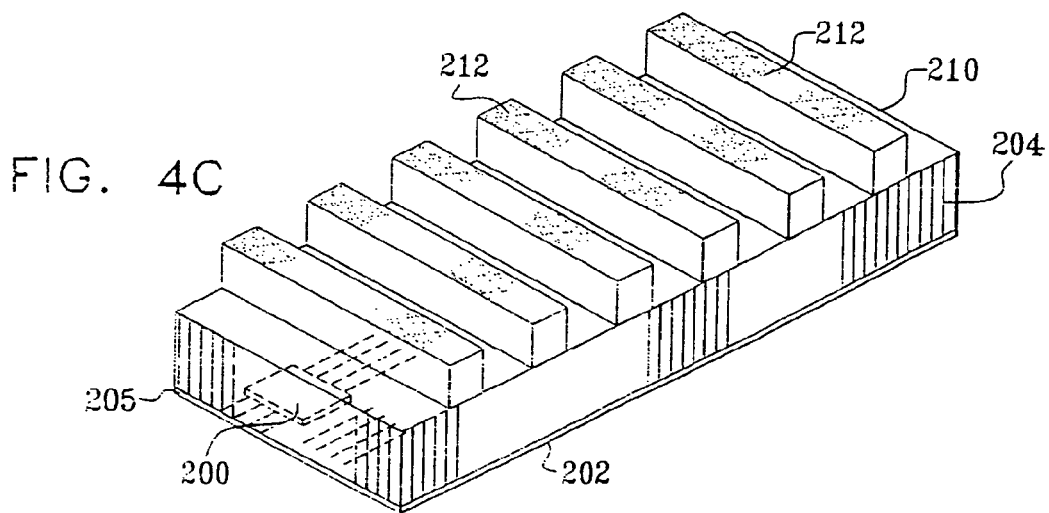
Figure 4D:
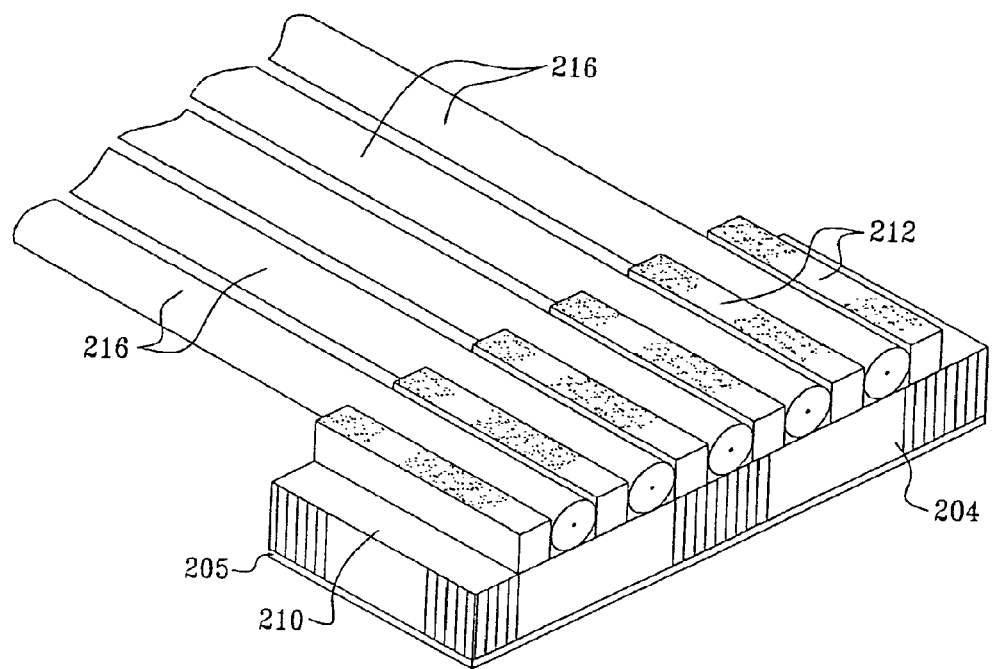

Referring now to FIG. 4C, preferably, following formation of electrical circuits 200 on surface 202 of substrate 204, an array of parallel, spaced, elongate optical fiber positioning elements 212 is preferably formed, such as by conventional photolithographic techniques, over an opposite surface 210 of substrate 204. As seen in FIG. 4D, an array of optical fibers 216 is disposed over surface 210 of substrate 204, each fiber being positioned between adjacent positioning elements 212. The fibers 216 are fixed in place relative to positioning elements 212 and to surface 210 of substrate 204 by means of a suitable adhesive 218, preferably epoxy, as seen in FIG. 4E.

Figure 4E:
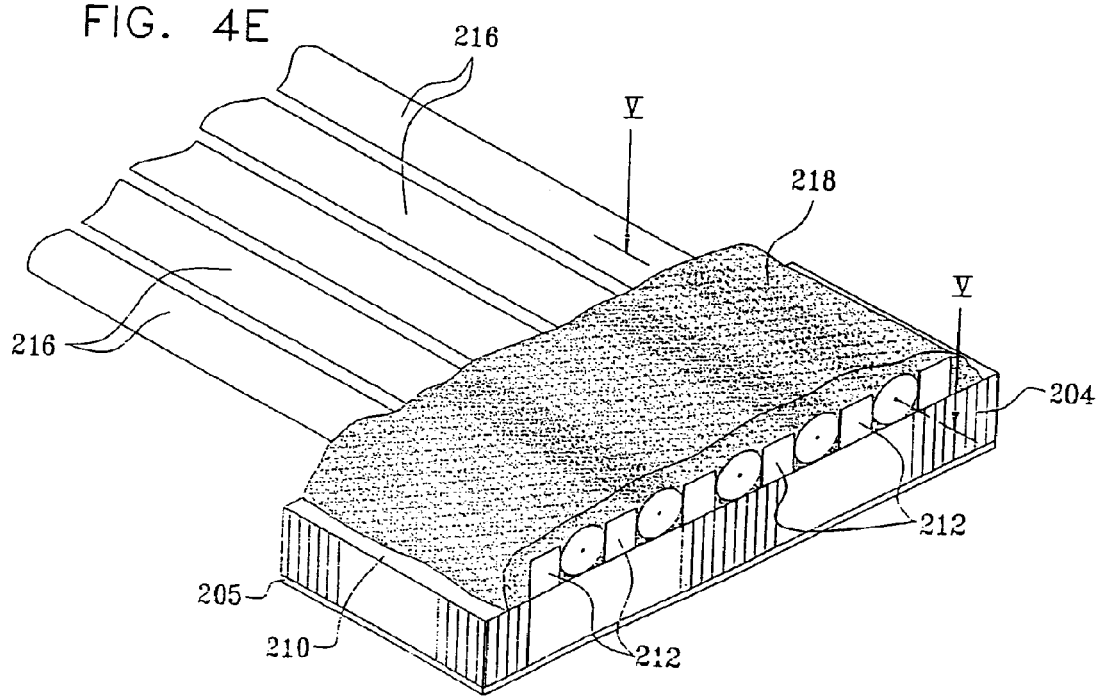
Figure 5A:
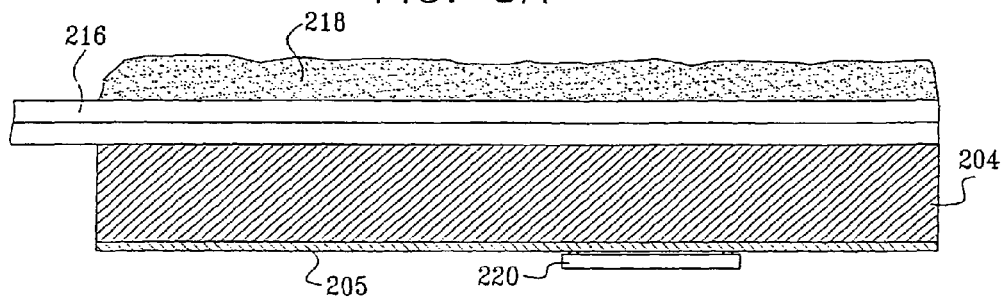
FIGS. 5A, 5B, 5C and 5D are simplified sectional illustrations of further stages in the production of the electro-optic integrated circuit referenced in FIGS. 4A-4E.

Reference is now made to FIGS. 5A, 5B, 5C, and 5D, which are simplified sectional illustrations, taken along the lines V-V in FIG. 4E, of further stages in the production of an electro-optic integrated circuit. As seen in FIG. 5A, electro-optic components 220, such as diode lasers, are mounted onto electrical circuit 200 (not shown) included within planarized layer 205. It is appreciated that electro-optic components 220 may be any suitable electro-optic component, such as a laser diode, diode detector, waveguide, array waveguide grating or a semiconductor optical amplifier.

Figure 5B:
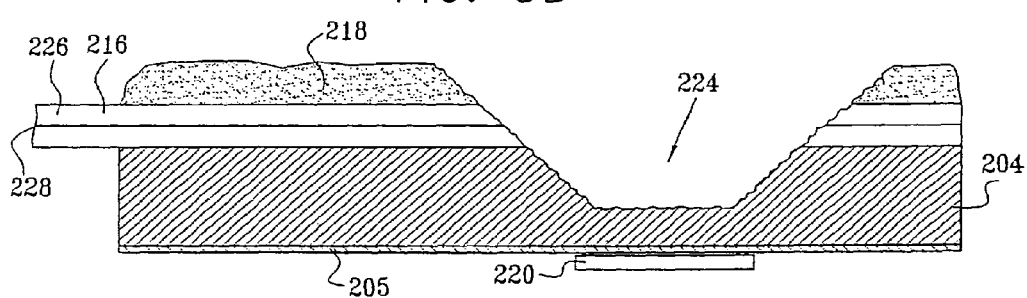

As shown in FIG. 5B, a transverse notch 224 is preferably formed, at least partially overlapping the locations of the electro-optic components 220 and extending through the adhesive 218, entirely through each optical fiber 216 and partially into substrate 204. Specifically, in this embodiment, the notch 224 extends through all of cladding 226 of each fiber 216 and entirely through the core 228 of each fiber. It is appreciated that the surfaces defined by the notch 224 are relatively rough, as shown.

Figure 5C:
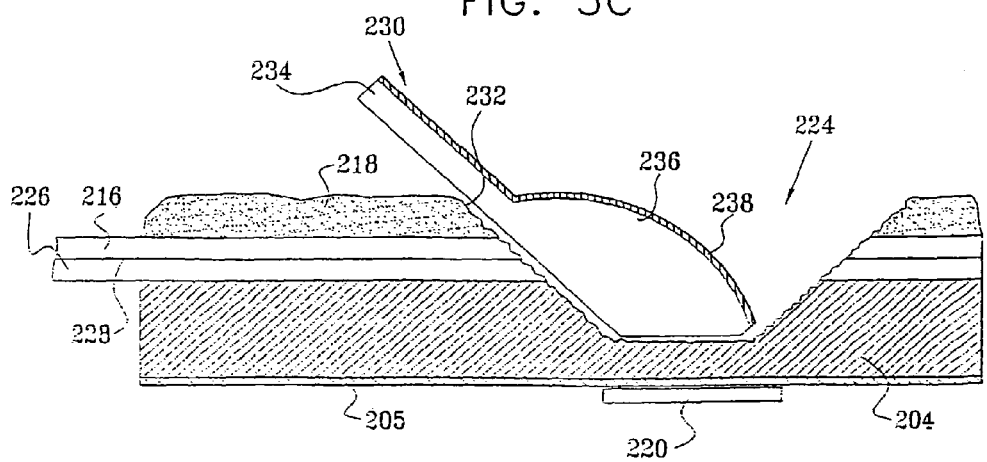
Figure 5D:
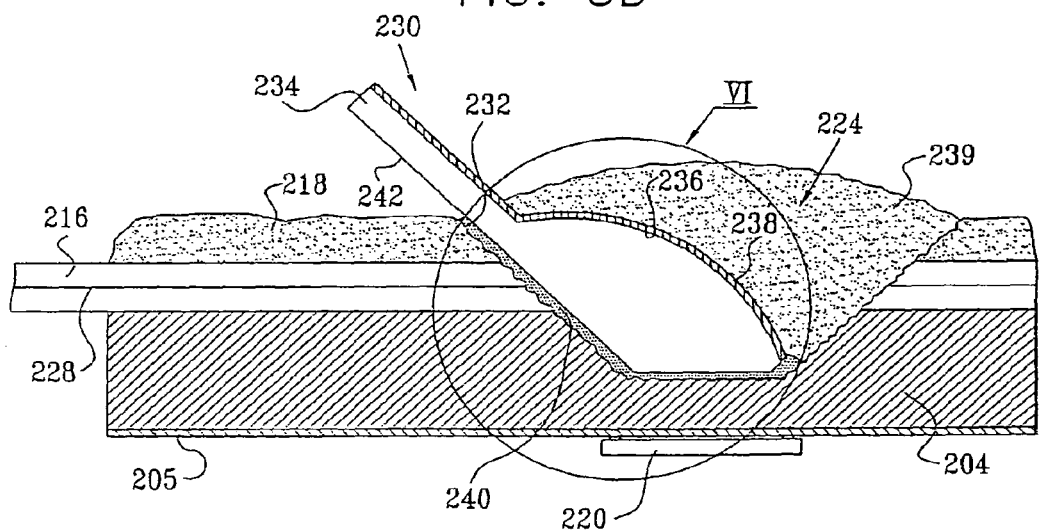

Turning now to FIG. 5C, it is seen that a partially flat and partially concave mirror 230 is preferably mounted parallel to one of the rough inclined surfaces 232 defined by notch 224. Mirror 230 preferably comprises a glass substrate 234 having formed thereon a curved portion 236 over which is formed a curved metallic layer or a dichroic filter layer 238. As seen in FIG. 5D, preferably, the mirror 230 is securely held in place partially by any suitable adhesive 239, such as epoxy, and partially by an optical adhesive 240, such as OG 146, manufactured by Epoxy Technology, 14 Fortune Drive, Billerica, Mass. 01821, USA, whose refractive index preferably is precisely matched to that of the cores 228 of the optical fibers 216. It is appreciated that optical adhesive 240 may be employed throughout instead of adhesive 239. Optical adhesive 240 preferably fills the interstices between the roughened surface 232 defined by notch 224 and a surface 242 of mirror 230.

Figure 6A:
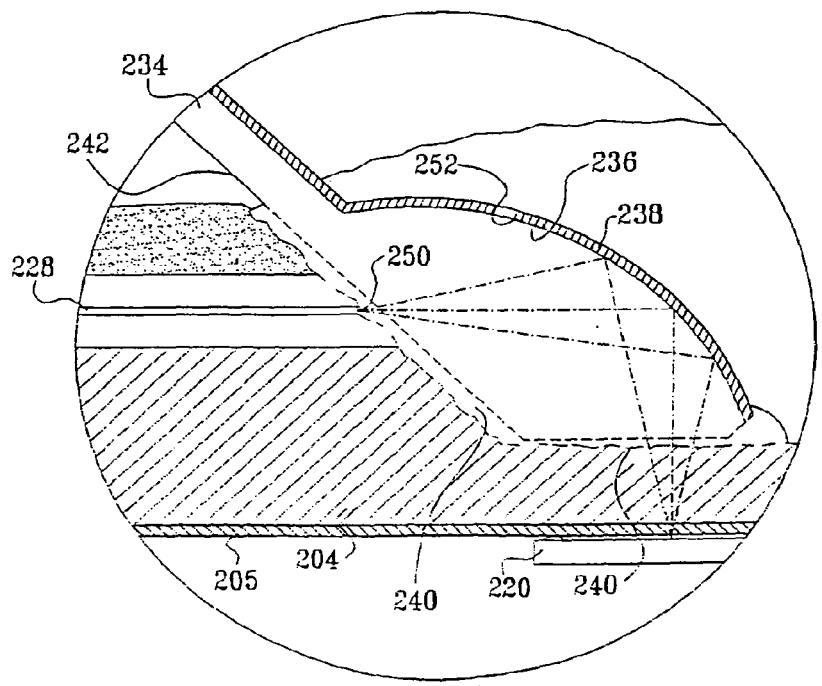

Reference is now made to FIG. 6A, which is an enlarged simplified optical illustration of a portion of FIG. 5D. Here it is seen that a generally uninterrupted optical path is defined for light, preferably in the wavelength range of 400-1650 nm, from an end 250 of a core 228, through adhesive 240, substrate 234 and curved portion 236 to a reflective surface 252 of layer 238 and thence through curved portion 236, adhesive 240, substrate 204 and layer 205 which are substantially transparent to this light. It is noted that the index of refraction of adhesive 240 is close to but not identical to that of curved portion 236 and substrates 204 and 234. In the embodiment of FIG. 6A, the operation of curved layer 238 is to focus light exiting from end 250 of core 228 onto the electro-optic component 220.

Reference is now made to FIG. 6B, which is an enlarged simplified optical illustration of a portion of FIG. 5D in accordance with a further embodiment of the present invention. In this embodiment, the curvature of curved layer 238 produces collimation rather than focusing of the light exiting from end 250 of core 228 onto the electro-optic component 220.

Reference is now made to FIG. 6C, which is an enlarged simplified optical illustration of a portion of FIG. 5D in accordance with yet another embodiment of the present invention wherein a grating 260 is added to curved layer 238. The additional provision of rating 260 causes separation of light impinging thereon according to its wavelength, such that multispectral light exiting from end 250 of core 228 is focused at multiple locations on electro-optic component 220 in accordance with the wavelengths of components thereof.

Figure 7:
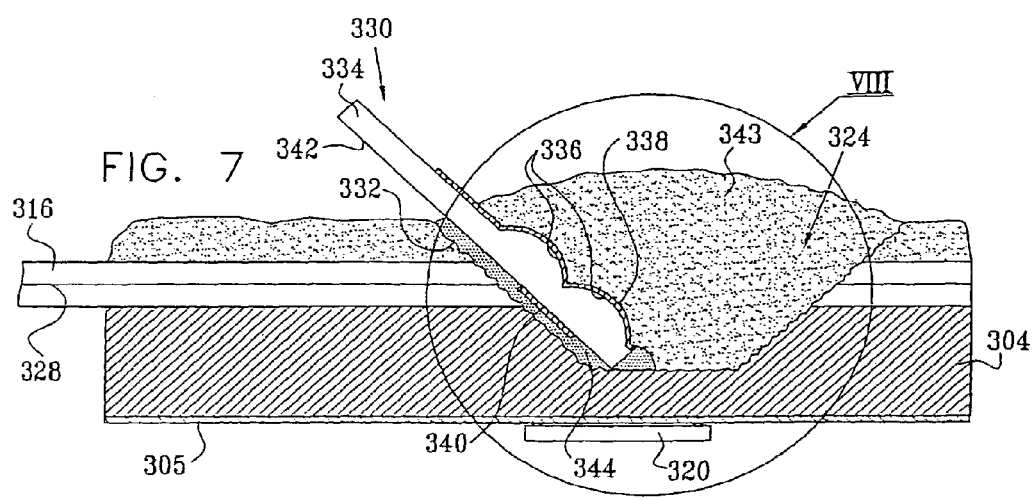
FIG. 7 is a simplified sectional illustration of an electro-optic integrated circuit constructed and operative in accordance with yet another preferred embodiment of the present invention.

Reference is now made to FIG. 7, which is a simplified sectional illustration of an electro-optic integrated circuit constructed and operative in accordance with yet another preferred embodiment of the present invention. The embodiment of FIG. 7 corresponds generally to that described hereinabove with respect to FIG. 5D other than in that a mirror with multiple concave reflective surfaces is provided rather than a mirror with a single such reflective surface. As seen in FIG. 7, it is seen that light from optical fiber 316 is directed onto an electro-optic component 320 by a partially flat and partially concave mirror assembly 330, preferably mounted parallel to one of the rough inclined surfaces 332 defined by notch 324. Mirror assembly 330 preferably comprises a glass substrate 334 having formed thereon a plurality of curved portions 336 over which are formed a curved metallic layer or a dichroic filter layer 338. Mirror assembly 330 also defines a reflective surface 340, which is disposed on a planar surface 342 generally opposite layer 338. Preferably, the mirror assembly 330 is securely held in place partially by any suitable adhesive 343, such as epoxy, and partially by an optical adhesive 344, such as OG 146, manufactured by Epoxy Technology, 14 Fortune Drive, Billerica, Mass. 01821, USA, whose refractive index preferably is precisely matched to that of the cores 328 of the optical fibers 316. It is appreciated that optical adhesive 344 may be employed throughout instead of adhesive 343. The optical adhesive 344 preferably fills the interstices between the roughened surface 332 defined by notch 324 and surface 342 of mirror assembly 330.

Figure 8A:
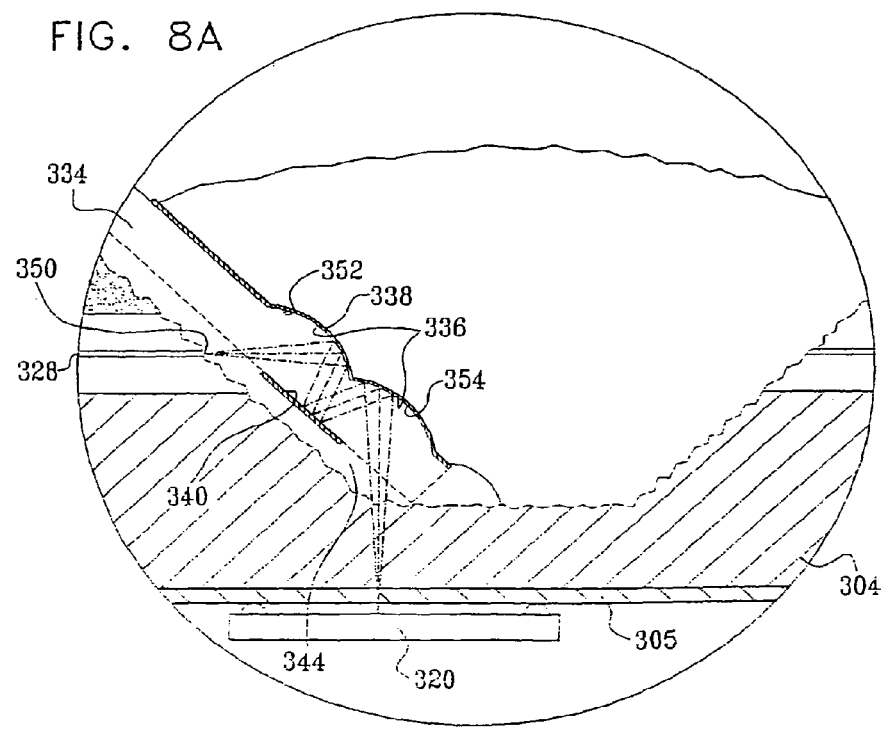

Reference is now made to FIG. 8A, which is an enlarged simplified optical illustration of a portion of FIG. 7. Here it is seen that a generally uninterrupted optical path is defined for light, preferably in the wavelength range of 400-1650 nm, from an end 350 of a core 328, through adhesive 344, substrate 334 and first curved portion 336, to a curved reflective surface 352 of layer 338 and thence through first curved portion 336 and substrate 334 to reflective surface 340, from reflective surface 340 through substrate 334 and second curved portion 336 to another curved reflective surface 354 of layer 338 and thence through second curved portion 336, substrate 334, adhesive 344, substrate 304 and layer 305, which are substantially transparent to this light. It is noted that the index of refraction of adhesive 344 is close to but not identical to that of substrates 304 and 334. In the embodiment of FIG. 8A, the operation of curved layer 338 and reflective surface 340 is to focus light exiting from end 350 of core 328 onto the electro-optic component 320.

Reference is now made to FIG. 8B, which is an enlarged simplified optical illustration of a portion of FIG. 7 in accordance with a further embodiment of the present invention. In this embodiment, the curvature of curved layer 338 produces collimation rather than focusing of the light exiting from end 350 of core 328 onto the electro-optic component 320.

Reference is now made to FIG. 8C, which is an enlarged simplified optical illustration of a portion of FIG. 7 in accordance with yet another embodiment of the present invention wherein a reflective grating 360 replaces reflective surface 340. The additional provision of grating 360 causes separation of light impinging thereon according to its wavelength, such that multispectral light existing from end 350 of core 328 is focused at multiple locations on electro-optic component 320 in accordance with the wavelengths of components thereof.

Reference is now made to FIGS. 9A, 9B, 9C, 9D and 9E, which are simplified pictorial illustrations of initial stages in the production of an electro-optic integrated circuit constructed and operative in accordance with yet another preferred embodiment of the present invention. As seen in FIG.

9A, one or more electrical circuits 400 are preferably formed onto a portion of a surface 402 of a substrate 404, preferably a glass, silicon or ceramic substrate, typically of thickness between 300-1000 microns. The electrical circuits 400 are preferably formed by conventional photolithographic techniques employed in the production of integrated circuits, and included within a planarized layer 406 formed onto substrate 404.

Figure 9A:
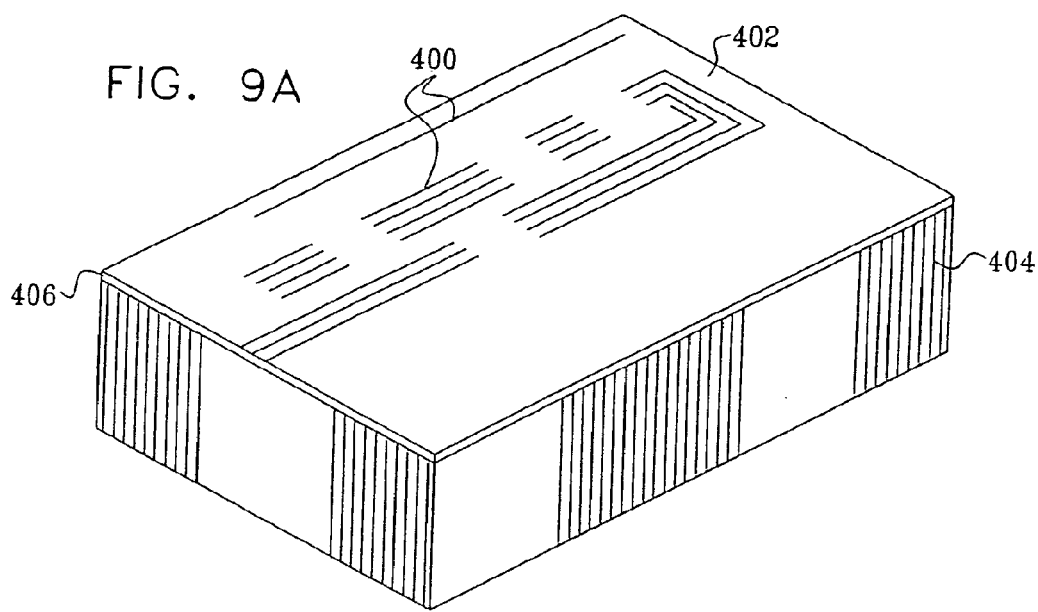
Figure 9B:
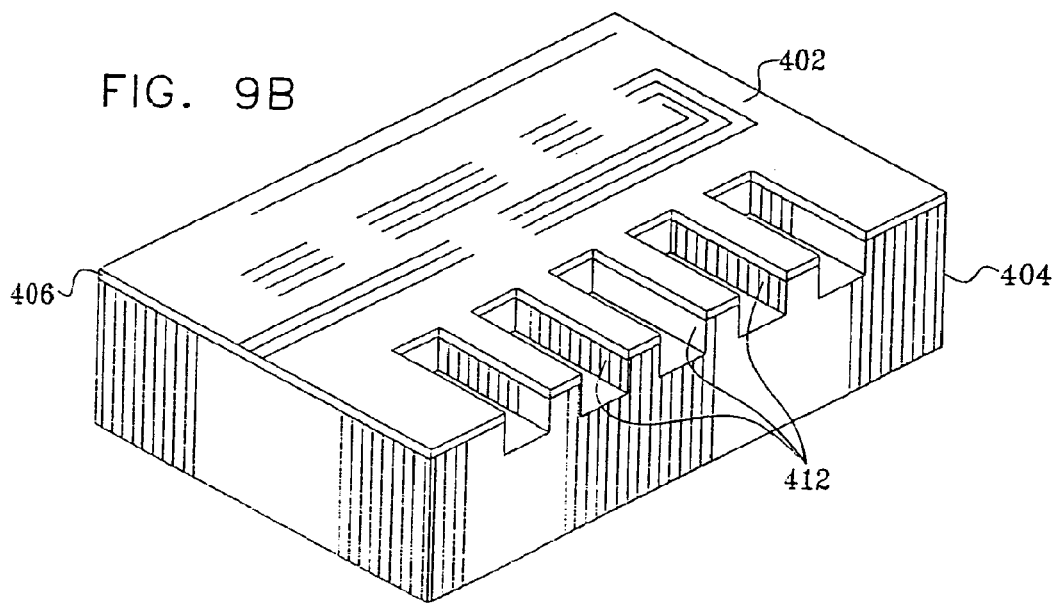
Figure 9E:
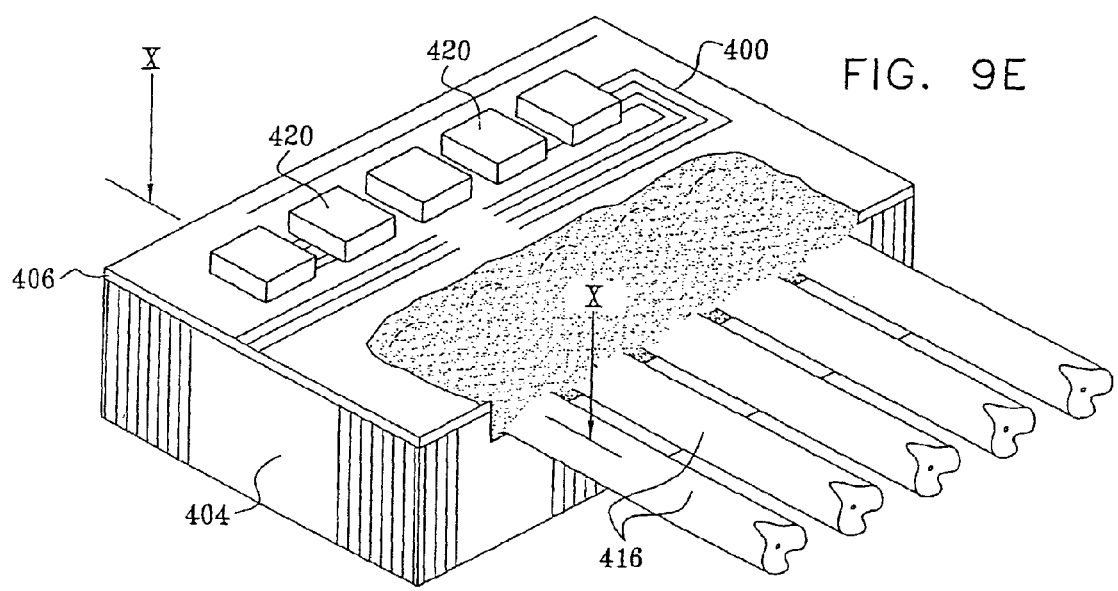

Turning now to FIG. 9B, it is seen that another portion of the surface 402 is formed with an array of parallel, spaced, elongate optical fiber positioning elements 412 by any suitable technique, such as etching or notching. As seen in FIG. 9C, an array of optical fibers 416 is engaged with substrate 404, each fiber being positioned between adjacent positioning elements 412. The fibers are fixed in place relative to positioning elements 412 and to substrate 404 by means of a suitable adhesive 418, preferably epoxy, as seen in FIG. 9D. As seen in FIG. 9E, a plurality of electro-optic components 420, such as diode lasers, are mounted in operative engagement with electrical circuits 400, each electro-optic component 420 preferably being aligned with a corresponding fiber 416. It is appreciated that electro-optic component 420 may be any suitable electro-optic component, such as a laser diode, diode detector, waveguide, array waveguide, rating, or a semiconductor optical amplifier.

Figure 10A:
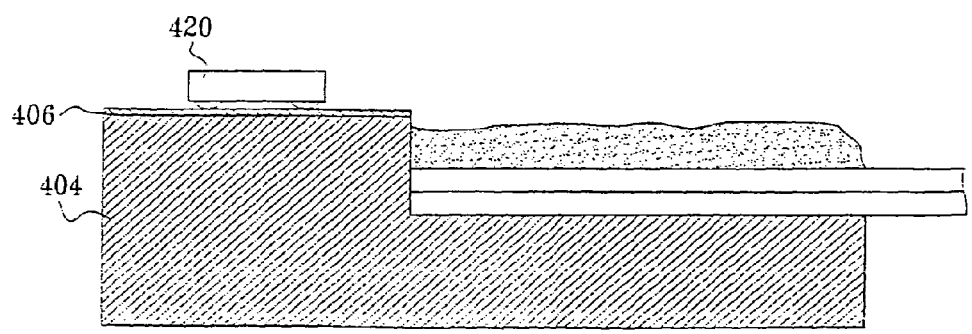
FIGS. 10A, 10B, 10C and 10D are simplified sectional illustrations of further stages in the production of the electro-optic integrated circuit referenced in FIGS. 9A-9E.
Figure 10B:
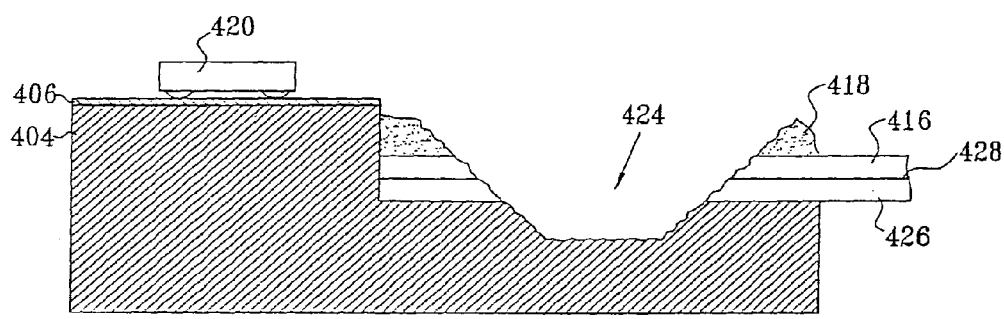

Reference is now made to FIGS. 10A, 10B, 10C, and 10D, which are simplified sectional illustrations, taken along the lines X-X in FIG. 9E, of further stages in the production of an electro-optic integrated circuit. As seen in FIG. 10A, which corresponds to FIG. 9E, electro-optic components 420 are each mounted onto an electrical circuit (not shown), included within planarized layer 406 formed onto substrate 404. As shown in FIG. 10B, a transverse notch 424 is preferably formed to extend through the adhesive 418 entirely through each optical fiber 416 and partially into substrate 404. Specifically, in this embodiment, the notch 424 extends through all of cladding 426 of each fiber 416 and entirely through the core 428 of each fiber. It is appreciated that the surfaces defined by the notch 424 are relatively rough, as shown.

Figure 10C:
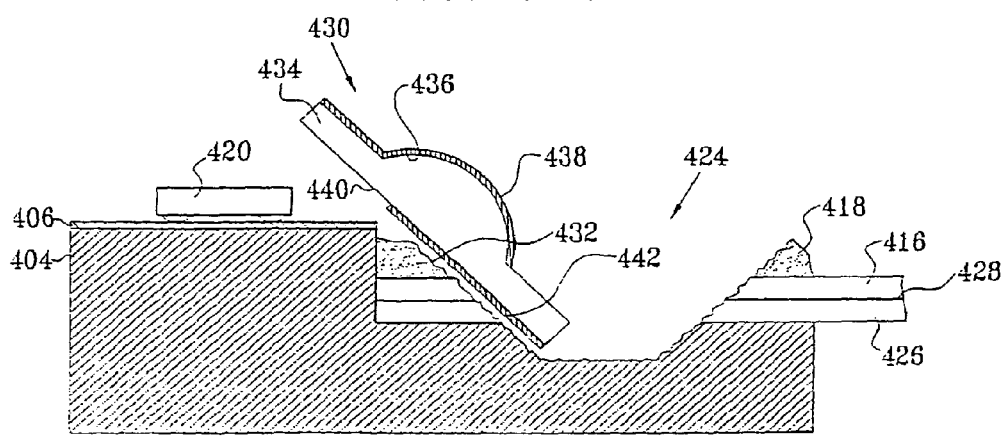

Turning, now to FIG. 10C, it is seen that a partially flat and partially concave mirror assembly 430 is preferably mounted parallel to one of the rough inclined surfaces 432 defined by notch 424. Mirror assembly 430 preferably comprises a glass substrate 434 having formed thereon a curved portion 436 over which is formed a curved metallic layer or a dichroic filter layer 438. Mirror assembly 430 also defines a planar surface 440, generally opposite layer 438, having formed thereon a metallic layer or a dichronic filter layer 442 underlying part of the curved portion 436.

Figure 10D:
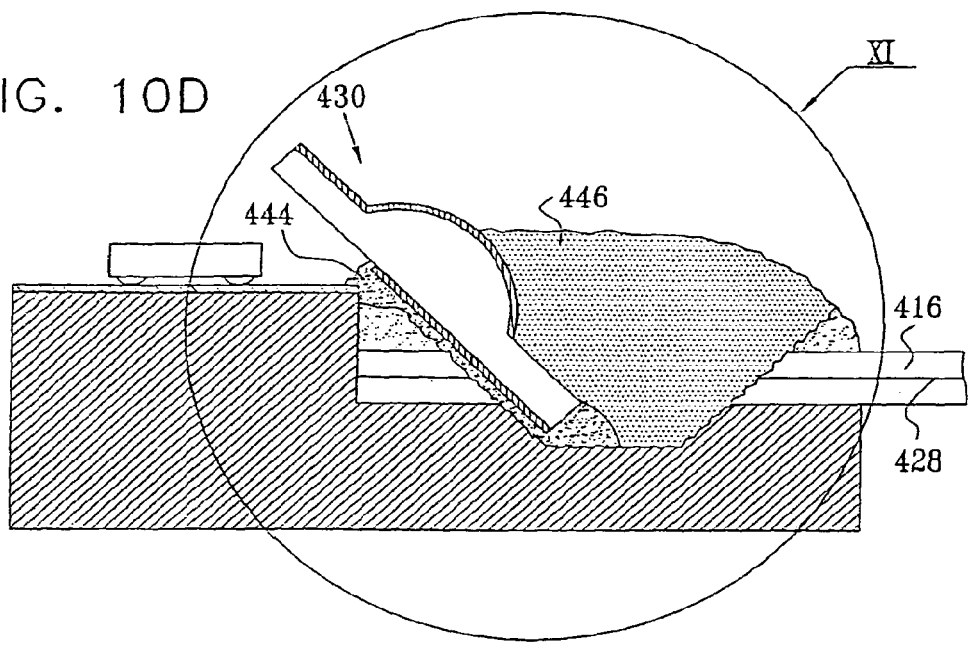

As seen in FIG. 10D, preferably, the mirror assembly 430 is securely held in place partially by any suitable adhesive 444, such as epoxy, and partially by an optical adhesive 446, such as OG 146, manufactured by Epoxy Technology, 14 Fortune Drive, Billerica, Mass. 01821, USA, whose refractive index preferably is precisely matched to that of the cores 428 of the optical fibers 416. It is appreciated that optical adhesive 446 may be employed throughout instead of adhesive 444.

Figure 11A:
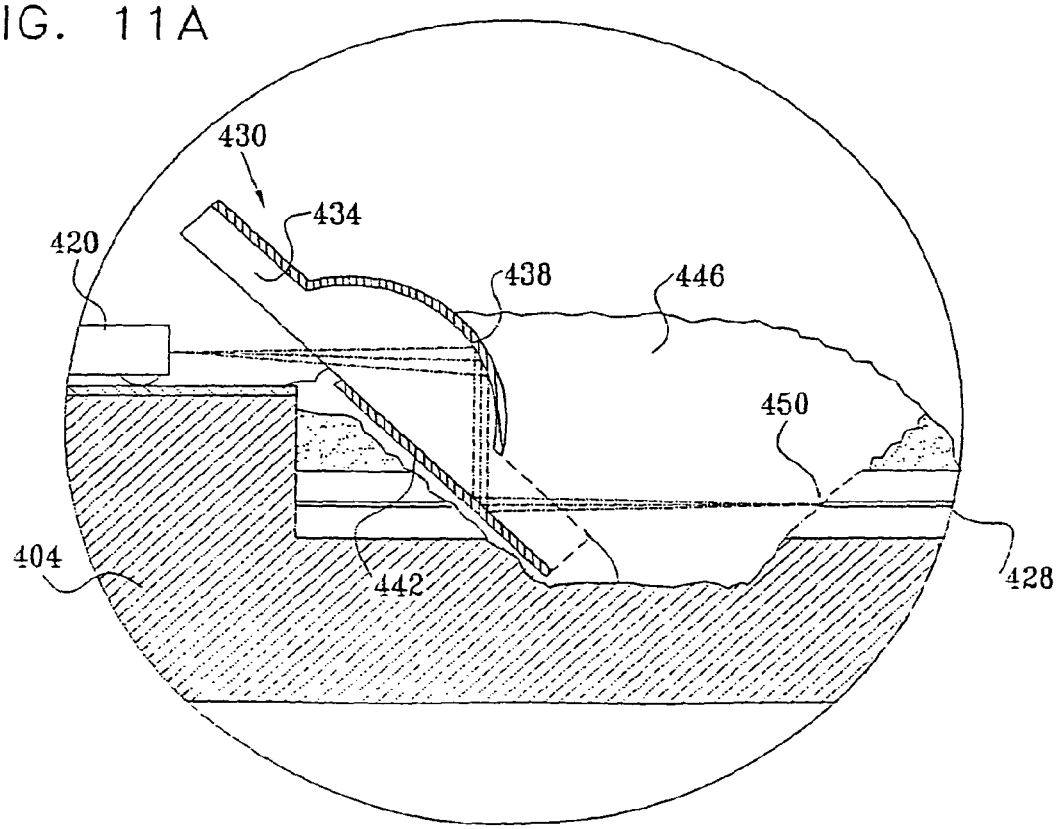
FIGS. 11A, 11B and 11C are enlarged simplified optical illustrations of a portion of FIG. 10D in accordance with preferred embodiments of the present invention.

Reference is now made to FIG. 11A, which is an enlarged simplified optical illustration of a portion of FIG. 10D. Here it is seen that a generally uninterrupted optical path is defined for light, preferably in the wavelength range of 400-1650 nm, from each electro-optic component 420 through glass substrate 434 and curved portion 436 of mirror assembly 430 into reflective engagement with layer 438 and thence through curved portion 436 and substrate 434 to layer 442 and reflected from layer 442 through substrate 434 and adhesive 446 to focus at an end 450 of a core 428. In the embodiment of FIG. 11A, the operation of curved layer 438 is to focus light exiting from electro-optic component 420 onto end 450 of core 428.

Figure 11B:
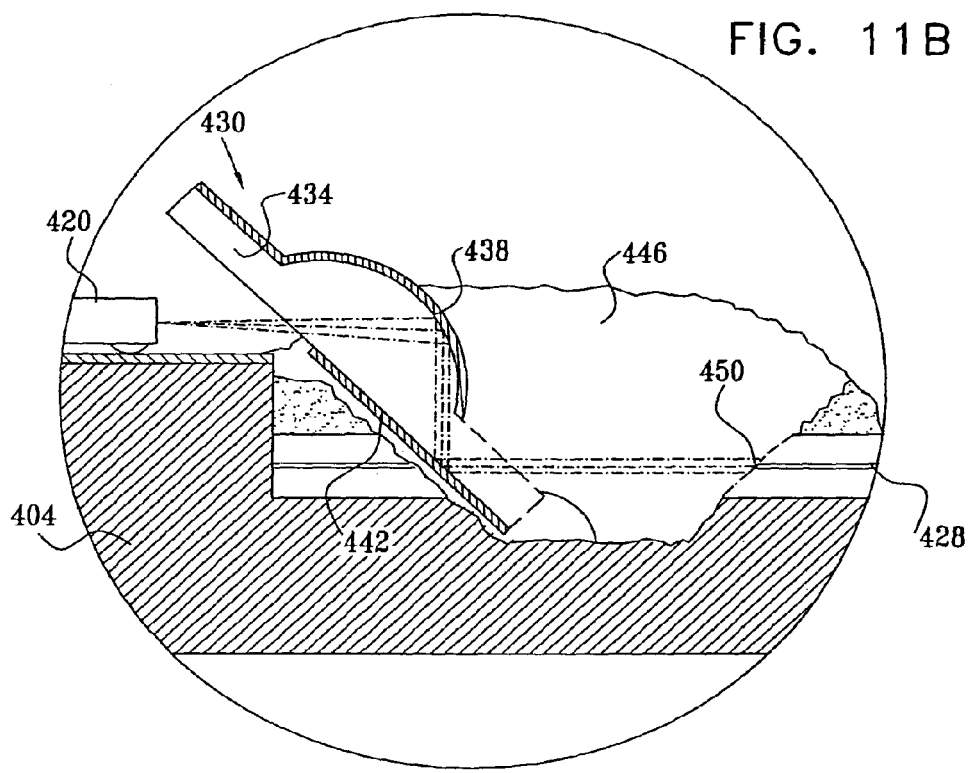

Reference is now made to FIG. 11B, which is an enlarged simplified optical illustration of a portion of FIG. 10D in accordance with a further embodiment of the present invention. In this embodiment, the curvature of curved layer 438 produces collimation rather than focusing of the light exiting from electro-optic component 420 onto end 450 of core 428.

Figure 11C:
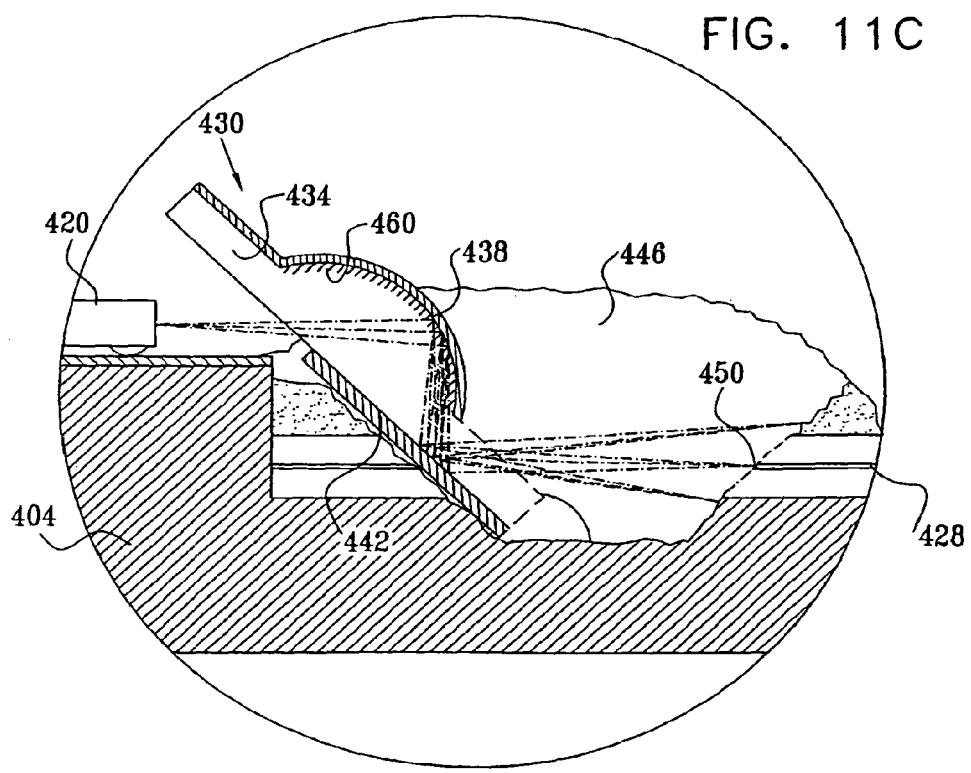

Reference is now made to FIG. 11C, which is an enlarged simplified optical illustration of a portion of FIG. 10D in accordance with yet another embodiment of the present invention wherein a grating 460 is added to curved layer 438. The additional provision of grating 460 causes separation of light impinging thereon according to its wavelength, such that only one component of multispectral light exiting electro-optic component 420 is focused on end 450 of core 428.

Figure 12:
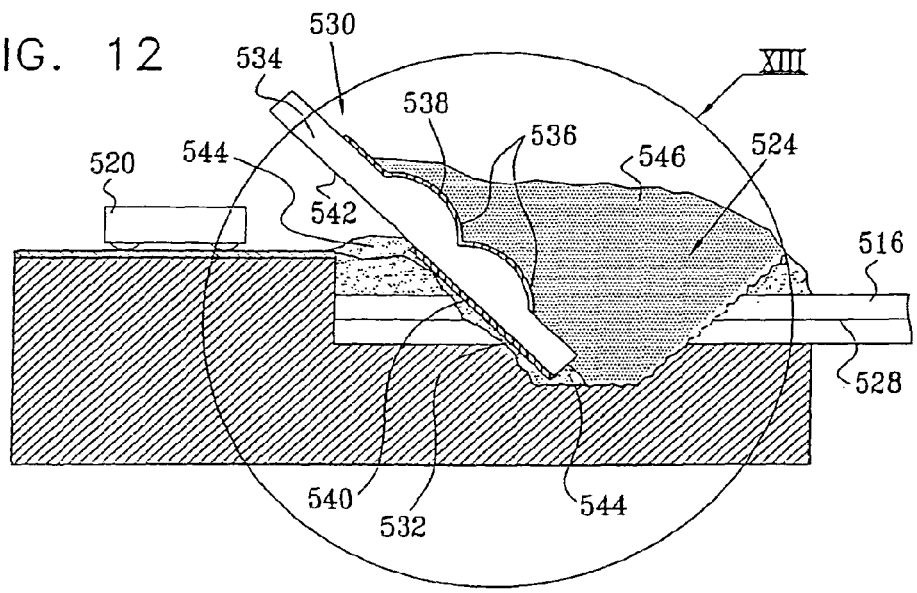
FIG. 12 is a simplified sectional illustration of an electro-optic integrated circuit constructed and operative in accordance with yet another preferred embodiment of the present invention.

Reference is now made to FIG. 12, which is a simplified sectional illustration of an electro-optic integrated circuit constructed and operative in accordance with yet another preferred embodiment of the present invention. The embodiment of FIG. 12 corresponds generally to that described hereinabove with respect to FIG. 10D other than in that a mirror with multiple concave reflective surfaces is provided rather than a mirror with a single such reflective surface. As seen in FIG. 12, it is seen that light from an electro-optic component 520, such as a laser diode, is directed onto a partially flat and partially concave mirror assembly 530, preferably mounted parallel to one of the rough inclined surfaces 532 defined by notch 524. It is appreciated that electro-optic component 520 may be any suitable electro-optic component, such as a laser diode, diode detector, waveguide, array waveguide grating or a semiconductor optical amplifier. Mirror assembly 530 preferably comprises a glass substrate 534 having formed thereon a plurality of curved portions 536 over which are formed a curved metallic layer or a dichroic filter layer 538. Mirror assembly 530 also defines a reflective surface 540, which is disposed on a planar surface 542 generally opposite layer 538.

Preferably, the mirror assembly 530 is securely held in place partially by any suitable adhesive 544, such as epoxy, and partially by an optical adhesive 546, such as OG 146, manufactured by Epoxy Technology, 14 Fortune Drive, Billerica, Mass. 01821, USA, whose refractive index preferably is precisely matched to that of the cores 528 of the optical fibers 516. It is appreciated that optical adhesive 546 may be employed throughout instead of adhesive 544.

Figure 13A:
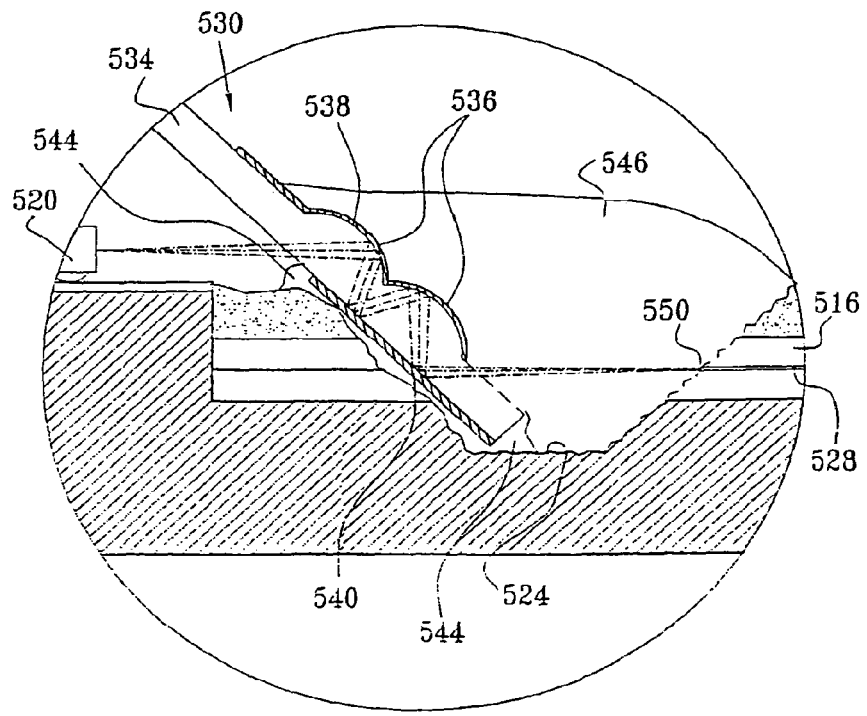
FIGS. 13A, 13B and 13C are enlarged simplified optical illustrations of a portion of FIG. 12 in accordance with further preferred embodiments of the present invention.

Reference is now made to FIG. 13A, which is an enlarged simplified optical illustration of a portion of FIG. 12. Here it is seen that a generally uninterrupted optical path is defined for light, preferably in the wavelength range of 400-1650 nm, from each electro-optic component 520 through substrate 534 and a first curved portion 536 of mirror assembly 530 into reflective engagement with a part of layer 538 overlying first curved portion 536 and thence through first curved portion 536 and substrate 534 to reflective surface 540, where it is reflected back through substrate 534 and a second curved portion 536 to another part of layer 538 overlying second curved portion 536 and is reflected back through second curved portion 536 and substrate 534 to reflective surface 540 and thence through substrate 534 and adhesive 546 to focus at an end 550 of a core 528. In the embodiment of FIG. 13A, the operation of curved layer 538 overlying first and second curved portions 536 is to focus light exiting from electro-optic component 520 onto end 550 of core 528, with enhanced optical properties.

Figure 13B:
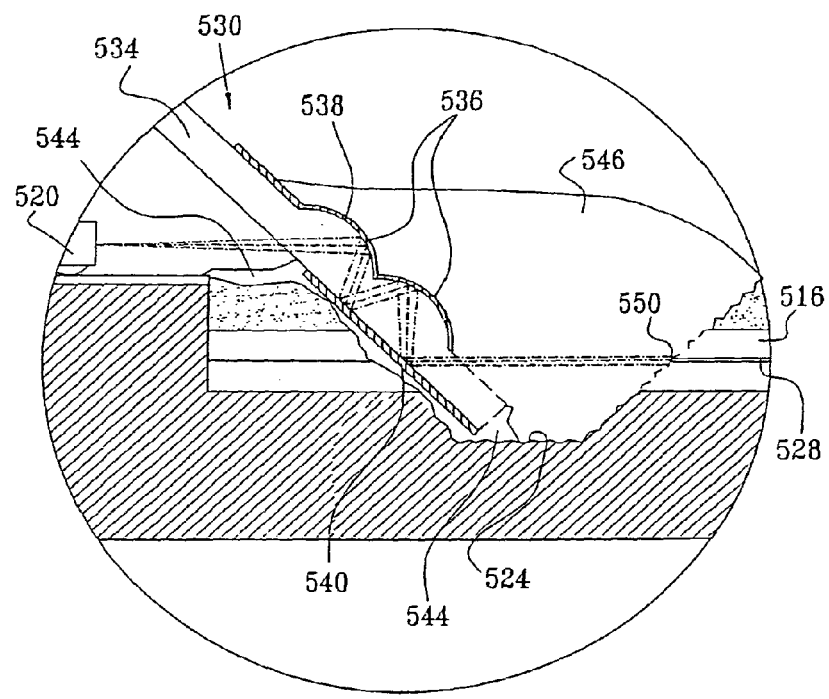

Reference is now made to FIG. 13B, which is an enlarged simplified optical illustration of a portion of FIG. 12 in accordance with a further embodiment of the present invention. In this embodiment, the curvature of curved layer 538 produces collimation rather than focusing of the light exiting from electro-optic component 520 onto end 550 of core 528.

Figure 13C:
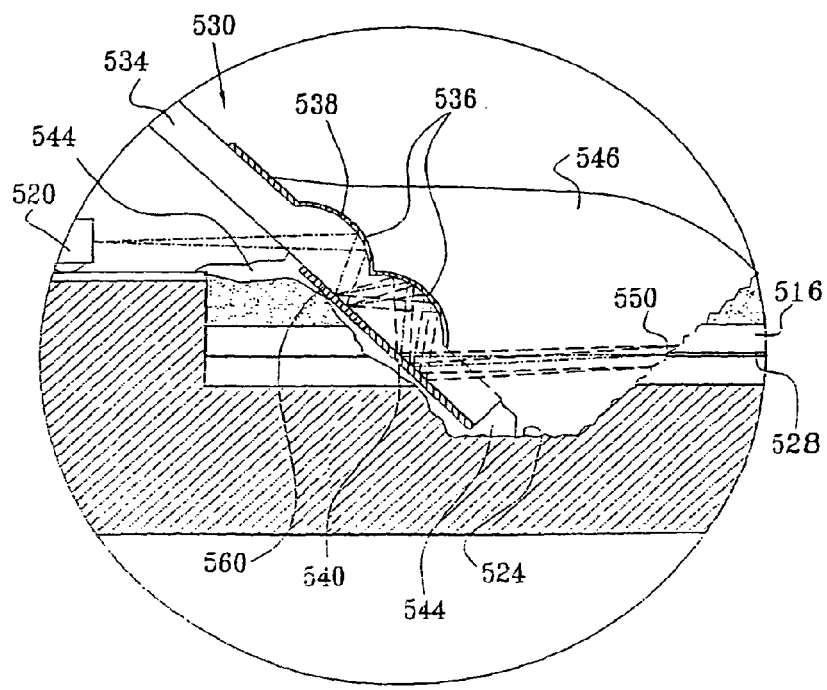

Reference is now made to FIG. 13C, which is an enlarged simplified optical illustration of a portion of FIG. 12 in accordance with yet another embodiment of the present invention wherein a reflective grating 560 replaces part of reflective surface 540. The additional provision of grating 560 causes separation of light impinging thereon according to its wavelength, such that only one component of multispectral light exiting electro-optic component 520 is focused on end 550 of core 528.

Figure 14A:
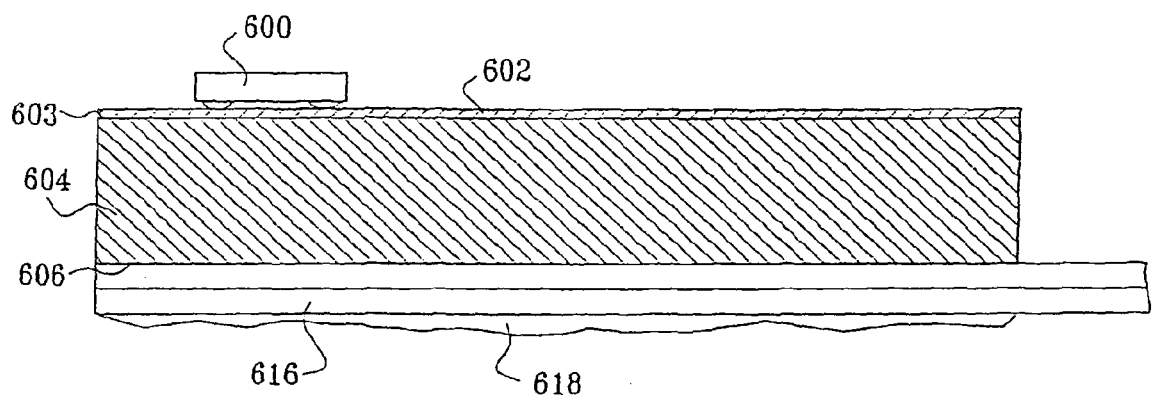
FIGS. 14A, 14B, 14C and 14D are simplified sectional illustrations of stages in the production an electro-optic integrated circuit in accordance with another embodiment of the present invention.

Reference is now made to FIGS. 14A, 14B, 14C and 14D, which are simplified pictorial illustrations of further stages in the production of an electro-optic integrated circuit constructed and operative in accordance with yet another preferred embodiment of the present invention. As seen in FIG. 14A, similarly to that shown in FIG. 5A, electro-optic components 600, such as edge emitting diode lasers, are mounted onto an electrical circuit (not shown), included within a planarized layer 602 formed onto a surface 603 of a substrate 604, at the opposite surface 606 of which are mounted optical fibers 616 by means of adhesive 618. It is appreciated that electro-optic components 600 may be any suitable electro-optic component, such as a laser diode, diode detector, waveguide, array waveguide grating or a semiconductor optical amplifier.

Figure 14B:
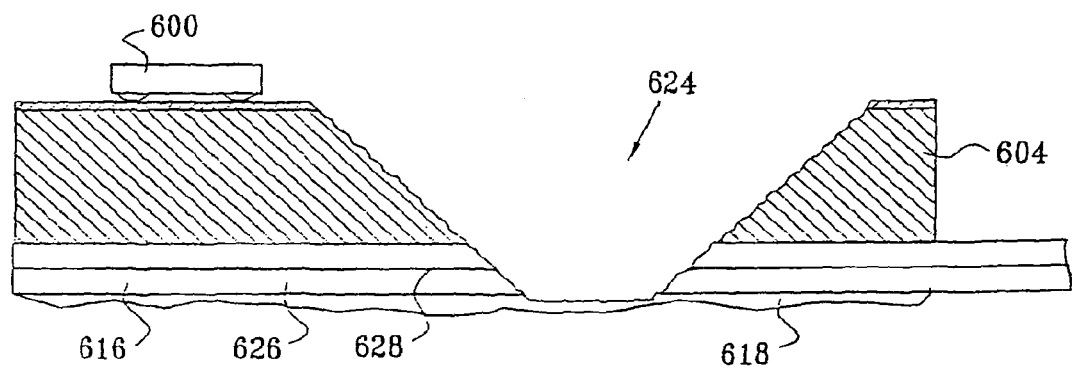
Figure 14C:
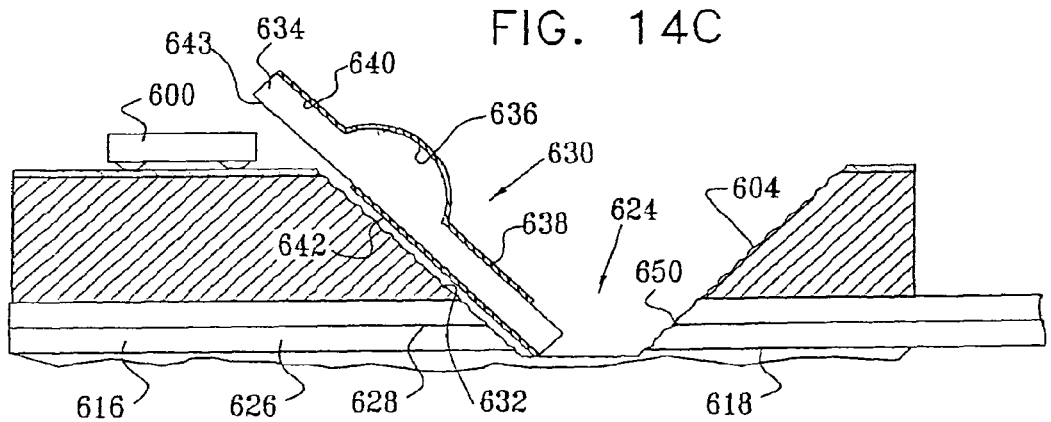

As shown in FIG. 14B, a transverse notch 624 is preferably formed, extending completely through substrate 604 and entirely through each optical fiber 616 and partially into adhesive 618. Specifically, in this embodiment, the notch 624 extends through all of cladding 626 of each fiber 616 and entirely through the core 628 of each fiber. It is appreciated that the surfaces defined by the notch 624 are relatively rough, as Turning now to FIG. 14C, it is seen that a partially flat and partially concave mirror assembly 630 is preferably mounted parallel to one of the rough inclined surfaces 632 defined by notch 624. Mirror assembly 630 preferably comprises a glass substrate 634 having formed thereon a curved portion 636. A partially planar and partially curved metallic layer or a dichroic filter layer 638 is formed over a surface 640 of substrate 634 and curved portion 636 formed thereon. A reflective layer 642 is formed on an opposite surface 643 of substrate 634 opposite layer 638.

Figure 14D:
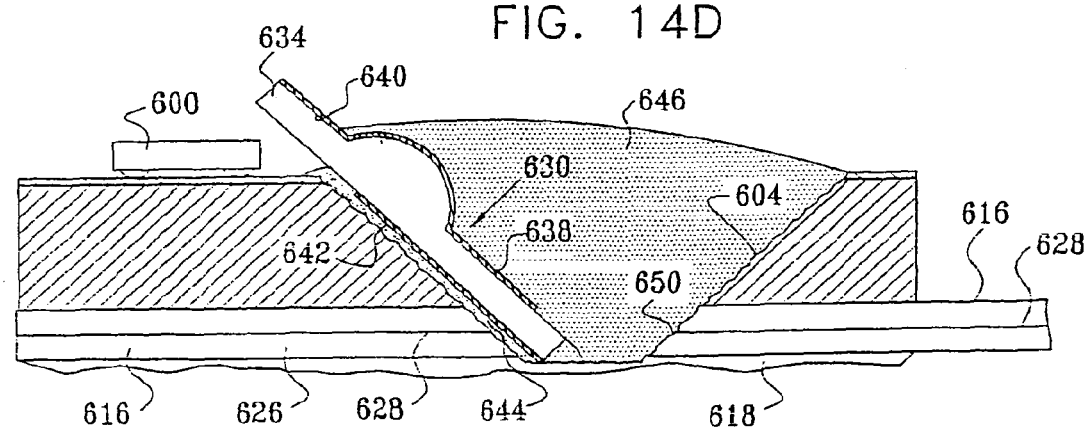

As seen in FIG. 14D, preferably, the mirror assembly 630 is securely held in place partially by any suitable adhesive 644, such as epoxy, and partially by an optical adhesive 646, such as OG 146, manufactured by Epoxy Technology, 14 Fortune Drive, Billerica, Mass. 01821, USA, whose refractive index preferably is precisely matched to that of the cores 628 of the optical fibers 616. It is appreciated that optical adhesive 646 may be employed throughout instead of adhesive 644.

Figure 15A:
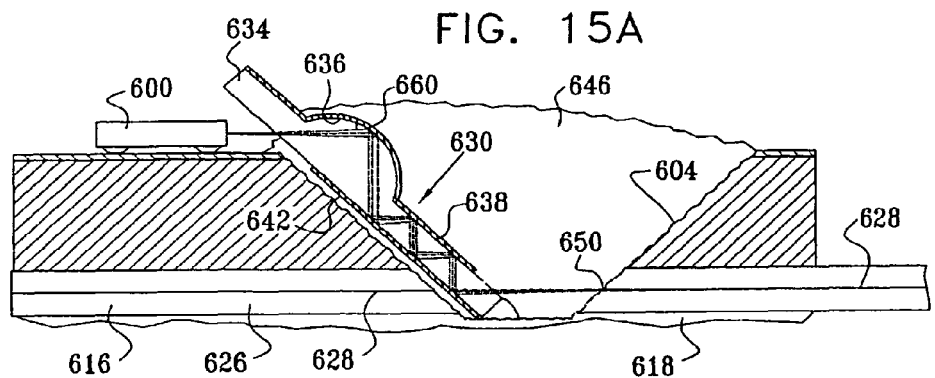
FIGS. 15A, 15B and 15C are simplified optical illustrations of FIG. 14D in accordance with preferred embodiments of the present invention.

Reference is now made to FIG. 15A, which is a simplified optical illustration of FIG. 14D. Here it is seen that a generally uninterrupted optical path is defined for light, preferably in the wavelength range of 400-1650 nm, from each electro-optic component 600 through glass substrate 634 and curved portion 636 of mirror assembly 630 into reflective engagement with a curved portion 660 of layer 638 and thence through curved portion 636 and substrate 634 into reflective engagement with layer 642 and thence through multiple reflections through substrate 634 between layer 638 and layer 642, and then through substrate 634 and adhesive 646 to focus at an end 650 of a core 628. In the embodiment of FIG. 15A, the operation of the curved portion or layer 638 is to focus light exiting from electro-optic component 600 onto end 650 of core 628.

Figure 15B:
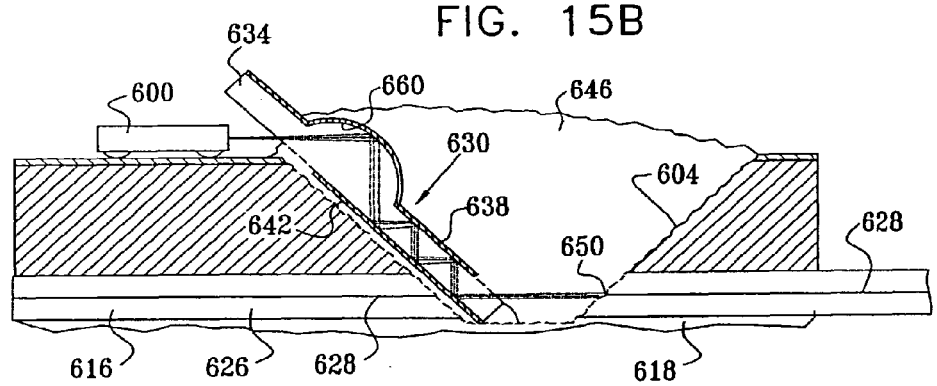

Reference is now made to FIG. 15B, which is a simplified optical illustration of FIG. 14D in accordance with a further embodiment of the present invention. In this embodiment, the curvature of the curved portion 660 of layer 638 produces collimation rather than focusing of the light exiting from electro-optic component 600 onto end 650 of core 628.

Figure 15C:
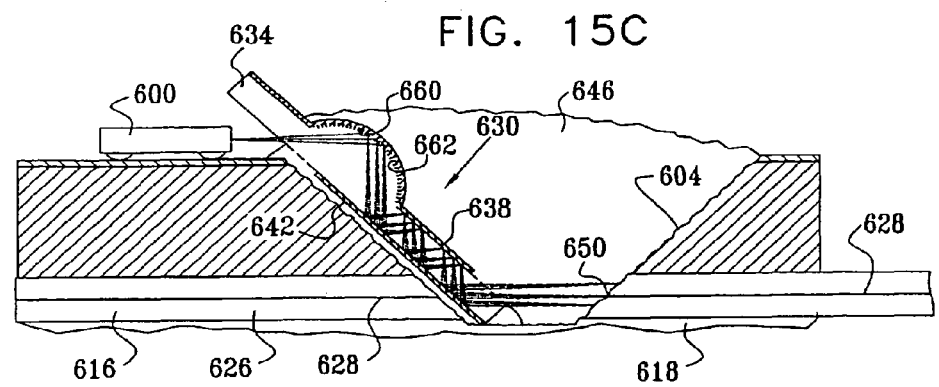

Reference is now made to FIG. 15C, which is a simplified optical illustration of FIG. 14D in accordance with yet another embodiment of the present invention wherein a grating 662 is added to the curved portion 660 of layer 638. The additional provision of grating 662 causes separation of light impinging thereon according to its wavelength, such that only one component of multispectral light exiting electro-optic component 600 is focused on end 650 of core 628.

Figure 16:
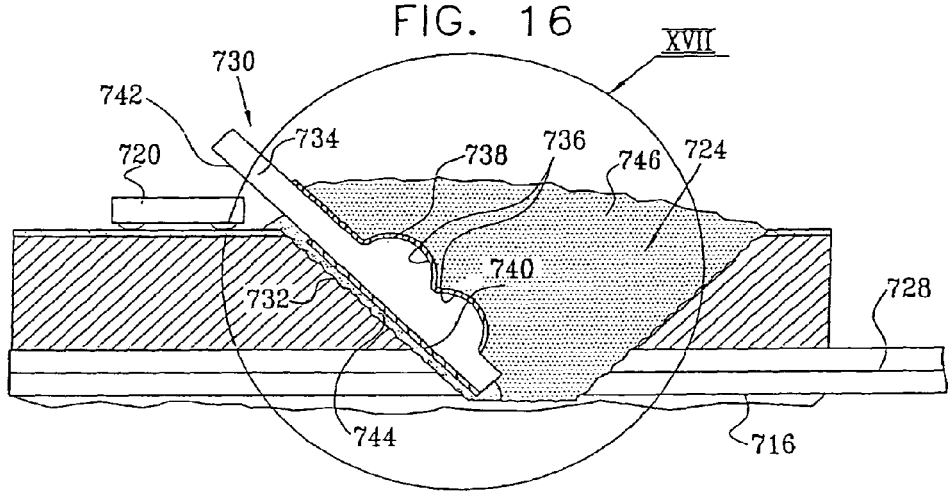
FIG. 16 is a simplified sectional illustration of an electro-optic integrated circuit constructed and operative in accordance with yet another preferred embodiment of the present invention.

Reference is now made to FIG. 16, which is a simplified sectional illustration of an electro-optic integrated circuit constructed and operative in accordance with still another preferred embodiment of the present invention. The embodiment of FIG. 16 corresponds generally to that described hereinabove with respect to FIG. 14D other than in that a mirror with multiple concave reflective surfaces is provided rather than a mirror with a single such reflective surface. As seen in FIG. 16, it is seen that light from an electro-optic component 720, such as a diode laser, is directed onto a partially flat and partially concave mirror assembly 730, preferably mounted parallel to one of the rough inclined surfaces 732 defined by notch 724. It is appreciated that electro-optic component 720 may be any suitable electro-optic component, such as a laser diode, diode detector, waveguide, array waveguide grating or a semiconductor optical amplifier. Mirror assembly 730 preferably comprises a glass substrate 734 having formed thereon a plurality of curved portions 736 over which are formed a curved metallic layer or a dichroic filter layer 738. Mirror assembly 730 also defines a reflective surface 740, which is disposed on a planar surface 742 generally opposite layer 738.

Preferably, the mirror assembly 730 is securely held in place partially by any suitable adhesive 744, such as epoxy, and partially by an optical adhesive 746, such as OG 146, manufactured by Epoxy Technology, 14 Fortune Drive, Billerica, Mass. 018321, USA, whose refractive index preferably is precisely matched to that of the cores 728 of the optical fibers 716. It is appreciated that optical adhesive 746 may be employed throughout instead of adhesive 744.

Figure 17A:
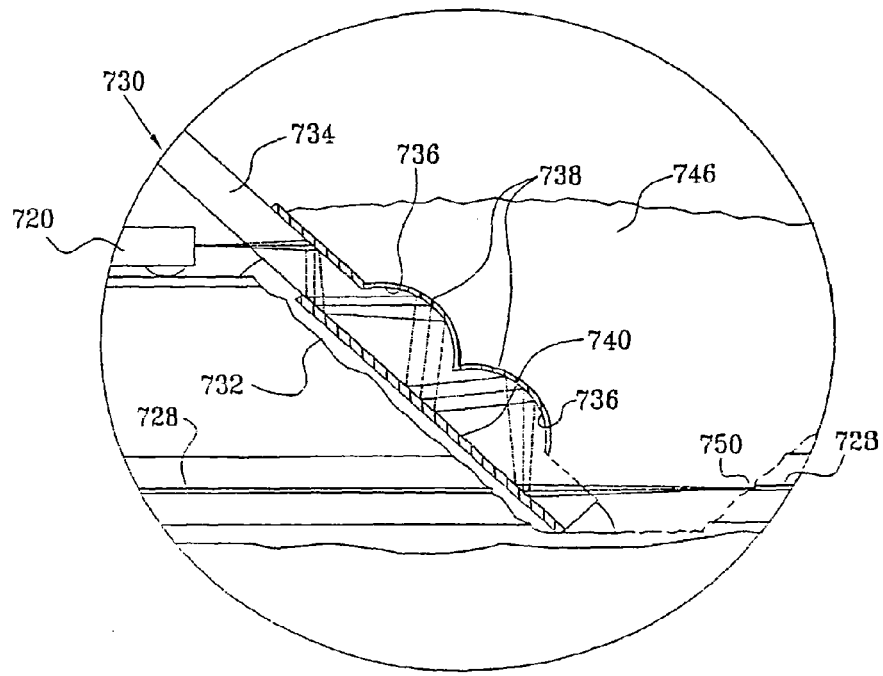
FIGS. 17A, 17B and 17C are enlarged simplified optical illustrations of a portion of FIG. 16 in accordance with further embodiments of the present invention.

Reference is now made to FIG. 17A, which is an enlarged simplified optical illustration of a portion of FIG. 16. Here it is seen that a generally uninterrupted optical path is defined for light, preferably in the wavelength range of 400-1650 nm, from each electro-optic component 720 through glass substrate 734 of mirror assembly 730 into reflective engagement with a part of layer 738 overlying the flat portion thereof, and thence through substrate 734 to reflective surface 740, where it is reflected back through substrate 734 and a first curved portion 736 into reflective engagement with a part of layer 738 overlying first curved portion 736, and thence through first curved portion 736 and substrate 734 to reflective surface 740, where it is reflected back through substrate 734 and a second curved portion 736 to another part of layer 738 overlying second curved portion 736 and is reflected back through second curved surface 736 and substrate 734 to reflective surface 740 and thence through substrate 734 and adhesive 746 to focus at an end 750 of a core 728. In the embodiment of FIG. 17A, the operation of curved layer 738 overlying first and second curved portions 736 is to focus light exiting from electro-optic component 720 onto end 750 of core 728, with enhanced optical properties.

Figure 17B:
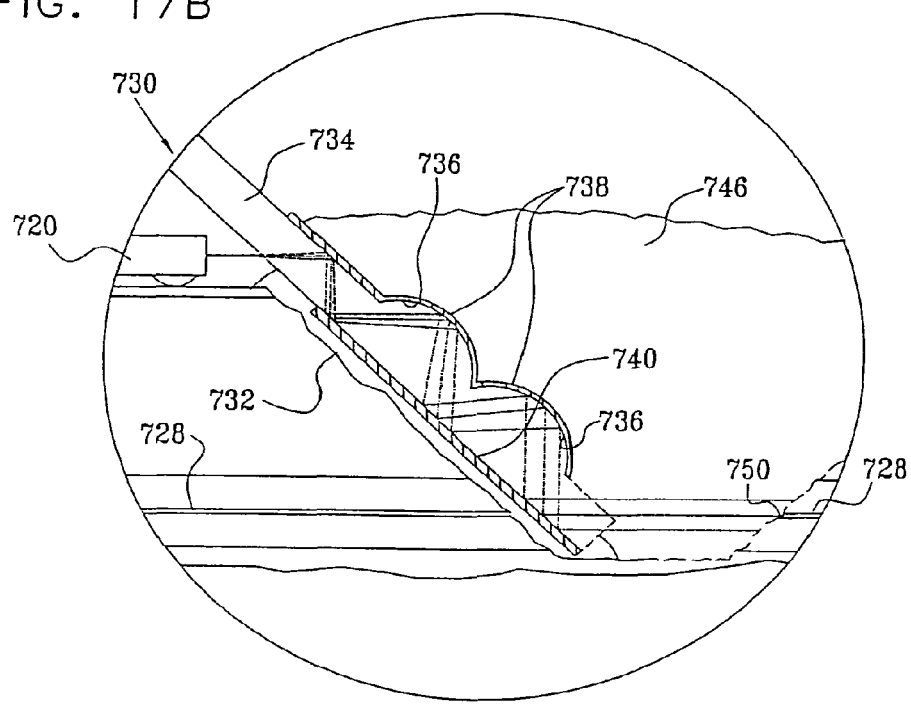

Reference is now made to FIG. 17B, which is an enlarged simplified optical illustration of a portion of FIG. 16 in accordance with a further embodiment of the present invention. In this embodiment, the curvature of curved layer 738 produces collimation rather than focusing of the light exiting from electro-optic component 720 onto end 750 of core 728.

Figure 17C:
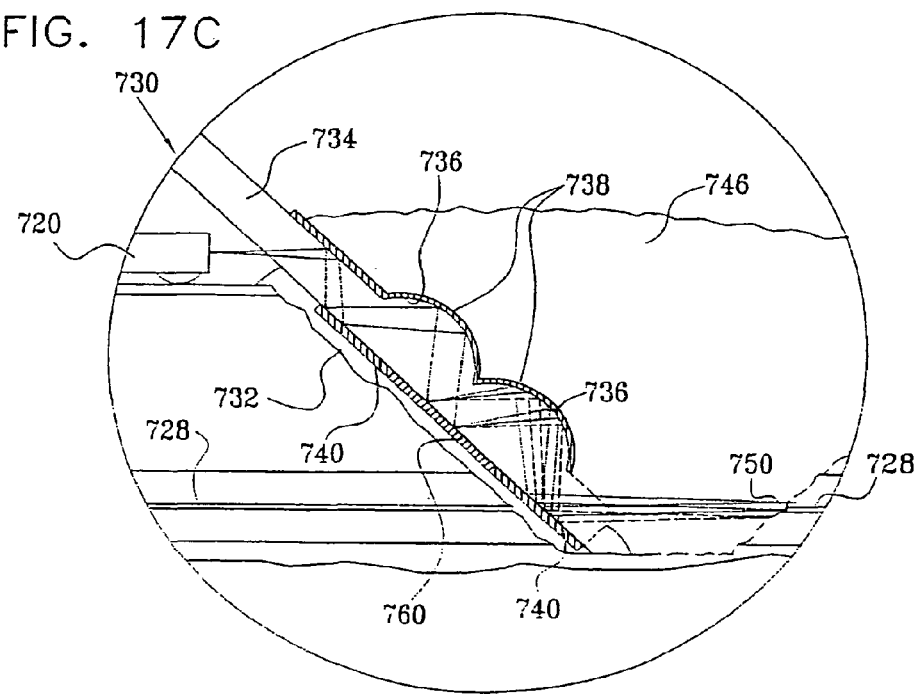

Reference is now made to FIG. 17C, which is an enlarged simplified optical illustration of a portion of FIG. 16 in accordance with yet another embodiment of the present invention wherein a reflective grating 760 replaces a middle portion of reflective surface 740. The additional provision of grating 760 causes separation of light Impinging thereon according to its wavelength, such that only one component of multispectral light exiting electro-optic component 720 is focused on end 750 of core 728.

Figure 18A:
FIGS. 18A, 18B, 18C and 18D are simplified illustrations of a method for fabricating optical elements employed in the embodiments of FIGS. 4A-6C in accordance with one embodiment of the present invention.
Figure 18B:
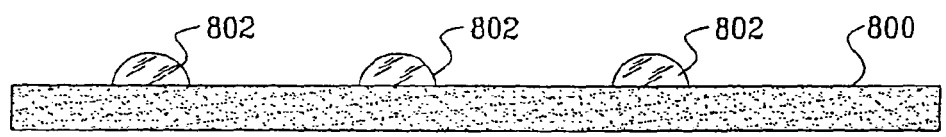

Reference is now made to FIGS. 18A, 18B, 18C and 18D, which are simplified illustrations of a method for fabricating optical elements employed in the embodiments of FIGS. 4A-6C in accordance with one embodiment of the present invention. A glass substrate 800, typically of thickness 200-400 microns, seen in FIG. 18A has formed thereon an array of microlenses 802, typically formed of photoresist, as seen in FIG. 18B. The microlenses 802 preferably have an index of refraction which is identical or very close to that of substrate 800. This may be achieved by one or more conventional techniques, such as photolithography and thermal reflow, photolithography using of a grey scale mask, and jet printing.

Figure 18C:
Figure 18D:
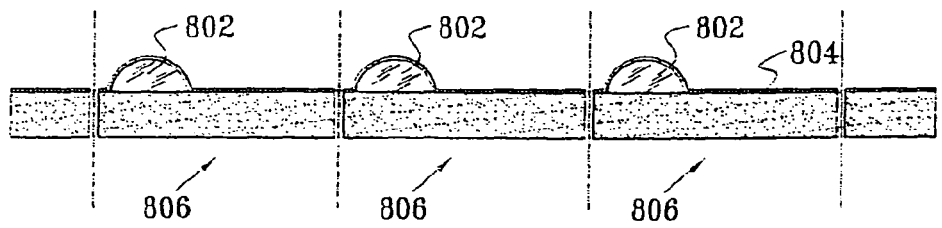

A thin metal layer 804, typically aluminum, is formed over the substrate 800 and microlense 802 as seen in FIG. 18C, typically by evaporation or sputtering. The substrate 800 and the metal layer 804 formed thereon are then diced by conventional techniques, as shown in FIG. 18D, thereby defining individual optical elements 806, each including a curved portion defined by a microlens 802.

Figure 19A:
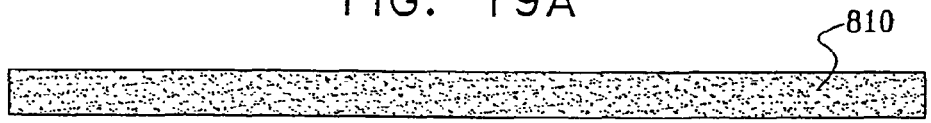
FIGS. 19A, 19B, 19C, 19D and 19E are simplified illustrations of a method for fabricating optical elements employed in the embodiments of FIGS. 1A-6C in accordance with another embodiment of the present invention.
Figure 19B:
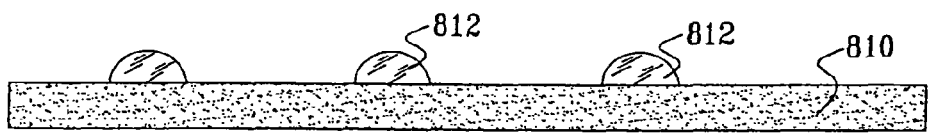

Reference is now made to FIGS. 19A, 19B, 19C, 19D and 19E, which are simplified illustrations of a method for fabricating optical elements employed in the embodiments of FIGS. 1A-6C in accordance with another embodiment of the present invention. A glass substrate 810, typically of thickness 200-400 microns, seen in FIG. 19A, has formed thereon an array of microlenses 812, typically formed of photoresist, as seen in FIG. 19B. The microlenses 812 preferably have an index of refraction which is identical or very close to that of substrate 810. This may be achieved by one or more conventional techniques, such as photolithography and thermal reflow, photolithography using of a grey scale mask, and jet printing.

Figure 19C:
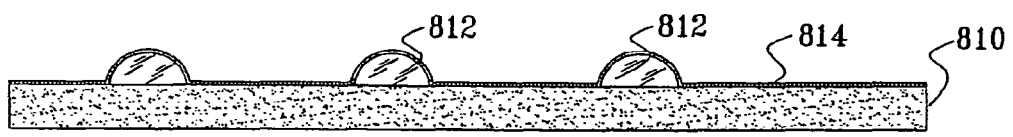
Figure 19D:
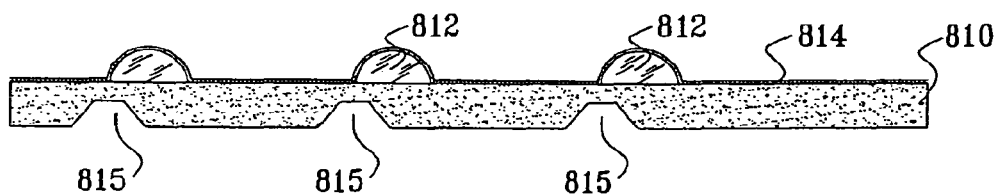

A thin metal layer 814, typically aluminum, is formed over the substrate 810 and microlenses 812 as seen in FIG. 19C, typically by evaporation or sputtering. The substrate 810 is then notched from underneath by conventional techniques. As seen in FIG. 19D, notches 815 are preferably formed at locations partially underlying microlenses 812.

Figure 19E:
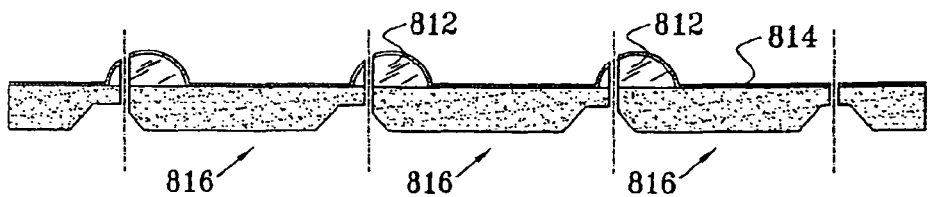

Following notching, the substrate 810, the microlenses 812 and the metal layer 814 formed thereon are diced by conventional techniques, as shown in FIG. 19E, thereby defining individual optical elements 816, each including a curved portion defined by part of a microlens 812.

Figure 20A:
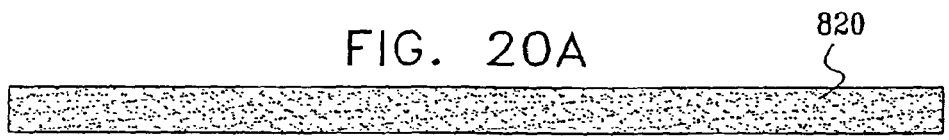
FIGS. 20A, 20B, 20C, 20D, 20E and 20F are simplified illustrations of a method for fabricating optical elements employed in the embodiments of FIGS. 9A-17C in accordance with yet another embodiment of the present invention.
Figure 20B:

Reference is now made to FIGS. 20A, 20B, 20C, 20D, 20E and 20F, which are simplified illustrations of a method for fabricating optical elements employed in the embodiments of FIGS. 9A-17C in accordance with yet another embodiment of the present invention. A glass substrate 820, typically of thickness 200-400 microns, seen in FIG. 20A, has formed thereon an array of microlenses 822, typically formed of photoresist, as seen in FIG. 20B. The microlenses 822 preferably have an index of refraction which is identical or very close to that of substrate 820. This may be achieved by one or more conventional techniques, such as photolithography and thermal reflow, photolithography using of a grey scale mask, and jet printing.

Figure 20C:
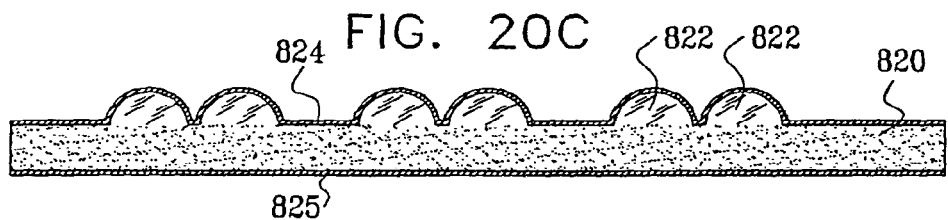
Figure 20D:
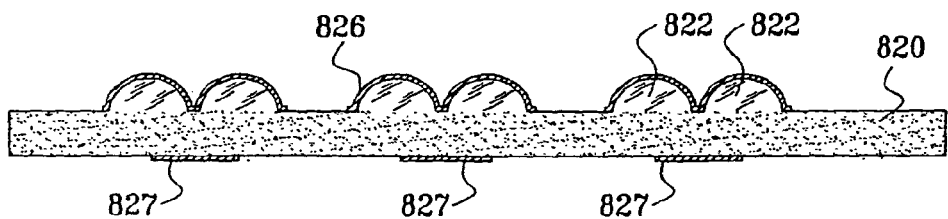

A thin metal layer 824, typically aluminum, is formed over the substrate 820 and microlenses 822 as seen in FIG. 20C, typically by evaporation or sputtering. An additional metal layer 825, typically aluminum, is similarly formed on an opposite surface of substrate 820. Metal layers 824 and 825 are patterned typically by conventional photolithographic techniques to define respective reflective surfaces 826 and 827 as seen in FIG. 20D.

Figure 20E:
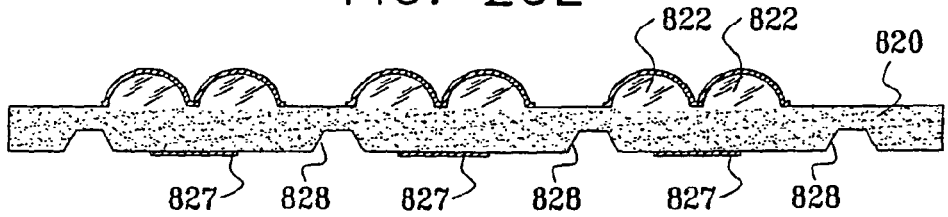
Figure 20F:
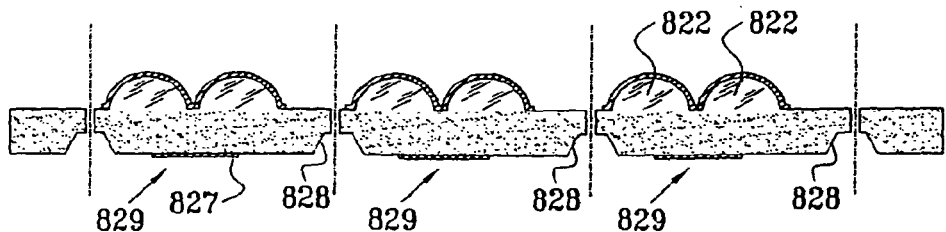

The substrate 820 is notched from underneath by conventional techniques. As seen in FIG. 20E, notches 828 need not be at locations partially microlenses 822. Following notching, the substrate 820 is diced by conventional techniques, as shown in FIG. 20F, thereby defining individual optical elements 829, each including a curved reflective portion defined by a pair of microlenses 822 as well as a flat reflective surface 829.

Figure 21A:
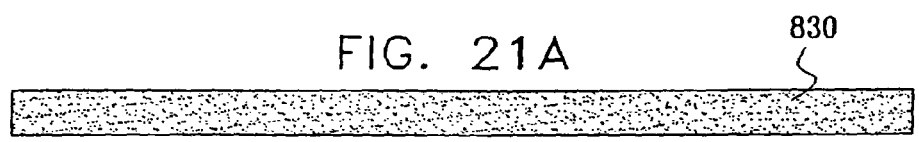
FIGS. 21A, 21B, 21C, 21D, 21E and 21F are simplified illustrations of a method for fabricating optical elements employed in the embodiments of FIGS. 1A-17C in accordance with still another embodiment of the present invention.
Figure 21B:

Reference is now made to FIGS. 21A, 21B, 21C, 21D, 21E and 21F which are simplified illustrations of a method for fabricating optical elements employed in the embodiments of FIGS. 1A-17C in accordance with still another embodiment of the present invention. A glass substrate 830, typically of thickness 200-400 microns, seen in FIG. 21A, has formed thereon an array of pairs of microlenses 832, typically formed of photoresist, as seen in FIG. 21B. The microlenses 832 preferably have an index of refraction which is identical or very close to that of substrate 830. This may be achieved by one or more conventional techniques, such as photolithography and thermal reflow, photolithography using of a grey scale mask, and jet printing.

Figure 21C:
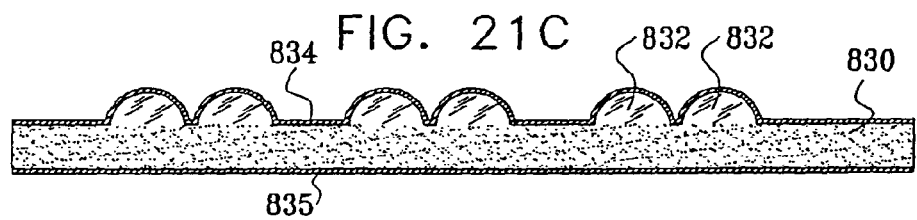
Figure 21D:
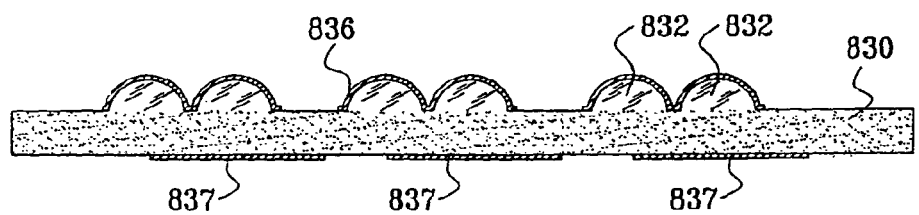

A thin metal layer 834, typically aluminum, is formed over the substrate 830 and pairs of microlenses 832 as seen in FIG. 21C, typically by evaporation or sputtering. An additional metal layer 835, typically aluminum, is similarly formed on an opposite surface of substrate 830. Metal layers 834 and 835 are patterned, typically by conventional photolithographic techniques, to define respective reflective surfaces 836 and 837 as seen in FIG. 21D.

Figure 21E:
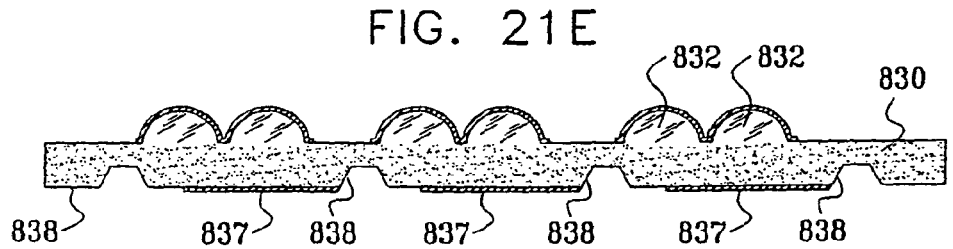
Figure 21F:
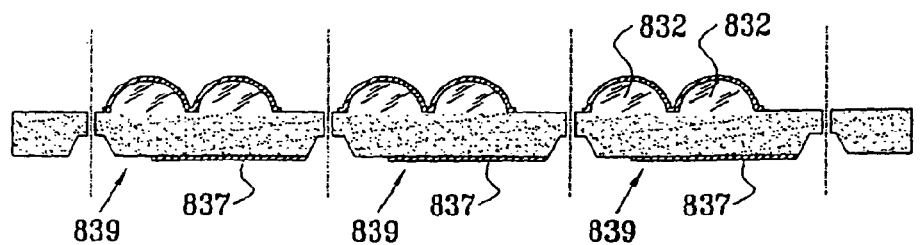

The substrate 830 is notched from underneath by conventional techniques, defining, notches 838, as seen in FIG. 21E. Following notching, the substrate 830 is diced by conventional techniques, as shown in FIG. 21F, thereby defining individual optical elements 839, each including a curved reflective portion defined by a pair of microlenses 823 as well as a flat reflective surface 837.

Reference is now made to FIGS. 22A, 22B, 22C, 22D, 22E, 22F and 22G, which are simplified illustrations of a method for fabricating optical elements employed in the embodiments of FIGS. 1A-8C in accordance with a further embodiment of the present invention. A glass substrate 840, typically of thickness 200-400 microns, seen in FIG. 2A, has formed in an underside surface thereof an array of reflective diffraction by ratings 841, as seen in FIG. 22B, typically by etching. Alternatively, the gratings 841 may be informed on the surface of the substrate 840, typically by lithography or transfer. An array of pairs of microlenses 842, typically formed of photoresist, is formed on an opposite surface of substrate 840, as seen in FIG. 22C. The microlenses 842 preferably have an index of refraction which is identical or very close to that of substrate 840. This may be achieved by one or more conventional techniques, such as photolithography and thermal reflow, photolithography using of a grey scale mask, and jet printing.

A thin metal layer 844, typically aluminum, is formed over the substrate 840 and pairs of microlenses 842 as seen in FIG. 22D, typically by evaporation or sputtering. Metal layer 844 is preferably patterned, typically by conventional photolithographic techniques, to define a reflective surface 846, as seen in FIG. 22E.

The substrate 840 is notched from underneath by conventional techniques, defining, notches 848, as seen in FIG. 22F. Following notching, the substrate 840 is diced by conventional techniques, as shown in FIG. 22G, thereby defining, individual optical elements 849, each including a curved reflective portion defined by a pair of microlenses 842 as well as a flat reflective grating 841.

Figure 23A:
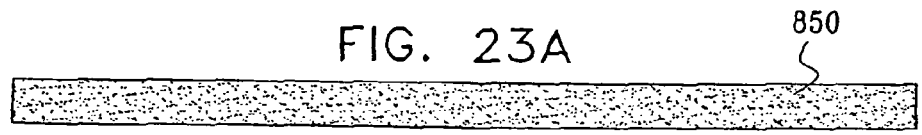
FIGS. 23A, 23B, 23C, 23D, 23E, 23F and 23G are simplified illustrations of a method for fabricating optical elements employed in the embodiments of FIGS. 9A-17C in accordance with yet a further embodiment of the present invention.
Figure 23B:
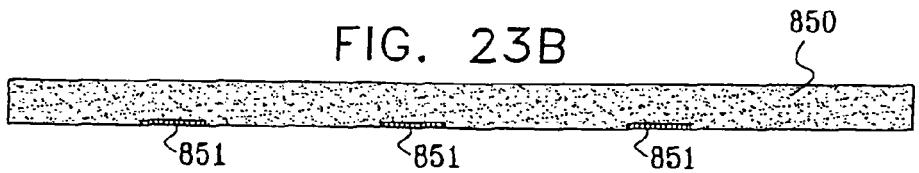
Figure 23C:
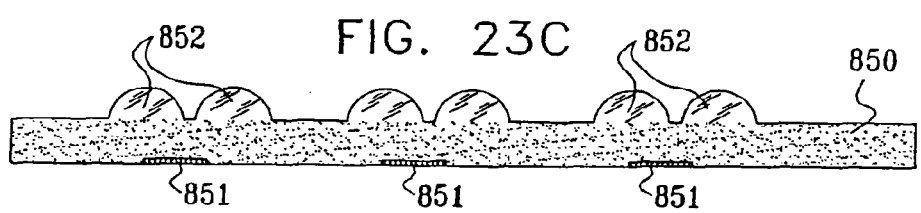

Reference is now made to FIGS. 23A, 23B, 23C, 23D, 23E, 23F and 23G, which are simplified illustrations of a method for fabricating optical elements employed in the embodiments of FIGS. 9A-17C in accordance with yet a further embodiment of the present invention. A glass substrate 850, typically of thickness 200-400 microns, seen in FIG. 23A, has formed in an underside surface thereof an array of reflective diffraction gratings 851, as seen in FIG. 23B, typically by etching. Alternatively, the gratings 851 may be formed on the surface of the substrate 850, typically by lithography or transfer. An array of pairs of microlenses 852, typically formed of photoresist, is formed on an opposite surface of substrate 850, as seen in FIG. 23C. The microlenses 852 preferably have an index of refraction which is identical or very close to that of substrate 850. This may be achieved by one or more conventional techniques, such as photolithography and thermal reflow, photolithography using of a grey scale mask, and jet printing.

Figure 23D:
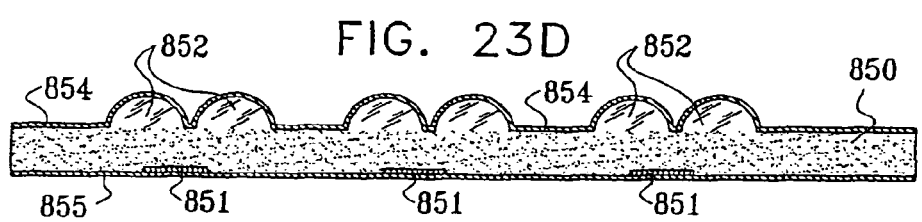
Figure 23E:
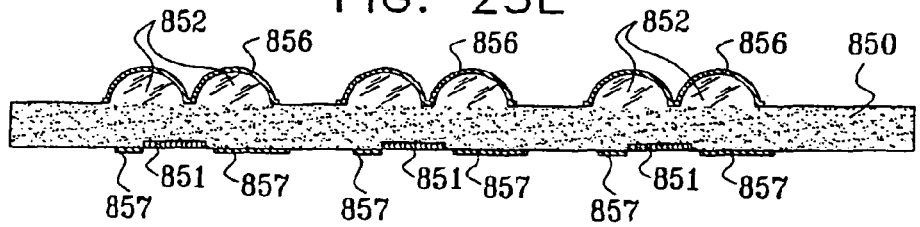

A thin metal layer 854, typically aluminum, is formed over the substrate 850 and pairs of microlenses 852 as seen in FIG. 23D, typically by evaporation or sputtering. An additional metal layer 855 is similarly formed on an opposite surface of the substrate 850. Metal layers 854 and 855 are preferably patterned, typically by conventional photolithographic techniques, to define respective reflective surfaces 856 and 857, as seen in FIG. 23E.

Figure 23F:
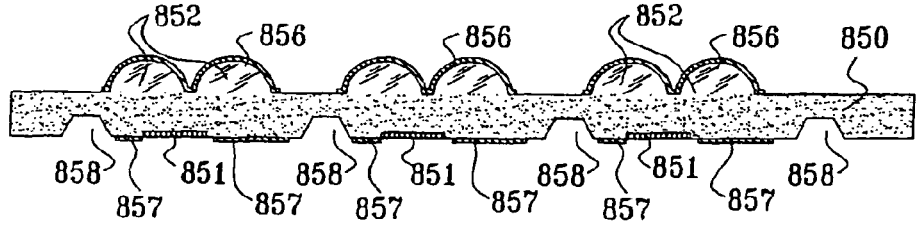
Figure 23G:
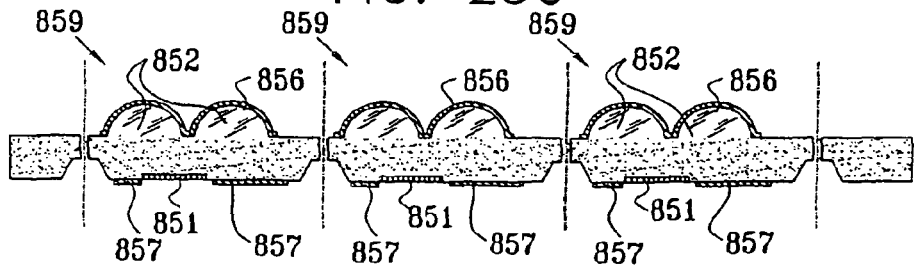

The substrate 850 is notched from underneath by conventional techniques, defining notches 858, as seen in FIG. 23F. Following notching, the substrate 850 is diced by conventional techniques, as shown in FIG. 23G, thereby defining, individual optical elements 859, each including a curved reflective portion defined by a pair of microlenses 852 as well as a flat reflective grating 851 and flat reflective surfaces 857.

Reference is now made to FIGS. 24A, 24B, 24C, 24D, 24E, 24F and 24G, which are simplified illustrations of a method for fabricating optical elements employed in the embodiments of FIGS. 1A-17C in accordance with a still further embodiment of the present invention. A glass substrate 860, typically of thickness 200-400 microns, seen in FIG. 24A, has formed therein an array of reflective diffraction gratings 861, as seen in FIG. 24B, typically by etching. Alternatively, the gratings 861 may be formed on the surface of the substrate 860, typically by lithography or transfer. An array of microlenses 862, typically formed of photoresist, is formed on the same surface of substrate 860, as seen in FIG. 24C. The microlenses 862 preferably have an index of refraction which is identical or very close to that of substrate 860. This may be achieved by one or more conventional techniques, such as photolithography and thermal reflow, photolithography using, of a grey scale mask, and jet printing.

A thin metal layer 864, typically aluminum, is formed over the substrate 860 and microlenses 862 as seen in FIG. 24D, typically by evaporation or sputtering. An additional metal layer 865 is similarly formed on an opposite surface of the substrate 860. Metal layers 864 and 865 are preferably patterned, typically by conventional photolithographic techniques, to define respective reflective surfaces 866 and 867, as seen in FIG. 24E.

The substrate 860 is notched from underneath by conventional techniques, defining notches 868, as seen in FIG. 24F. Following notching, the substrate 860 is diced by conventional techniques, as shown in FIG. 24G, thereby defining individual optical elements 869, each including a curved reflective surface 866 defined by a microlens 862 as well as a flat reflective grating 861 and a flat reflective surface 867.

Reference is now made to FIGS. 25A, 25B, 25C and 25D, which are simplified illustrations of multiple stages in the production of a multi-chip module in accordance with a preferred embodiment of the present invention. As seen in FIG. 25A, a substrate 900, typically formed of silicon and having a thickness of 300-800 microns, has formed thereon at least one dielectric passivation layer 902, at least one metal layer 904 and at least one overlying dielectric layer 906. The dielectric layers are preferably transparent to light preferably in both the visible and the infrared bands. Vias 908, connected to at least one metal layer 904, extend through layer 902 to the substrate 900.

As seen in FIG. 25B, an array of openings 910 is formed by removing portions of substrate 900 at a location underlying vias 908. Preferably, the entire thickness of the substrate 900 is removed. The removal of substrate 900 may be achieved by using conventional etching techniques and, preferably, provides a volume of dimensions of at least 600 microns in width.

As seen in FIG. 25C, metallic bumps 912, preferably solder bumps, are preferably formed onto the thus exposed surfaces of vias 908. As seen in FIG. 25D, integrated circuit chips 914 are preferably located in openings 910 and operatively engaged with vias 908 by being soldered to bumps 912, thus creating a multi-chip module, wherein integrated circuit chips 914 reside within the substrate of the module.

Figure 26:
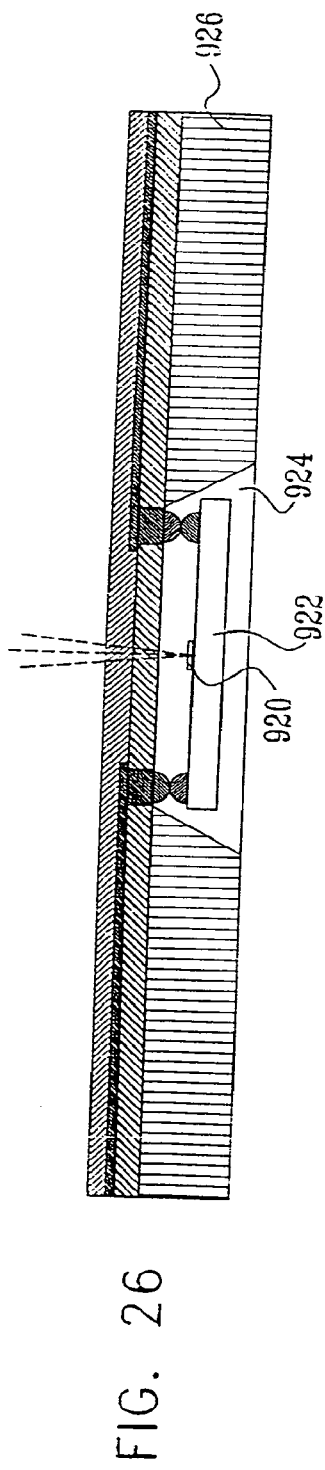
FIG. 26 is a simplified illustration of a multi-chip module of the type referenced in FIGS. 25A-25D, including a laser light source.

Reference is now made FIG. 26, which is a simplified illustration of a multi-chip module of the type referenced in FIGS. 25A-25D, including a laser light source 920 formed on an integrated circuit chip 922, located in an opening 924 formed in a module substrate 926.

Figure 27:
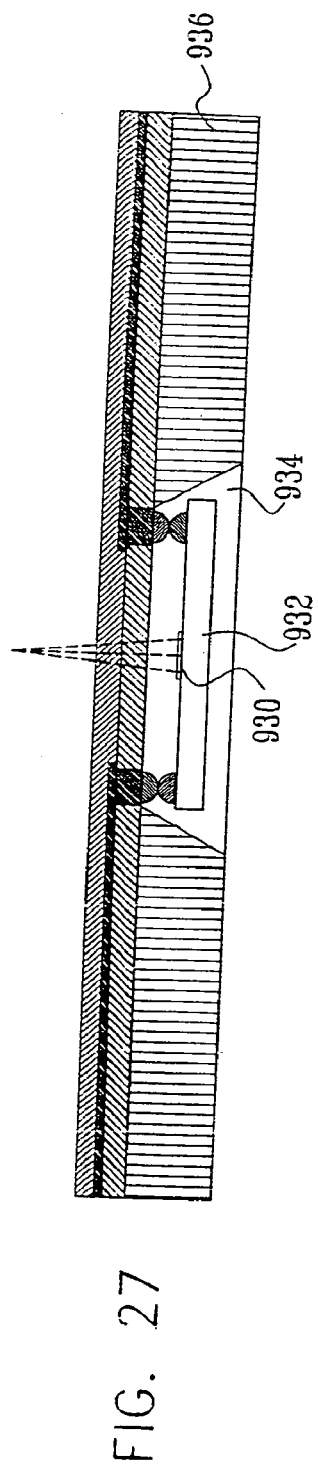
FIG. 27 is a simplified illustration of a multi-chip module of the type referenced in FIGS. 25A-25D, including an optical detector.

Reference is now made to FIG. 27, which is a simplified illustration of a multi-chip module of the type referenced in FIGS. 25A-25D, including an optical detector 930 formed on an integrated circuit chip 932, located in an opening 934 formed in a nodule substrate 936.

Figure 28:
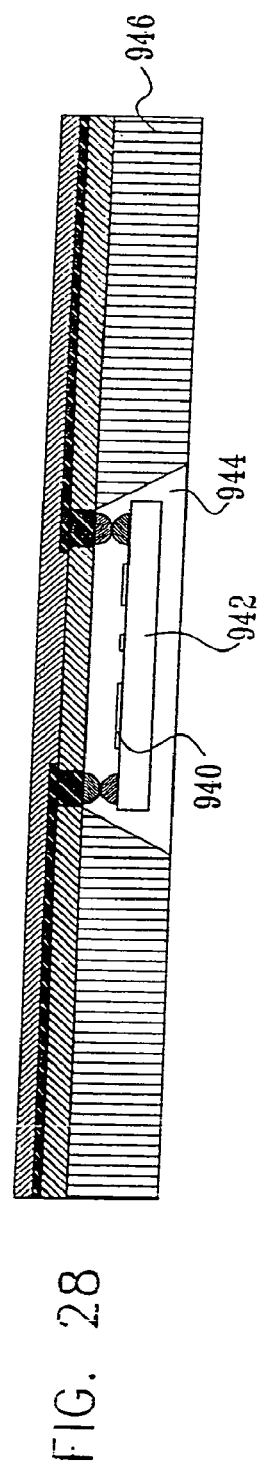
FIG. 28 is a simplified illustration of a multi-chip module of the type referenced in FIGS. 25A-25D, including an electrical element.

Reference is now made to FIG. 28, which is a simplified illustration of a multi-chip module of the type referenced in FIGS. 25A-25D, including an electrical element 940 formed on an integrated circuit chip 942 located in an opening 944 formed in a module substrate 946.

Reference is now made to FIG. 29, which is a simplified illustration of a multi-chip module of the type referenced in FIGS. 25A-25D, including multiple elements 950 located in multiple recesses 952 formed within a substrate 954. These elements may by any suitable electrical or electro-optic element.

Reference is now made to FIG. 30, which is a simplified illustration of a multi-chip module of the type referenced in FIGS. 25A-25D, including multiple stacked elements located in recesses formed within substrates. As seen in FIG. 30, a substrate 1000, typically formed of silicon and having a thickness of 500-1000 microns, has formed thereon at least one dielectric passivation layer 1002, at least one metal layer 1004 and at least one overlying dielectric layer 1006. The dielectric layers are preferably transparent to light preferably in both the visible and the infrared bands. Vias 1008, connected to at least one metal layer 1004 extend through layer 1002 to the substrate 1000. At least one opening 1010 is formed by removing a portion of substrate 1000 at a location underlying vias 1008. Preferably, the entire thickness of substrate 1000 is removed. The removal of substrate 1000 may be achieved by using conventional etching techniques and provides a volume of dimensions of at least 1000 microns in width. Metallic bumps 1012, preferably solder bumps, are preferably formed onto the thus exposed surfaces of vias 1008.

Disposed within opening 1010 is a substrate 1020, typically formed of silicon and having a thickness of 300-800 microns, having formed thereon at least one dielectric passivation layer 1022, at least one metal layer 1024 and at least one overlying dielectric layer 1026. The dielectric layers are preferably transparent to light preferably in both the visible and the infrared bands. Vias 1028, connected to at least one metal layer 1024, extend through layer 1022 to the substrate 1020. At least one opening 1030 is formed by removing portions of substrate 1020 at a location underlying vias 1028. Preferably, the entire thickness of substrate 1020 is removed. The removal of substrate 1020 may be achieved by using conventional etching techniques and provides a volume of dimensions of at least 600 microns in width. Metallic bumps 1032, preferably solder bumps, are preferably formed onto the thus exposed surfaces of vias 1028. Additional metallic bumps 1034, preferably solder bumps, are preferably formed onto ends of vias 1036 which are preferably connected to at least one metal layer 1024, which need not necessarily be connected to bumps 1032. Bumps 1012 and 1034 are preferably soldered together to mount substrate 1020 within substrate 1000.

An integrated circuit chip 1040 is preferably located in opening 1030 and operatively engaged with vias 1028 by being soldered to bumps 1032, thus creating a multi-chip module, wherein at least one integrated circuit chip 1040 resides within substrate 1020, which in turn resides within substrate 1000.

It is appreciated that any suitable number of substrates, such as substrates 1000 and 1020, may be nested within each other, as shown in FIG. 30, and that each such substrate may have multiple openings formed therein.

Figure 31A:
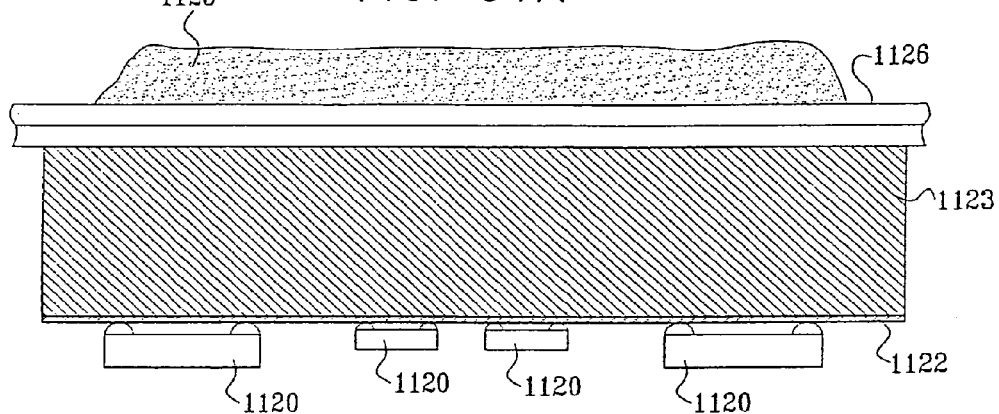
FIGS. 31A, 31B, 31C and 31D are simplified sectional illustrations of stages in the production of an electro-optic integrated assembly in accordance with a preferred embodiment of the present invention.

Reference is now made to FIGS. 31A, 31B, 31C and 31D, which are simplified sectional illustrations of stages in the production of an electro-optic integrated assembly in accordance with a preferred embodiment of the present invention. In the embodiment of FIG. 31A, similarly to FIG. 2A described hereinabove, electro-optic components 1120, such as diode lasers, are mounted onto an electrical circuit (not shown), included within a planarized layer 1122 formed onto a substrate 1123. It is appreciated that electro-optic components 1120 may be any suitable electro-optic component, such as a laser diode, diode detector, waveguide, array waveguide grating or a semiconductor optical amplifier.

Figure 31B:
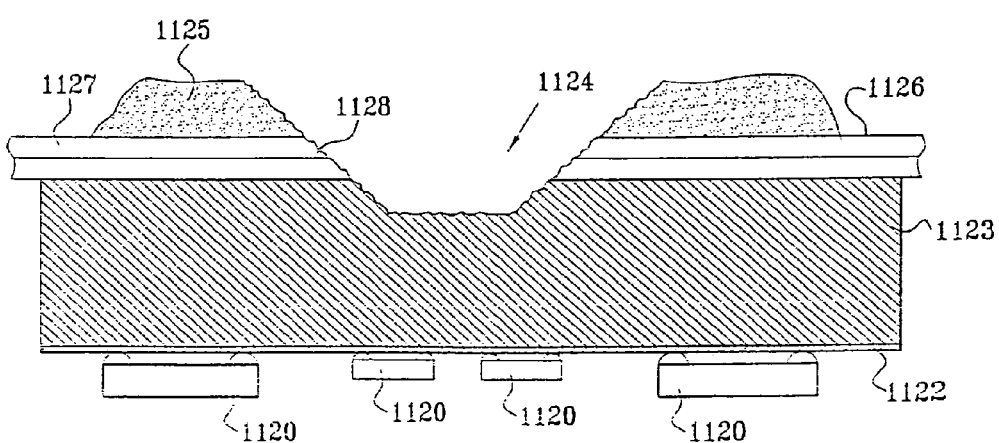

As shown in FIG. 31B, a transverse notch 1124 is preferably formed, at least partially overlapping the locations of the electro-optic components 1120 and extending through an adhesive 1125 and partially through each of a plurality of optical fibers 1126. Specifically, in this embodiment, the notch 1124 extends entirely through the cladding 1127 of each fiber 1126 and entirely through the core 1128 of each fiber. It is appreciated that the surfaces defined by the notch 1124 are relatively rough, as shown.

Figure 31C:
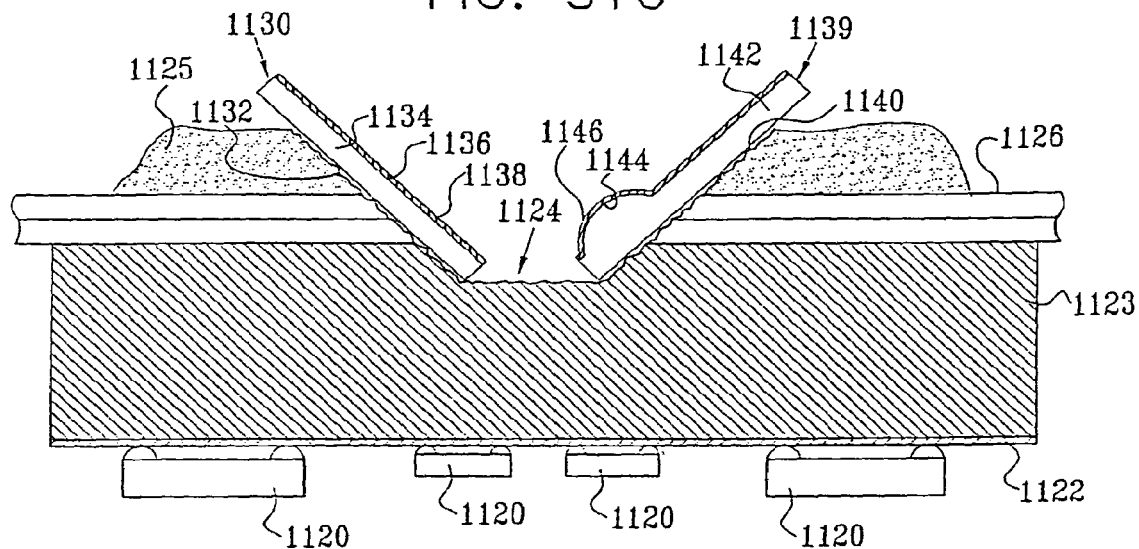

Turning now to FIG. 31C, it is seen that a mirror 1130, typically of the type illustrated in FIGS. 2C and 3, is preferably mounted parallel to one of the rough inclined surfaces 1132 defined by notch 1124. Mirror 1130 preferably comprises a glass substrate 1134 having formed on a surface 1136 thereof, a metallic layer or a dichroic filter layer 1138. A partially flat and partially concave mirror 1139, typically similar to the type illustrated in FIGS. 5C and 6A, is preferably mounted parallel to an opposite one of the rough inclined surfaces, here designated 1140. Mirror 1139 preferably comprises a class substrate 1142 having formed thereon a curved portion 1144 over which is formed a curved metallic layer or a dichroic filter layer 1146.

Figure 31D:
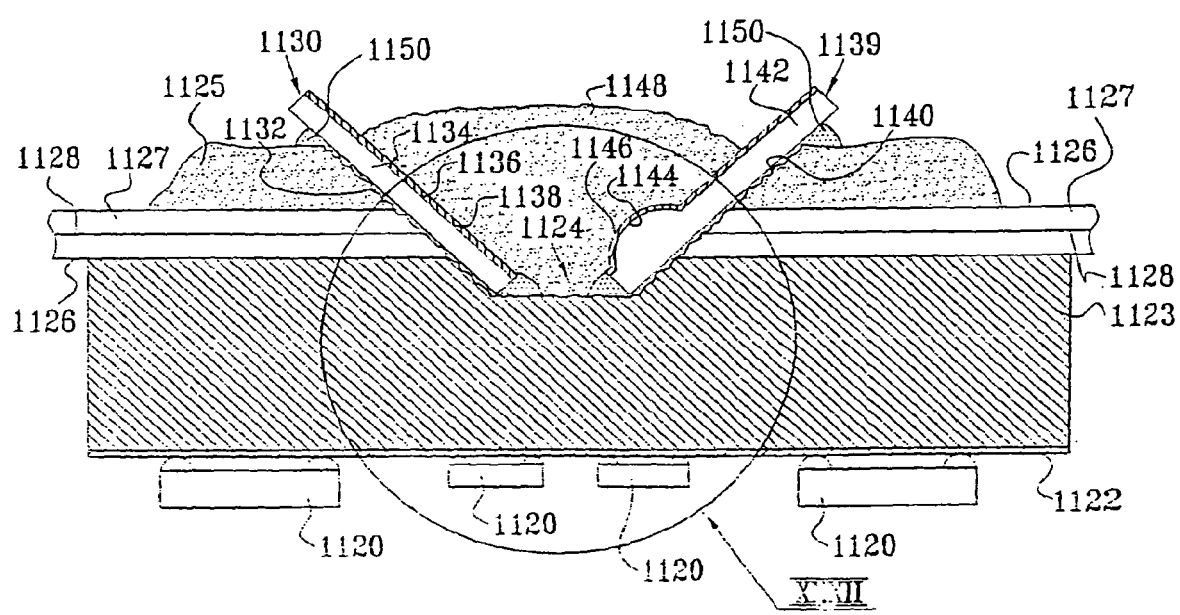

As seen in FIG. 31D, the mirrors 1130 and 1139 are securely held in place by any suitable adhesive 1148, such as epoxy, and partially by an optical adhesive 1150, such as OG 146, manufactured by Epoxy Technology, 14 Fortune Drive, Billerica, Mass. 01821, USA, whose refractive index preferably is precisely matched to that of the cores 1128 of the optical fibers 1126. The adhesive 1150 preferably fills the interstices between the roughened surfaces 1132 and 1140 defined by notch 1124 and respective mirrors 1130 and 1139. It is appreciated that optical adhesive 1150 may be employed throughout instead of adhesive 1148. It is noted that the index of refraction of adhesive 1150 is close to but not identical to that of substrates 1123, 1134 and 1142.

Figure 32:
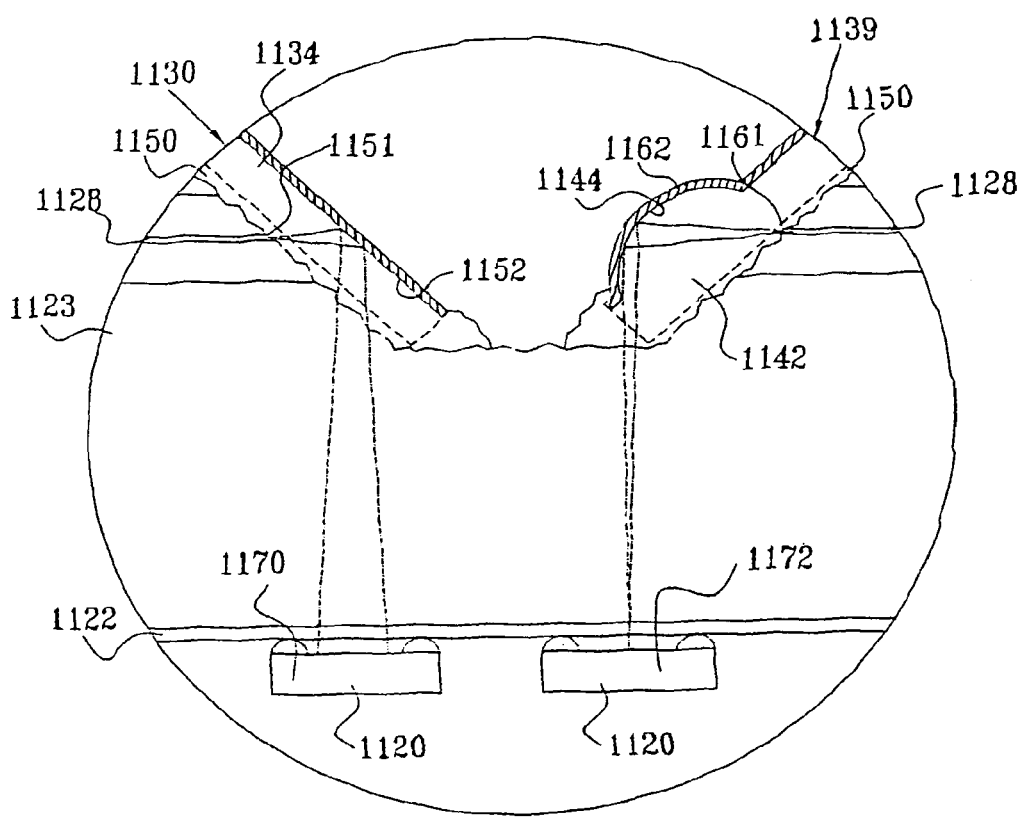
FIG. 32 is an enlarged simplified optical illustration of a portion of FIG. 31D.

Reference is now made to FIG. 32, which is an enlarged simplified optical illustration of a portion of FIG. 31D. Here it is seen that a generally uninterrupted optical path is defined for light, preferably in the wavelength range of 600-1650 nm, from an end 1151 of a core 1128, through adhesive 1150 and glass substrate 1134 to a reflective surface 1152 of mirror 1130 and thence through glass substrate 1134, adhesive 1150, substrate 1123 and layer 1122, which are substantially transparent to this light. Similarly, a generally uninterrupted optical path is defined for light, preferably in the wavelength range of 600-1650 nm, from an end 1161 of core 1128, through adhesive 1150 glass substrate 1142 and curved portion 1144 to a reflective surface 1162 of mirror 1139 and thence through curved portion 1144, glass substrate 1142, adhesive 1150, substrate 1123 and layer 1122, which are substantially transparent to this light.

It is noted that mirror 1130 typically reflects light onto an electro-optic component 1120, here designated 1170, without focusing or collimating the light, while mirror 1139 focuses light reflected thereby onto another electro-optic component 1120, here designated 1172. It is appreciated that any suitable combination of mirrors having any suitable optical properties, such as collimating and focusing, may alternatively be employed.

Figure 33A:
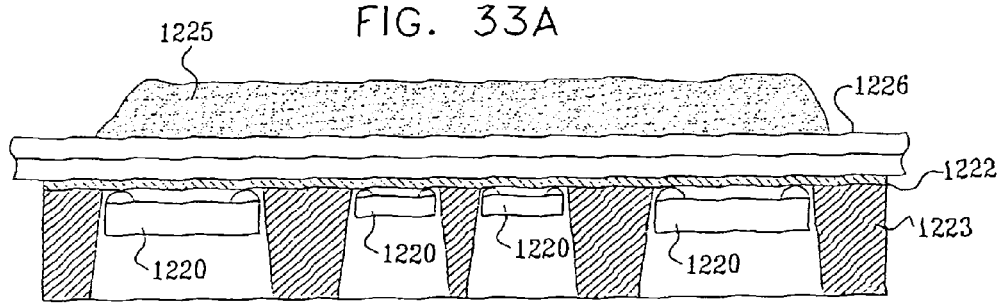
FIGS. 33A, 33B, 33C and 33D are simplified sectional illustrations of stages in the production of an electro-optic integrated assembly in accordance with another preferred embodiment of the present invention.

Reference is now made to FIGS. 33A, 33B, 33C and 33D, which are simplified sectional illustrations of stages in the production of an electro-optic integrated assembly in accordance with another preferred embodiment of the present invention. In the embodiment of FIG. 33A, similarly to FIG. 31A described hereinabove, electro-optic components 1220, such as diode lasers, are mounted onto an electrical circuit (not shown), included within a planarized layer 1222 formed onto a substrate 1223. It is appreciated that electro-optic components 1220 may be any suitable electro-optic component, such as a laser diode, diode detector, waveguide, array waveguide grating or a semiconductor optical amplifier. In contrast to the embodiment of FIG. 31A, here the electro-optic components 1220 are located in openings or recesses formed within the substrate 1223, similarly to the structure shown in FIG. 29.

Figure 33B:
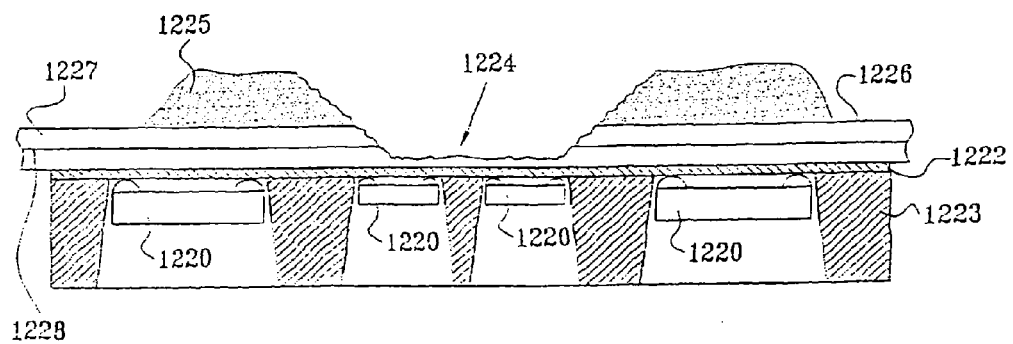

As shown in FIG. 33B, a transverse notch 1224 is preferably formed, at least partially overlapping the locations of at least one of the electro-optic components 1220 and extending through an adhesive 1225 and partially through each of a plurality of optical fibers 1226. Specifically, in this embodiment, the notch 1224 extends through part of the cladding 1227 of each fiber 1226 and entirely through the core 1228 of each fiber. It is appreciated that the surfaces defined by the notch 1224 are relatively rough, as shown.

Figure 33C:
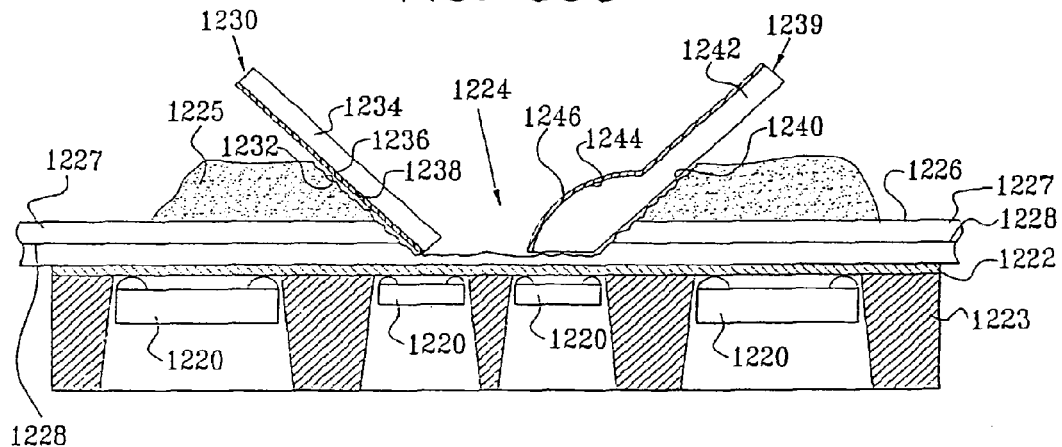

Turning now to FIG. 33C, it is seen that a mirror 1230, typically, similar to the type illustrated in FIGS. 2C and 3, is preferably mounted parallel to one of the rough inclined surfaces, here designated 1232, defined by notch 1224. Mirror 1230 preferably comprises a glass substrate 1234 having formed on a surface 1236 thereof, a metallic layer or a dichroic filter layer 1238. A partially flat and partially concave mirror 1239, typically similar to the type illustrated in FIGS. 5C and 6A, is preferably mounted parallel to an opposite one of the rough inclined surfaces, here designated 1240. Mirror 1239 preferably comprises a glass substrate 1242 having formed thereon a curved portion 1244 over which is formed a curved metallic layer or a dichroic filter layer 1246.

Figure 33D:
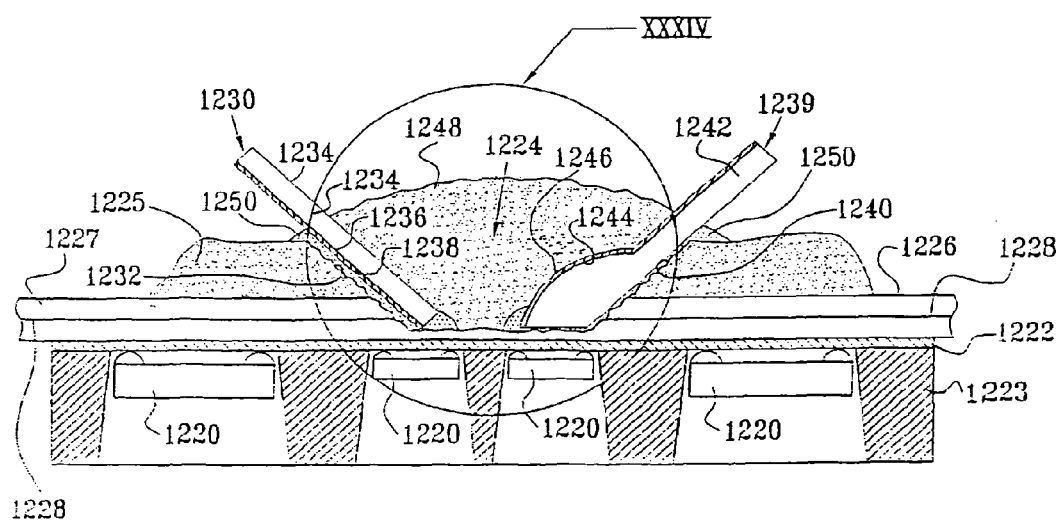

As seen in FIG. 33D, the mirrors 1230 and 1239 are securely held in place partially by any suitable adhesive 1248, such as epoxy, and partially by an optical adhesive 1250, such as OG 146, manufactured by Epoxy Technology, 14 Fortune Drive, Billerica, Mass. 01821, USA, whose refractive index preferably is precisely matched to that of the cores 1228 of the optical fibers 1226. The adhesive 1250 preferably fills the interstices between the roughened surfaces 1232 and 1240 defined by notch 1224 and respective mirrors 1230 and 1239. It is appreciated that optical adhesive 1250 may be employed throughout instead of adhesive 1248. It is noted that the index of refraction of adhesive 1250 is close to but not identical to that of cladding 1227, substrate 1242 and curved portion 1244.

Figure 34:
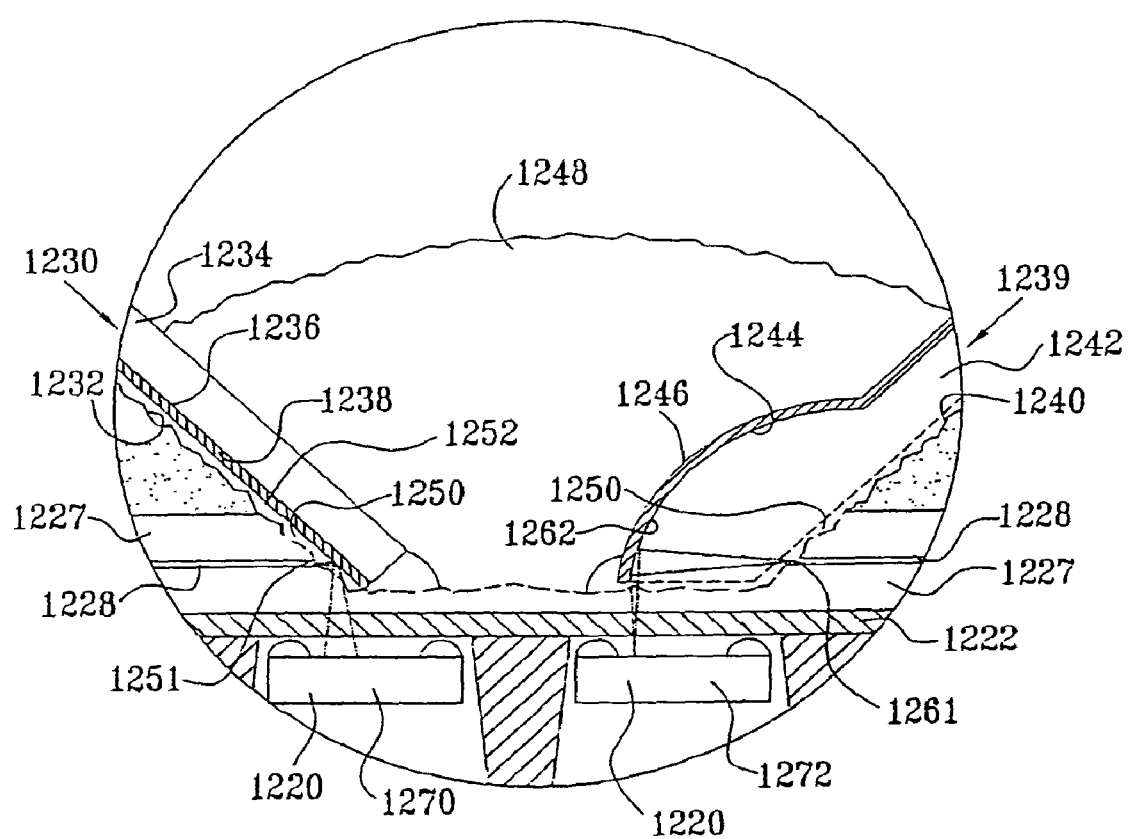
FIG. 34 is an enlarged simplified optical illustration of a portion of FIG. 33D.

Reference is now made to FIG. 34, which is an enlarged simplified optical illustration of a portion of FIG. 33D. Here it is seen that a generally uninterrupted optical path is defined for light, preferably in the wavelength range of 600-1650 nm, from an end 1251 of a core 1228, through adhesive 1250 to a reflective surface 1252 of mirror 1230 and thence through adhesive 1250 and cladding 1227, and then through layer 1222, which is substantially transparent to this light. Similarly, a generally uninterrupted optical path is defined for light, preferably in the wavelength range of 600-1650 nm, from an end 1261 of core 1228, through adhesive 1250, substrate 1242 and curved portion 1244, to a reflective surface 1262 of mirror 1239 and thence through curved portion 1244, adhesive 1250 and cladding 1227, and then through layer 1222, which is substantially transparent to this light.

It is noted that mirror 1230 typically reflects light onto an electro-optic component 1220, here designated 1270, without focusing or collimating the light, while mirror 1239 focuses light reflected thereby onto another electro-optic component 1220, here designated 1272. It is appreciated that any suitable combination of mirrors having any suitable optical properties, such as collimating and focusing, may alternatively be employed.

Figure 35A:
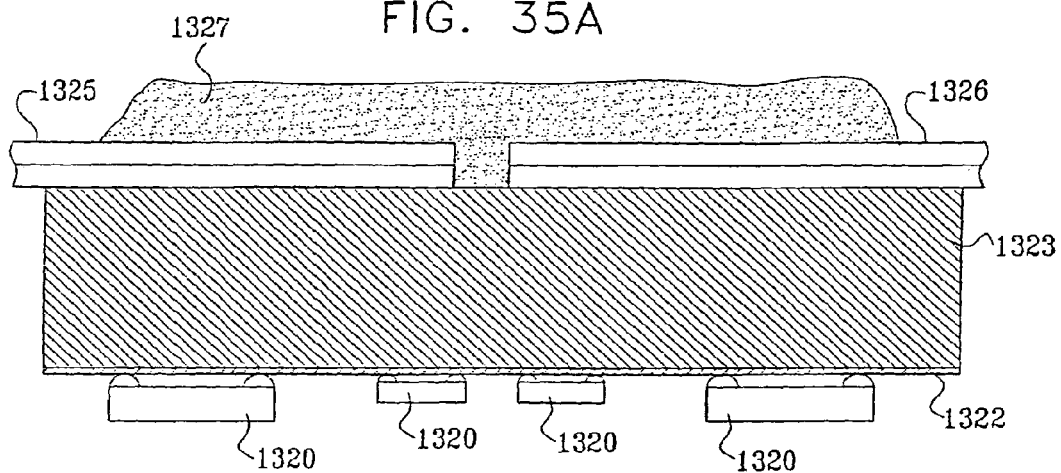

Reference is now made to FIGS. 35A, 35B, 35C and 35D, which are simplified sectional illustrations of stages in the production of an electro-optic integrated assembly in accordance with a preferred embodiment of the present invention. In the embodiment of FIG. 35A, similarly to FIG. 31A described hereinabove, electro-optic components 1320, such as diode lasers, are mounted onto an electrical circuit (not shown), included within a planarized layer 1322 formed onto a substrate 1323. It is appreciated that electro-optic components 1320 may be any suitable electro-optic component, such as a laser diode, diode detector, waveguide, array waveguide grating or a semiconductor optical amplifier. As distinct from the embodiment of FIGS. 31A-32, here at least first and second separate fibers 1325 and 1326 are fixed to substrate 1323, preferably by an adhesive 1327. The fibers 1325 and 1326 may be identical, similar or different, and need not be arranged in a mutually aligned spatial relationship.

Figure 35B:
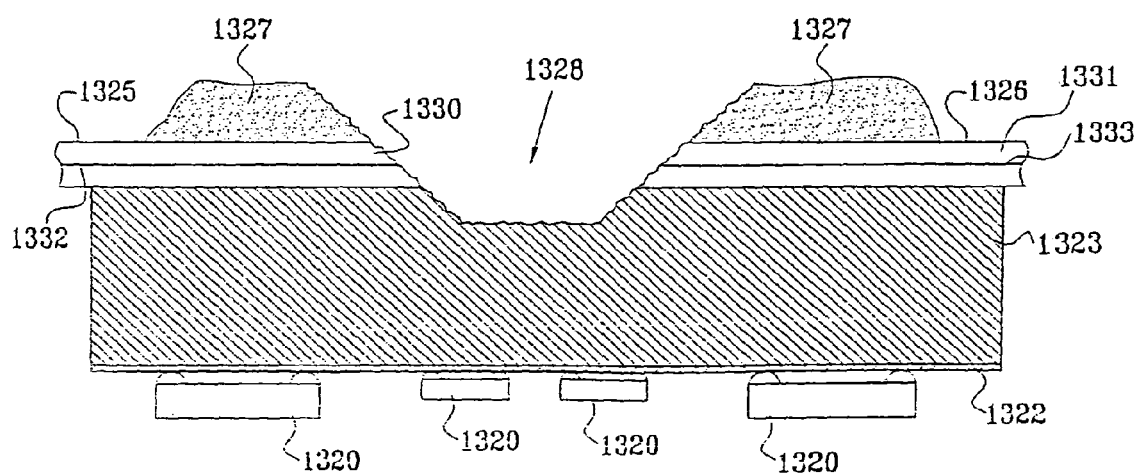

As shown in FIG. 35B, a transverse notch 1328 is preferably formed, at least partially overlapping the locations of the electro-optic components 1320 and extending through adhesive 1327 and partially through at least each of optical fibers 1325 and 1326. Specifically, in this embodiment, the notch 1328 extends entirely through of the cladding 1330 and 1331 and entirely through the cores 1332 and 1333 of fibers 1325 and 1326 respectively. It is appreciated that the surfaces defined by the notch 1328 are relatively rough, as shown.

Turning now to FIG. 35C, it is seen that a mirror 1334, typically of the type illustrated in FIGS. 2C and 3, is preferably mounted parallel to one of the rough inclined surfaces 1335 defined by notch 1328. Mirror 1334 preferably comprises a glass substrate 1336 having formed on a surface 1337 thereof, a metallic layer or a dichroic filter layer 1338. A partially flat and partially concave mirror 1339, typically similar to the type illustrated in FIGS. 5C and 6A, is preferably mounted parallel to an opposite one of the rough inclined surfaces, here designated 1340. Mirror 1339 preferably comprises a glass substrate 1342 having formed thereon a curved portion 1344 over which is formed a curved metallic layer or a dichroic filter layer 1346.

As seen in FIG. 35D, the mirrors 1334 and 1339 are securely held in place partially by any suitable adhesive 1348, such as epoxy, and partially by optical adhesive 1350, such as OG 146, manufactured by Epoxy Technology, 14 Fortune Drive, Billerica, Mass. 01821, USA, whose refractive indices preferably are precisely matched to those of the cores 1332 and 1333 of the optical fibers 1325 and 1326 respectively. The adhesive 1350 preferably fills the interstices between the roughened surfaces 1335 and 1340 defined by notch 1328 and respective mirrors 1334 and 1339. It is appreciated that optical adhesive 1350 may also be employed instead of adhesive 1348. It is noted that the index of refraction of adhesive 1350 is close to but not identical to that of substrates 1323, 1336 and 1342.

Figure 36:
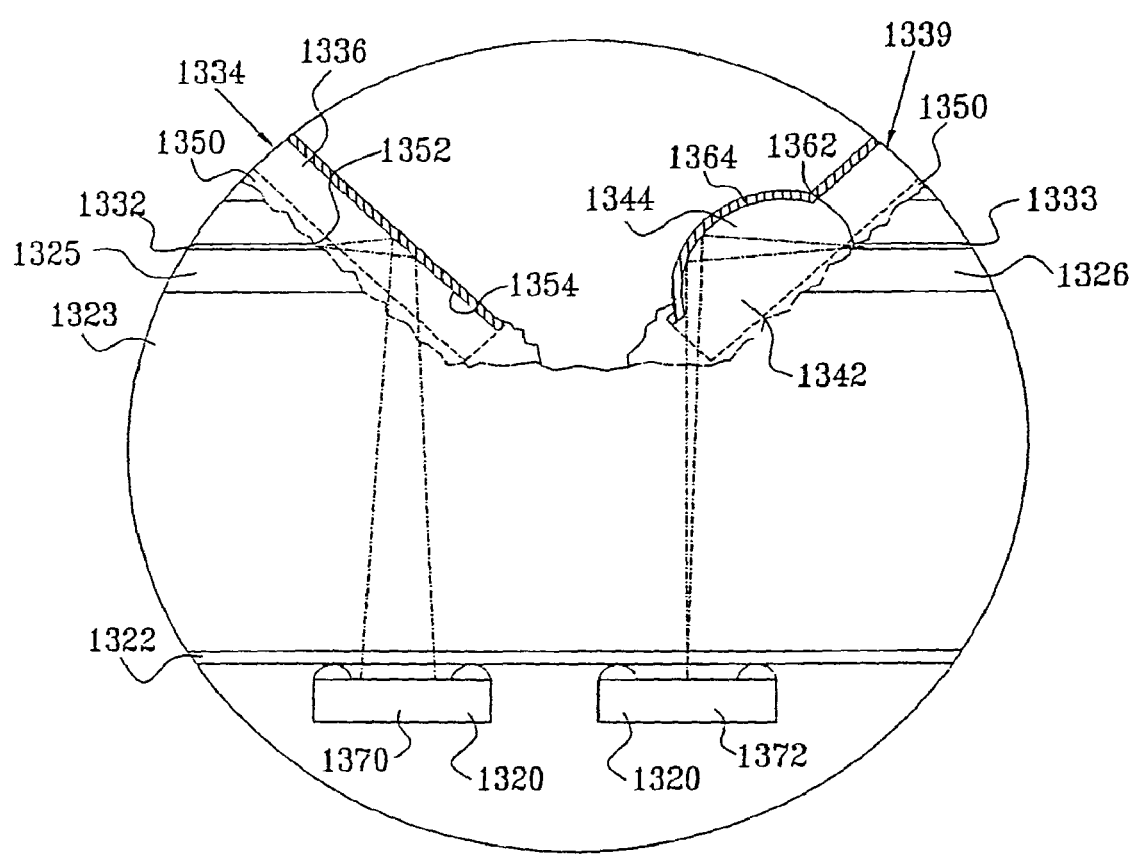
FIG. 36 is an enlarged simplified optical illustration of a portion of FIG. 35D.

Reference is now made to FIG. 36, which is an enlarged simplified optical illustration of a portion of FIG. 35D. Here it is seen that a generally uninterrupted optical path is defined for light, preferably in the wavelength range of 600-1650 nm, from an end 1352 of a core 1332 of a fiber 1325, through adhesive 1350 and substrate 1336 to a reflective surface 1354 of mirror 1334 and thence through substrate 1336, adhesive 1350, substrate 1323 and layer 1322, which are substantially transparent to this light. Similarly, a generally uninterrupted optical path is defined for light, preferably in the wavelength range of 600-1650 nm, from an end 1362 of core 1333 of fiber 1326, through adhesive 1350, substrate 1342 and curved portion 1344 to a reflective surface 1364 of mirror 1339 and thence through curved portion 1344, substrate 1342, adhesive 1350, substrate 1323 and layer 1322, which are substantially transparent to this light.

It is noted that mirror 1334 typically reflects light onto an electro-optic component 1320, here designated 1370, without focusing or collimating the light, while mirror 1339 focuses light reflected thereby onto another electro-optic component 1320, here designated 1372. It is appreciated that any suitable combination of mirrors having any suitable optical properties, such as collimating and focusing, may alternatively be employed.

Figure 37A:
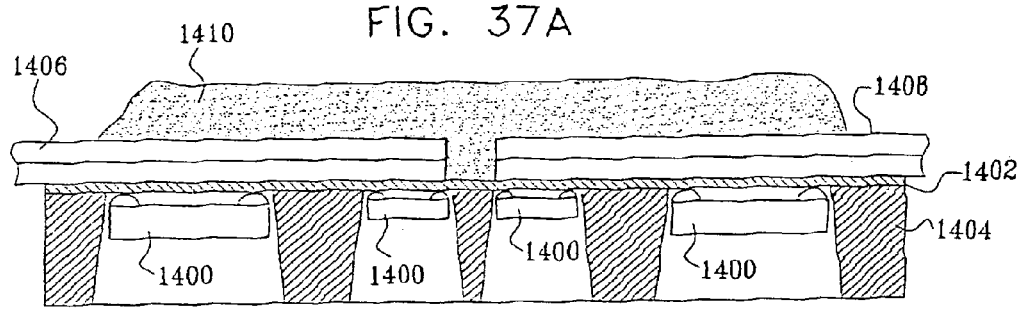
FIGS. 37A, 37B, 37C and 37D are simplified sectional illustrations of stages in the production of an electro-optic integrated assembly in accordance with another preferred embodiment of the present invention.

Reference is now made to FIGS. 37A, 37B, 37C and 37D, which are simplified sectional illustrations of stages in the production of an electro-optic integrated assembly in accordance with another preferred embodiment of the present invention. The embodiment of FIGS. 37A-37D is similar to the embodiments of FIGS. 33A-33D and 35A-35D, described hereinabove. As shown in FIG. 37A, electro-optic components 1400, such as diode lasers, are mounted onto an electrical circuit (not shown), included within a planarized layer 1402 formed onto a substrate 1404. It is appreciated that electro-optic components 1400 may be any suitable electro-optic component, such as a laser diode, diode detector, waveguide, array waveguide grating and a semiconductor optical amplifier. In contrast to the embodiment of FIG. 35A, here the electro-optic components 1400 are located in openings or recesses formed within the substrate 1404, similarly to the structure shown in FIG. 33A. As distinct from the embodiment of FIG. 33A, here at least first and second separate fibers 1406 and 1408 are fixed to substrate 1404, preferably by an adhesive 1410, similarly to the structure shown in FIG. 35A. The fibers 1406 and 1408 may be identical, similar or different and need not be arranged in a mutually aligned spatial relationship.

Figure 37B:
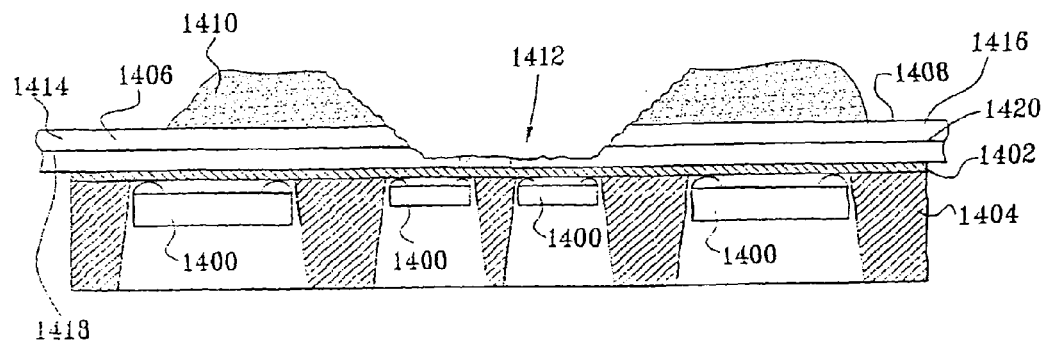

As shown in FIG. 37B, a transverse notch 1412 is preferably formed, at least partially overlapping the locations of at least one of the electro-optic components 1400 and extending through an adhesive 1410 and partially through each of a plurality of optical fibers 1406 and 1408. Specifically, in this embodiment, the notch 1412 extends through part of the claddings 1414 and 1416 and entirely through the cores 1418 and 1420 of fibers 1406 and 1408, respectively. It is appreciated that the surfaces defined by the notch 1412 are relatively rough, as shown.

Figure 37C:
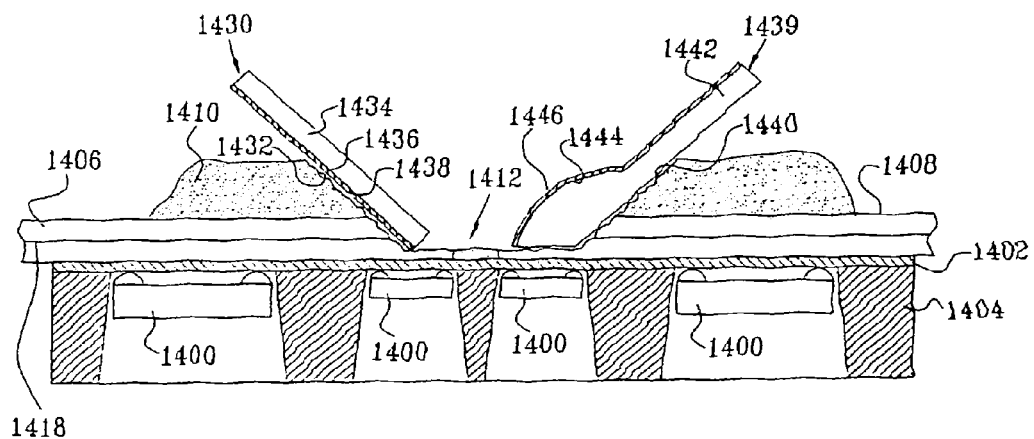

Turning now to FIG. 37C, it is seen that a mirror 1430, typically, similar to the type illustrated in FIGS. 2C and 3, is preferably mounted parallel to one of the rough inclined surfaces, here designated 1432, defined by notch 1412. Mirror 1430 preferably comprises a, lass substrate 1434 having formed on a surface 1436 thereof, a metallic layer or a dichroic filter layer 1438. A partially flat and partially concave mirror 1439, typically similar to the type illustrated in FIGS. 5C and 6A, is preferably mounted parallel to an opposite one of the rough inclined surfaces, here designated 1440. Mirror 1439 preferably comprises a glass substrate 1442 having formed thereon a curved portion 1444 over which is formed a curved metallic layer or a dichroic filter layer 1446.

Figure 37D:
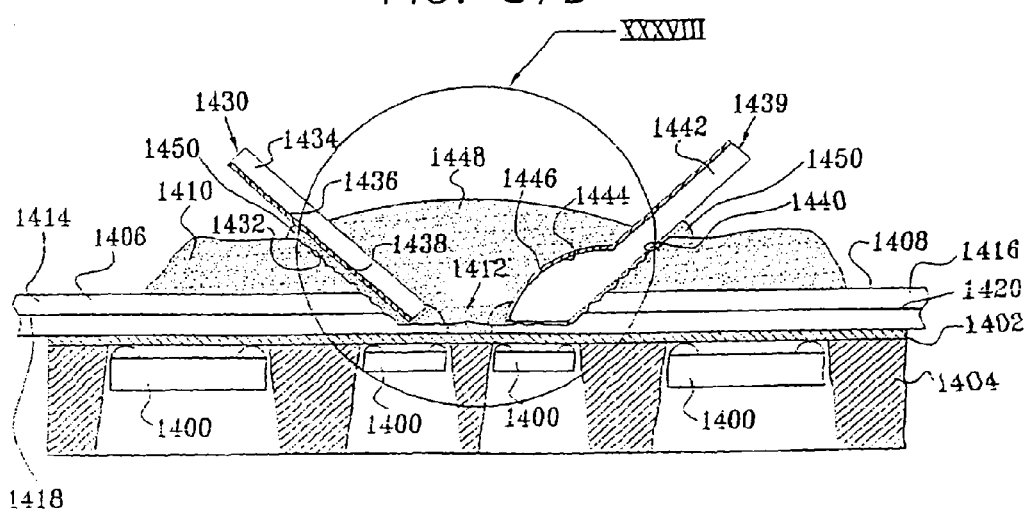

As seen in FIG. 37D, the mirrors 1430 and 1439 are securely held in place partially by any suitable adhesive 1448, such as epoxy, and partially by an optical adhesive 1450, such as OG 146, manufactured by Epoxy Technology, 14 Fortune Drive, Billerica, Mass. 01821, USA, whose refractive index preferably is precisely matched to that of the cores 1418 and 1420 of the optical fibers 1406 and 1408, respectively. The adhesive 1450 preferably fills the interstices between the roughened surfaces 1432 and 1440 defined by notch 1412 and respective mirrors 1430 and 1439. It is appreciated that optical adhesive 1450 may be employed throughout instead of adhesive 1448. It is noted that the index of refraction of-adhesive 1450 is close to but not identical to that of the curved portion 1444, substrate 1442 and claddings 1414 and 1416 of the optical fibers 1406 and 1408, respectively.

Figure 38:
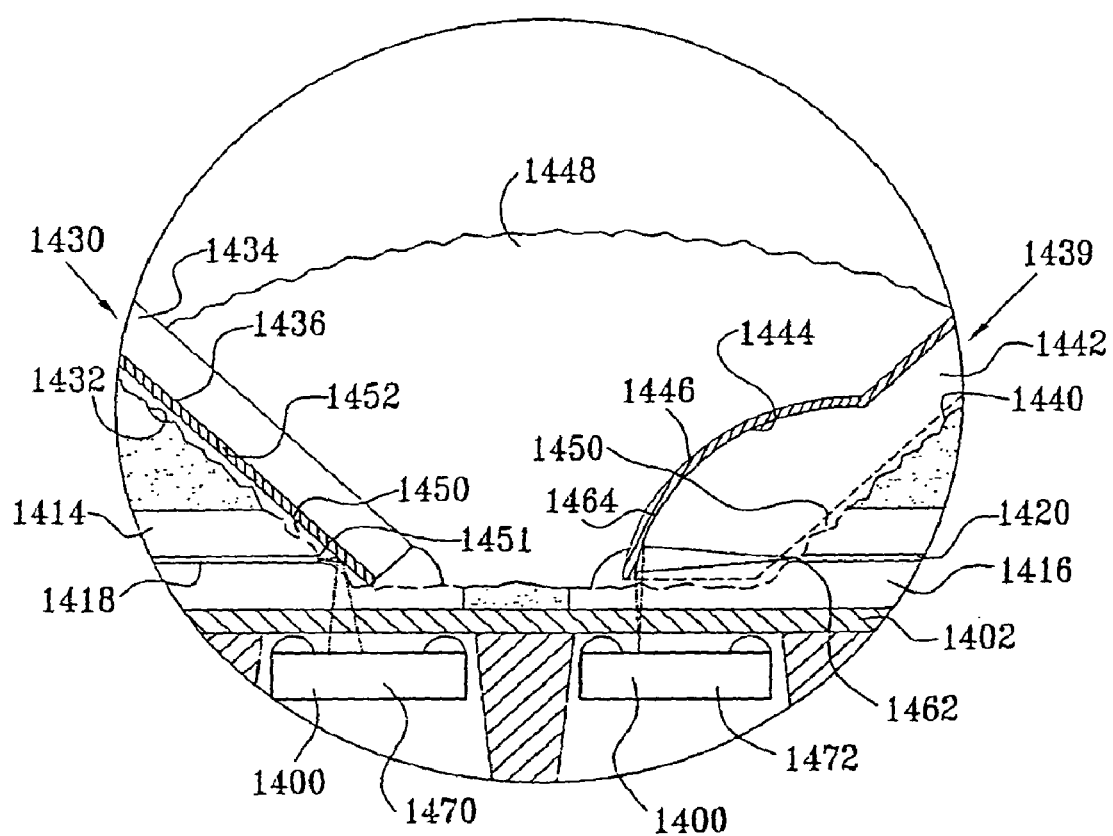
FIG. 38 is an enlarged simplified optical illustration of a portion of FIG. 37D.

Reference is now made to FIG. 38, which is an enlarged simplified optical illustration of a portion of FIG. 37D. Here it is seen that a generally uninterrupted optical path is defined for light, preferably in the wavelength range of 600-1650 nm, from an end 1451 of a core 1418, through adhesive 1450 to a reflective surface 1452 of mirror 1430 and thence through adhesive 1450 and cladding 1414, through layer 1402, which is substantially transparent to this light. Similarly, a generally uninterrupted optical path is defined for light, preferably in the wavelength range of 600-1650 nm, from an end 1462 of core 1420, through adhesive 1450, substrate 1442 and curved portion 1444 to a reflective surface 1464 of mirror 1439 and thence through curved portion 1444, adhesive 1450 and cladding 1416, through layer 1402, which is substantially transparent to this light.

It is noted that mirror 1430 typically reflects light onto an electro-optic component 1400, here designated 1470, without focusing or collimating the light, while mirror 1439 focuses light reflected thereby onto another electro-optic component 1400, here designated 1472. It is appreciated that any suitable combination of mirrors having any suitable optical properties, such as collimating and focusing, may alternatively be employed.

Figure 39A:
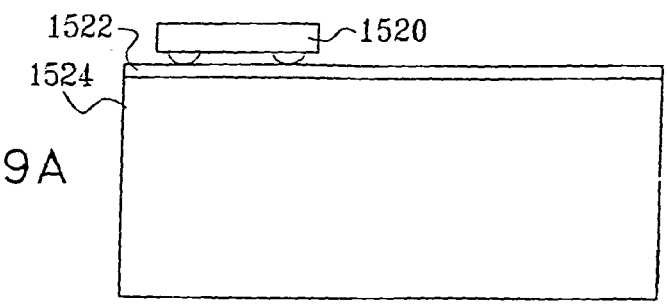
FIGS. 39A, 39B, 39C and 39D are simplified sectional illustrations of stages in the production of an electro-optic integrated assembly in accordance with yet another preferred embodiment of the present invention.

Reference is now made to FIGS. 39A, 39B, 39C, and 39D, which are simplified sectional illustrations of stages in the production of an electro-optic integrated circuit in accordance with another preferred embodiment of the present invention. As seen in FIG. 39A, electro-optic components 1520, such as a diode laser, are each mounted onto an electrical circuit (not shown), included within a planarized layer 1522 formed onto substrate 1524. It is appreciated that electro-optic components 1520 may be any suitable electro-optic component, such as a laser diode, diode detector, waveguide, array waveguide grating or a semiconductor optical amplifier.

Figure 39B:
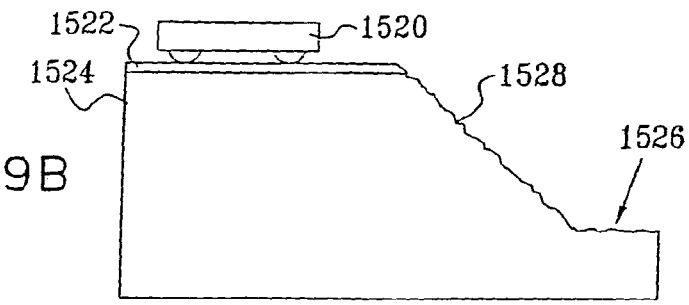

As shown in FIG. 39B, a transverse cut 1526 is preferably formed to extend partially through the substrate 1524. It is appreciated that a surface 1528 defined by the cut 1526 is relatively rough, as shown.

Figure 39C:
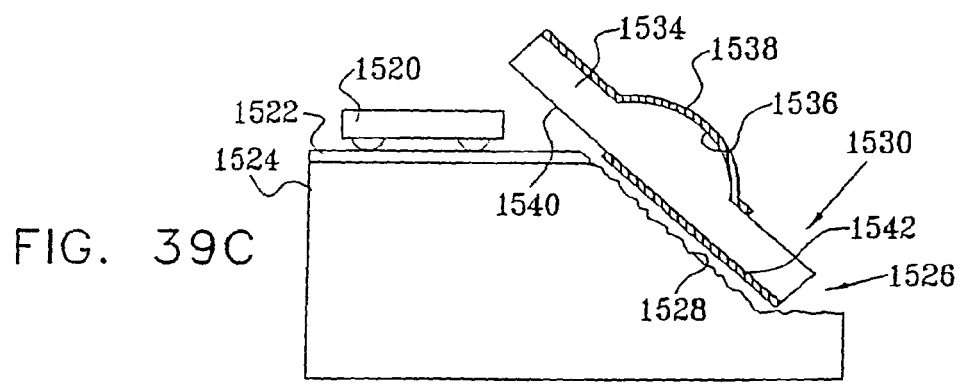
Figure 39D:
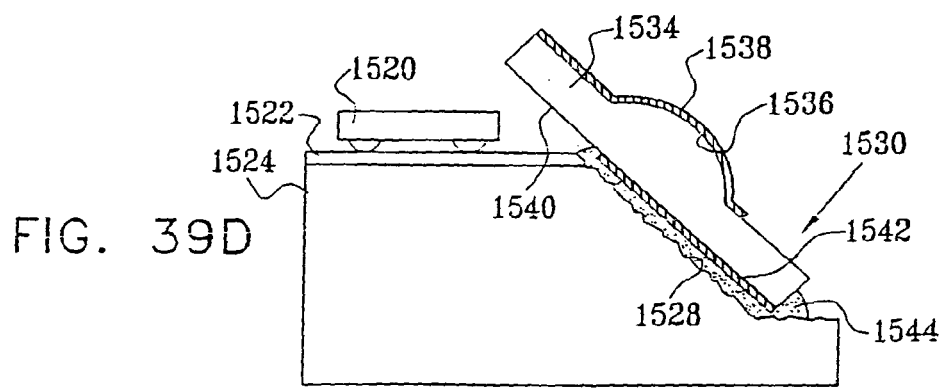

Turning now to FIG. 39C, it is seen that a partially flat and partially concave mirror assembly 1530 is preferably mounted parallel to the rough inclined surface 1528 defined by the cut 1526. Mirror assembly 1530 preferably comprises a glass substrate 1534 having formed thereon a curved portion 1536 over which is formed a curved metallic layer or a dichroic filter layer 1538. Mirror assembly 1530 also defines a flat surface 1540, having formed thereon a metallic layer or a dichroic filter layer 1542 partially underlying the curved portion 1536. As seen in FIG. 39D, preferably, the mirror assembly 1530 is securely held in place by any suitable adhesive 1544, such as epoxy.

Figure 40:
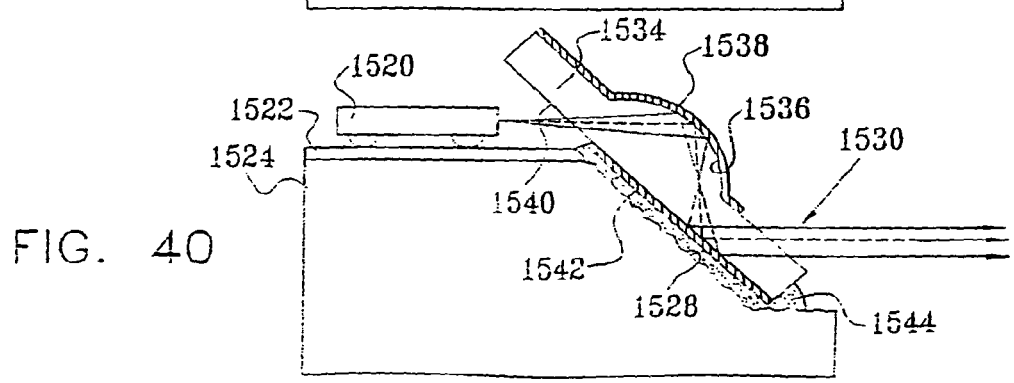
FIG. 40 is a simplified optical illustration of FIG. 39D.

Reference is now made to FIG. 40, which is a simplified optical illustration corresponding to FIG. 39D. Here it is seen that a generally uninterrupted optical path is defined for light, preferably in the wavelength range of 400-1650 nm, from each electro-optic component 1520 through glass substrate 1534 and curved portion 1536 of mirror assembly 1530 into reflective engagement with layer 1538 and thence through curved portion 1536 and substrate 1534 to layer 1542 and reflected from layer 1542 through substrate 1534 as a parallel beam.

It is appreciated that the electro-optic integrated circuit described in reference to FIGS. 39A-40 may be configured to operate as either a light transmitter or a light receiver, as described hereinbelow with reference to FIGS. 43-45.

Figure 41A:
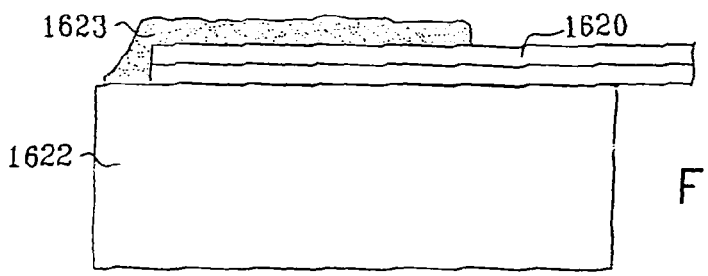
FIGS. 41A, 41B, 41C and 41D are simplified sectional illustrations of stages in the production of an electro-optic integrated assembly in accordance with still another preferred embodiment of the present invention.
Figure 41B:
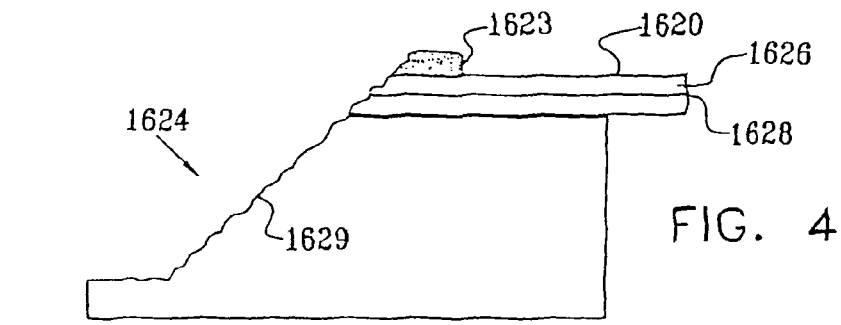

Reference is now made to FIGS. 41A, 41B, 41C, and 41D, which are simplified sectional illustrations of stages in the production of an electro-optic integrated circuit in accordance with another preferred embodiment of the present invention. As seen in FIG. 41A, an optical fiber 1620 is mounted onto a substrate 1622, preferably by means of adhesive 1623. As shown in FIG. 41B, a transverse cut 1624 is preferably formed to extend through the adhesive 1623, the optical fiber 1620 and the substrate 1622. Specifically, in this embodiment, the cut 1624 extends through the cladding 1626 of fiber 1620 and entirely through the core 1628 of the fiber. It is appreciated that a surface 1629 defined by the cut 1624 is relatively rough, as shown.

Figure 41C:
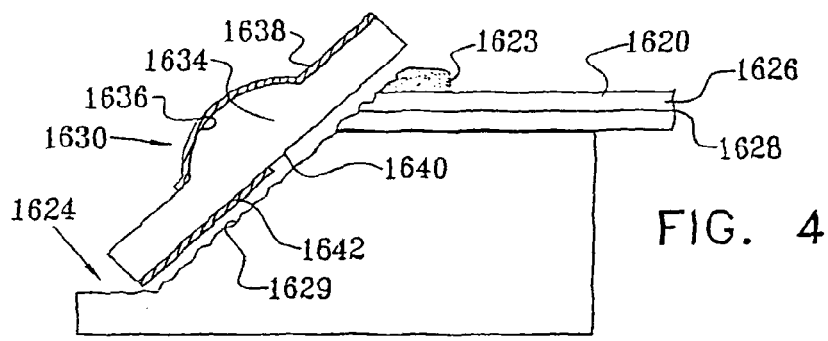
Figure 41D:
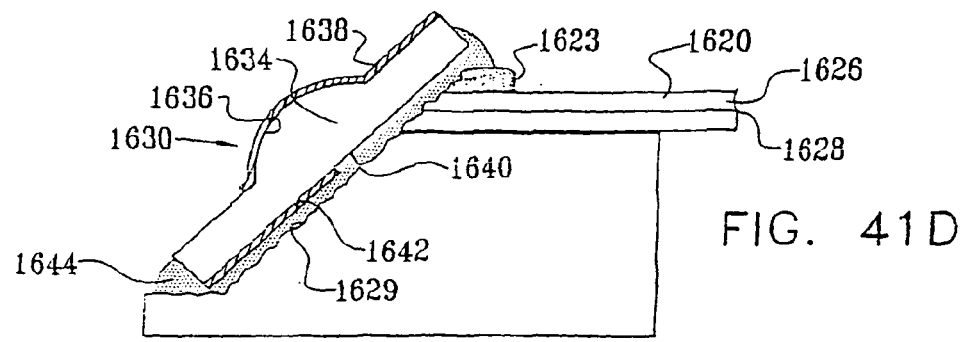

Turning now to FIG. 41C, it is seen that a partially flat and partially concave mirror assembly 1630 is preferably mounted parallel to the rough inclined surface 1629 defined by the cut 1624. Mirror assembly 1630 preferably comprises a glass substrate 1634 having formed thereon a curved portion 1636 over which is formed a curved metallic layer or a dichroic filter layer 1638. Mirror assembly 1630 also defines a flat surface 1640 having formed thereon a metallic layer or a dichroic filter layer 1642, partially underlying the curved portion 1636. As seen in FIG. 41D, preferably, the mirror assembly 1630 is securely held in place by an optical adhesive 1644, such as OG 146, manufactured by Epoxy Technology, 14 Fortune Drive, Billerica, Mass. 01821, USA, whose refractive index preferably is precisely matched to that of the cores 1628 of the optical fibers 1620.

Figure 42:
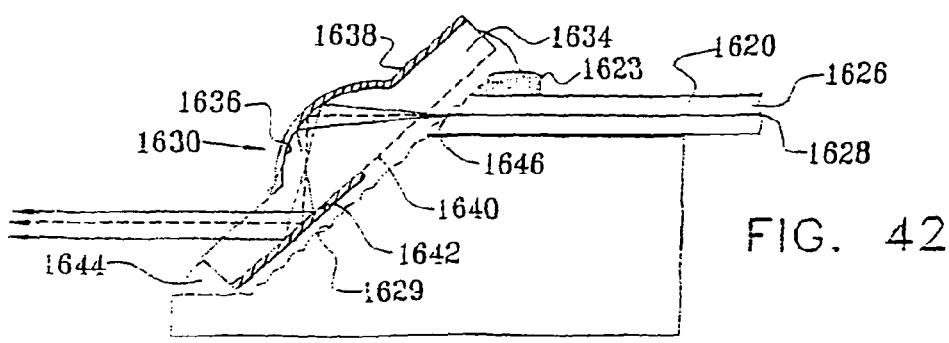
FIG. 42 is a simplified optical illustration of FIG. 41D.

Reference is now made to FIG. 42, which is a simplified optical illustration corresponding to FIG. 41D. Here it is seen that a generally uninterrupted optical path is defined for light, preferably in the wavelength range of 400-1650 nm, from an end 1646 of core 1628 of fiber 1620 through adhesive 1644 and substrate 1634 and curved portion 1636 of mirror assembly 1630 into reflective engagement with layer 1638 and thence through curved portion 1636 and substrate 1634 to layer 1642 and reflected from layer 1642 through substrate 1634 as a parallel beam.

It is appreciated that the electro-optic integrated circuit described in reference to FIGS. 41A-42 may be configured to operate as either a light transmitter or a light receiver, as described hereinbelow with reference to FIGS. 43-45.

Figure 43:
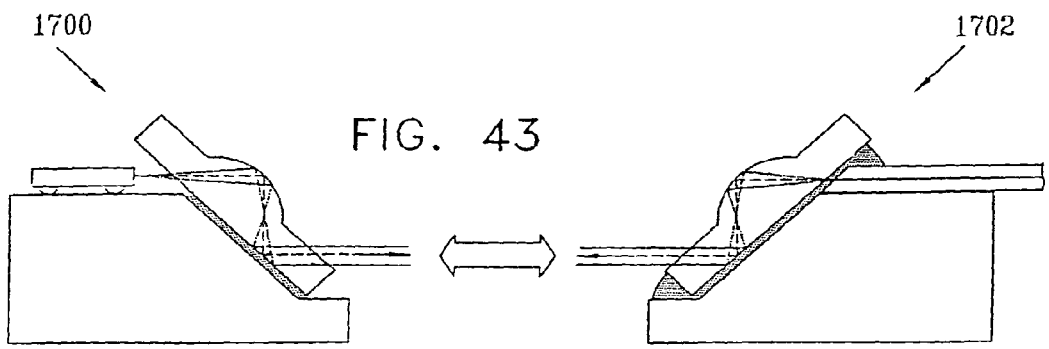
FIG. 43 is a simplified optical illustration of optical communication between connectors of the types shown in FIGS. 40 and 42.

Reference is now made to FIG. 43, which illustrates optical coupling through free space between the electro-optic integrated circuit of FIG. 40, here designated by reference numeral 1700 and the electro-optic integrated circuit of FIG. 42, here designated by reference numeral 1702. It is appreciated that either of electro-optic integrated circuits 1700 and 1702 may transmit light to the other, which receives the light along a parallel beam.

Figure 44:
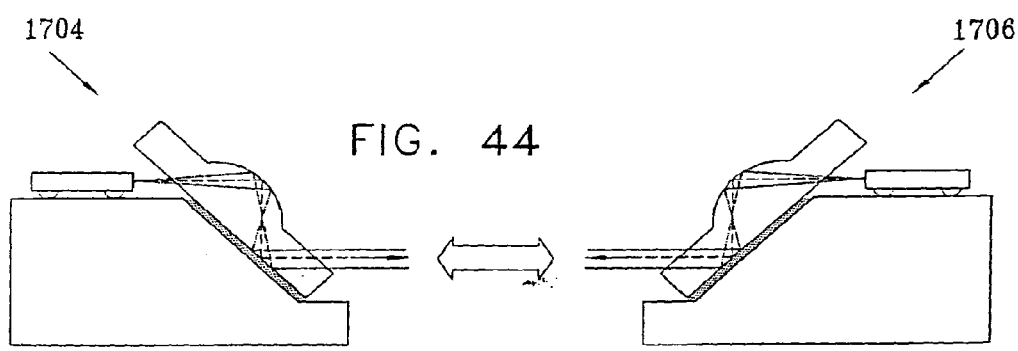
FIG. 44 is a simplified optical illustration of optical communication between two connectors of the type shown in FIG. 40.

Reference is now made to FIG. 44, which illustrates optical coupling through free space between an electro-optic integrated circuit of FIG. 40, here designated by reference numeral 1704 and another electro-optic integrated circuit of FIG. 40, here designated by reference numeral 1706. It is appreciated that either of electro-optic integrated circuits 1704 and 1706 may transmit light to the other, which receives the light, along a parallel beam.

Figure 45:
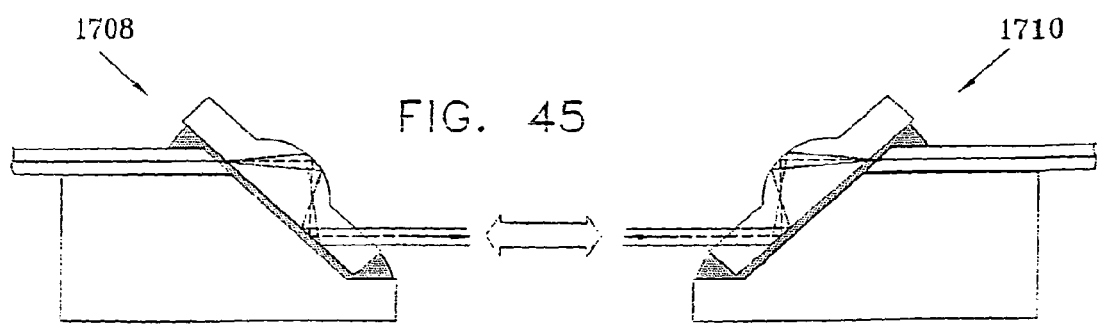
FIG. 45 is a simplified optical illustration of optical communication between two connectors of the type shown in FIG. 42.

Reference is now made to FIG. 45, which illustrates optical coupling through free space between an electro-optic integrated circuit of FIG. 42, here designated by reference numeral 1708 and another electro-optic integrated circuit of FIG. 42, here designated by reference numeral 1710. It is appreciated that either of electro-optic integrated circuits 1708 and 1710 may transmit light to the other, which receives the light, along a parallel beam.

Figure 46A:
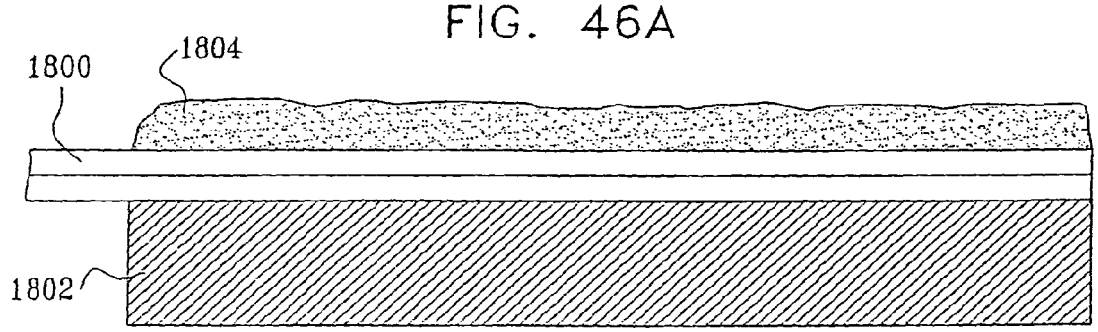
FIGS. 46A, 46B, 46C and 46D are simplified illustrations of stages in the production of an electro-optic integrated circuit in accordance with another preferred embodiment of the present invention.
Figure 46B:
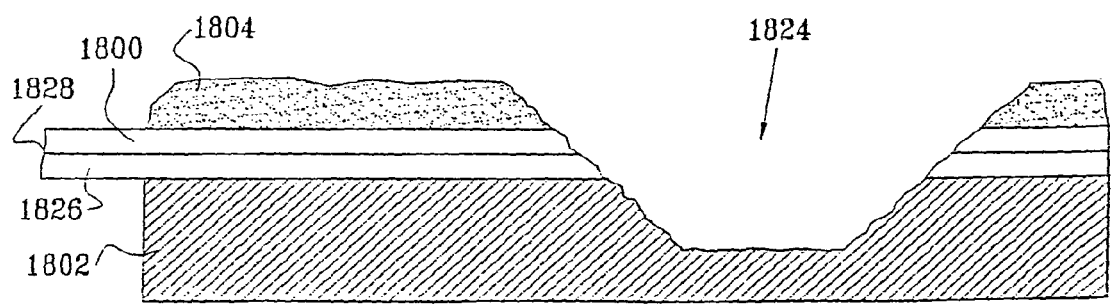

Reference is now made to FIGS. 46A, 46B, 46C, and 46D, which are simplified sectional illustrations of stages in the production of an electro-optic integrated circuit in accordance with another preferred embodiment of the present invention. As seen in FIG. 46A, an optical fiber 1800 is fixed in place on substrate 1802 by means of a suitable adhesive 1804, preferably epoxy. As shown in FIG. 46B, a transverse notch 1824 is preferably formed, extending through the adhesive 1804 entirely through the optical fiber 1800 and partially into substrate 1802. Specifically, in this embodiment, the notch 1824 extends through all of cladding 1826 of the fiber 1800 and entirely through the core 1828 of the fiber. It is appreciated that the surfaces defined by the notch 1824 are relatively rough, as shown.

Figure 46C:
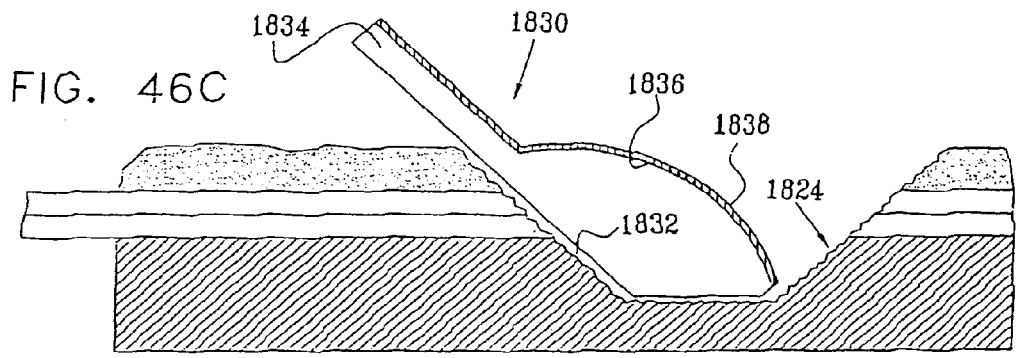
Figure 46D:
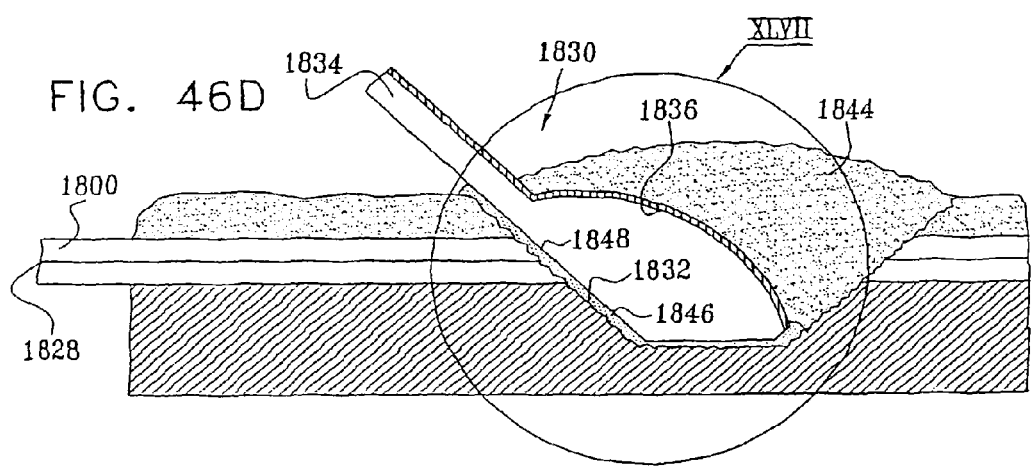

Turning now to FIG. 46C, it is seen that a partially flat and partially concave mirror 1830 is preferably mounted parallel to one of the rough inclined surfaces 1832 defined by notch 1824. Mirror 1830 preferably comprises a glass substrate 1834 having formed thereon a curved portion 1836 over which is formed a curved metallic layer or a dichroic filter layer 1838. As seen in FIG. 46D, preferably, the mirror 1830 is securely held in place partially by any suitable adhesive 1844, such as epoxy, and partially by an optical adhesive 1846, such as OG 146, manufactured by Epoxy Technology, 14 Fortune Drive, Billerica, Mass. 01821, USA, whose refractive index preferably is precisely matched to that of the cores 1828 of the optical fibers 1800. It is appreciated that optical adhesive 1846 may be employed throughout instead of adhesive 1844. The optical adhesive 1846 preferably fills the interstices between the roughened surface 1832 defined by notch 1824 and a surface 1848 of mirror 1830.

Figure 47:
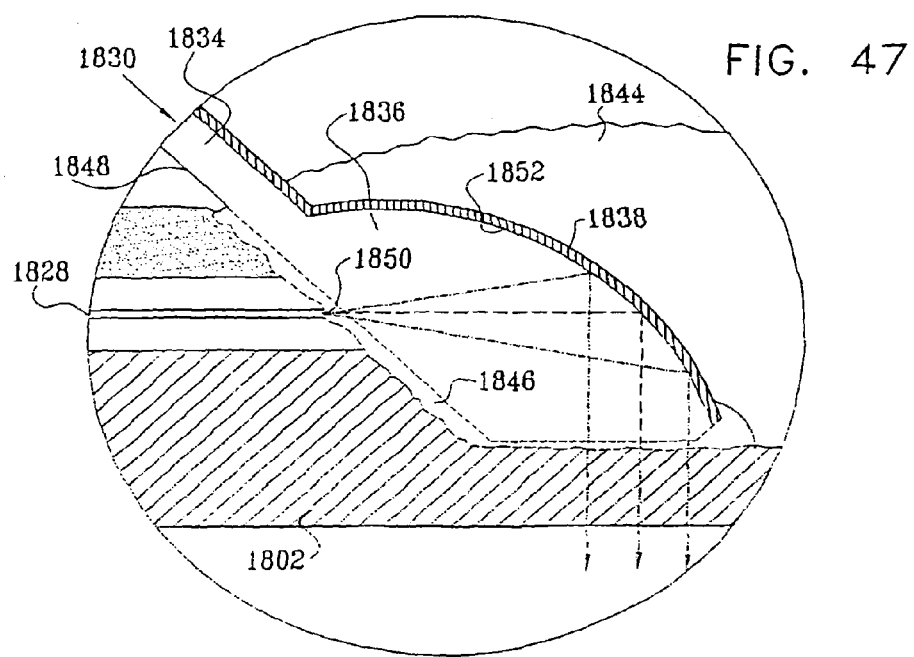
FIG. 47 is an enlarged simplified optical illustration of a portion of FIG. 46D.

Reference is now made to FIG. 47, which is an enlarged simplified optical illustration of a portion of FIG. 46D. Here it is seen that a generally uninterrupted optical path is defined for light, preferably in the wavelength range of 400-1650 nm, from an end 1850 of a core 1828, through adhesive 1846, substrate 1834 and curved portion 1836, to a reflective surface 1852 of layer 1838 and thence through curved portion 1836, adhesive 1846 and substrate 1802, which are substantially transparent to this light. It is noted that the index of refraction of adhesive 1846 is close to but not identical to that of curved portion 1836 and substrates 1802 and 1834. As seen in FIG. 47, the operation of curved layer 1838 is to collimate light exiting from end 1850 of core 1828 through substrate 1802 as a parallel beam.

Figure 48:
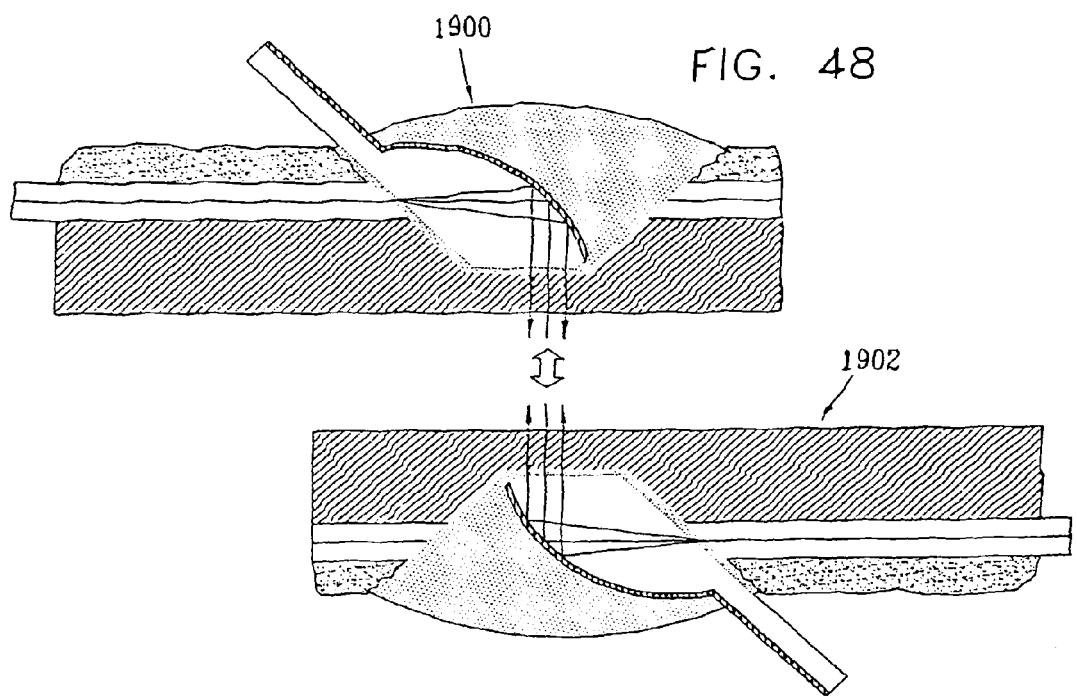
FIG. 48 is a simplified optical illustration of optical communication between an electro-optic integrated circuit and an electro-optic integrated circuit in accordance with another preferred embodiment of the present invention.

Reference is now made to FIG. 48, which illustrates optical coupling through free space between an electro-optic integrated circuit of FIG. 46D, here designated by reference numeral 1900, and another electro-optic integrated circuit of FIG. 46D, here designated by reference numeral 1902. It is appreciated that either of electro-optic integrated circuits 1900 and 1902 may transmit light to the other, which receives the light, along a parallel beam.

Figure 49:
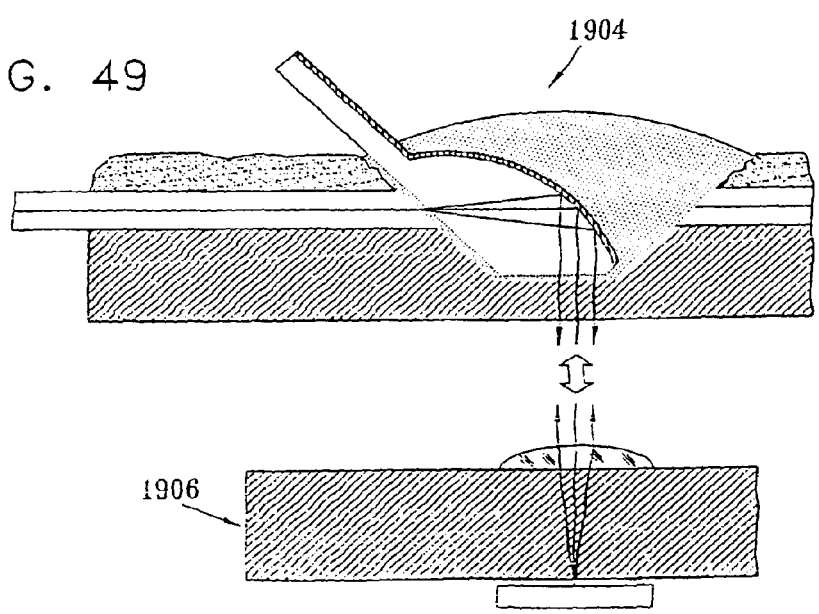
FIG. 49 is a simplified optical illustration of optical communication between an optic integrated circuit and an electro-optic integrated circuit in accordance with a preferred embodiment of the present invention.

Reference is now made to FIG. 49, which illustrates optical coupling through free space between an electro-optic integrated circuit of FIG. 46D, here designated by reference numeral 1904, and an optical device 1906. Optical device 1906 may be any optical device that receives or transmits light along a parallel beam. It is appreciated that either of electro-optic integrated circuit 1904 and optical device 1906 may transmit light to the other, which receives the light, along a parallel beam.

Figure 50A:
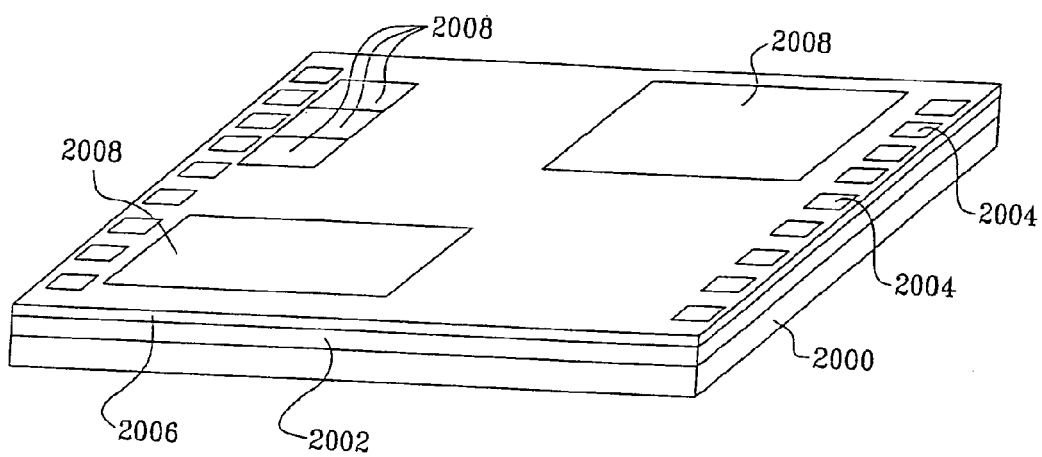

Reference is now made to FIGS. 50A, 50B, 50C, 50D and 50E, which are simplified pictorial illustrations of stages in the production of an electro-optic integrated circuit constructed and operative in accordance with still another preferred embodiment of the present invention. As seen in FIG. 50A, a substrate 2000, typically formed of silicon and having, a thickness of 300-800 microns, has formed thereon at least one dielectric passivation layer 2002, at least one metal layer 2004 and at least one overlying dielectric layer 2006. The dielectric layers are preferably transparent to light preferably in both the visible and the infrared bands. Vias, (not shown) connected to at least one metal layer 2004, extend through layer 2002 to the substrate 2000. One or more semiconductor functional blocks 2008 are preferably formed on substrate 2000.

Figure 50B:
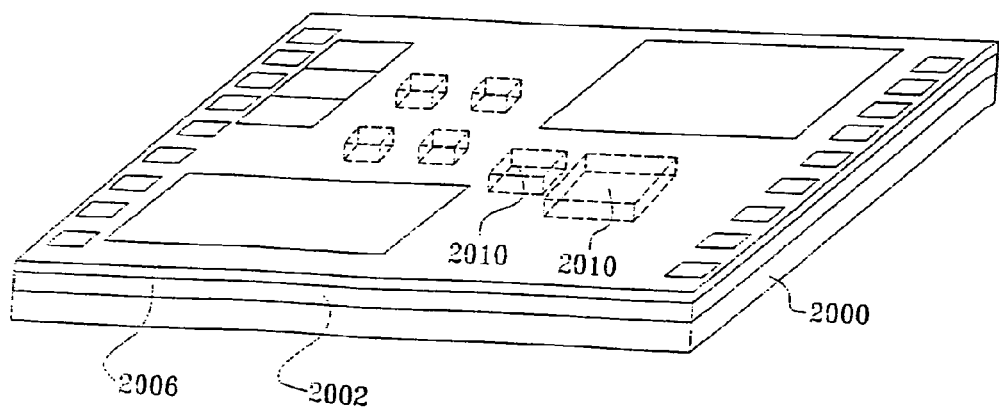

As seen in FIG. 50B, one or more openings 2010 are formed by removing portions of the substrate 2000 from the underside thereof, as shown for example in FIG. 25B. The removal of portions of substrate 2000 may be achieved by using conventional etching techniques and, preferably, provides a volume of dimensions of at least 600 microns in width.

Figure 50C:
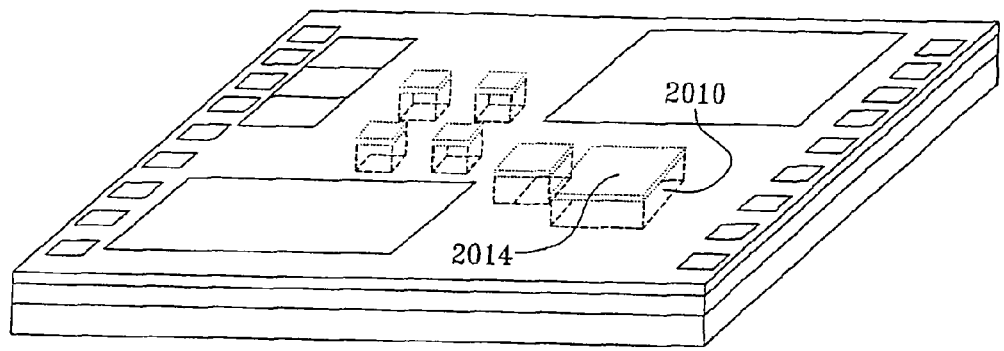

As seen in FIG. 50C, integrated circuit chips 2014 are preferably located in openings 2010. These chips may be operatively engaged with vias (not shown) by being soldered to bumps (not shown) as illustrated for example in FIG. 25D, thus creating an optoelectronic integrated circuit, wherein integrated circuit chips 2014 reside within the substrate of the integrated circuit.

Figure 50D:
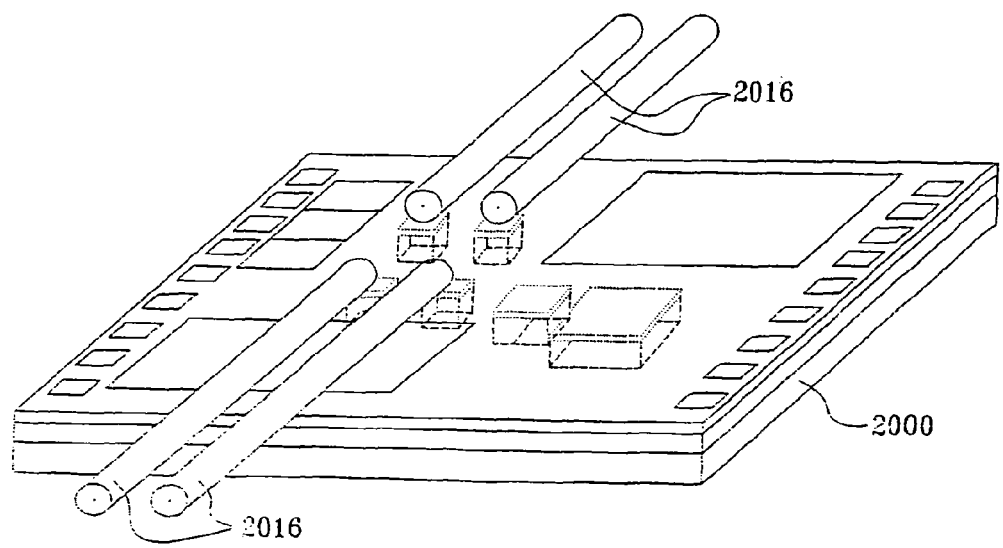

As seen in FIG. 50D, one or more fibers 2016 are fixed to substrate 2000, preferably by an adhesive (not shown), similarly to that shown in FIG. 37A. Multiple fibers 2016 may be identical, similar or different and need not be arranged in a mutually aligned spatial relationship.

As shown in FIG. 50E, it is seen that a mirror 2030, typically of the type illustrated in any of FIGS. 18A-24G, is preferably mounted in operative engagement with each fiber 2016.

Reference is now made to FIG. 51, which is a simplified functional illustration of a preferred embodiment of the structure of FIG. 50E. As seen in FIG. 51, a high frequency optical signal 2100, typically of frequency 10 GHz, passes through a fiber 2102 and is reflected by a mirror 2104 onto a diode 2106, which may be located in a recess 2107. An output electrical signal 2108 from diode 2106 is supplied to an amplifier 2110, which may be located in a recess 2111 and need not be formed of silicon, but could be formed, for example, of gallium arsenide or indium phosphide. The amplified output 2112 of amplifier 2110 may be provided to a serializer/deserializer 2114, which may be located in a recess 2115 and need not be formed of silicon, but could be formed, for example, of gallium arsenide or indium phosphide.

An output signal 2116 from serializer/deserializer 2114 is preferably fed to one or more semiconductor functional blocks 2118 for further processing. A laser 2120, which may be located in a recess 2122, may employ an electrical output from a functional block 2118 to produce a modulated light beam 2124, which is reflected by a mirror 2126 so as to pass through a fiber 2128. It is appreciated that electro-optic integrated circuit devices 2106 and 2120 may be configured to operate as either a light transmitter or a light receiver or both.

It is appreciated that in addition to the substrate materials described hereinabove the substrates may comprise glass, silicon, sapphire, alumina, aluminum nitride, boron nitride or any other suitable material.

Figure 52A:
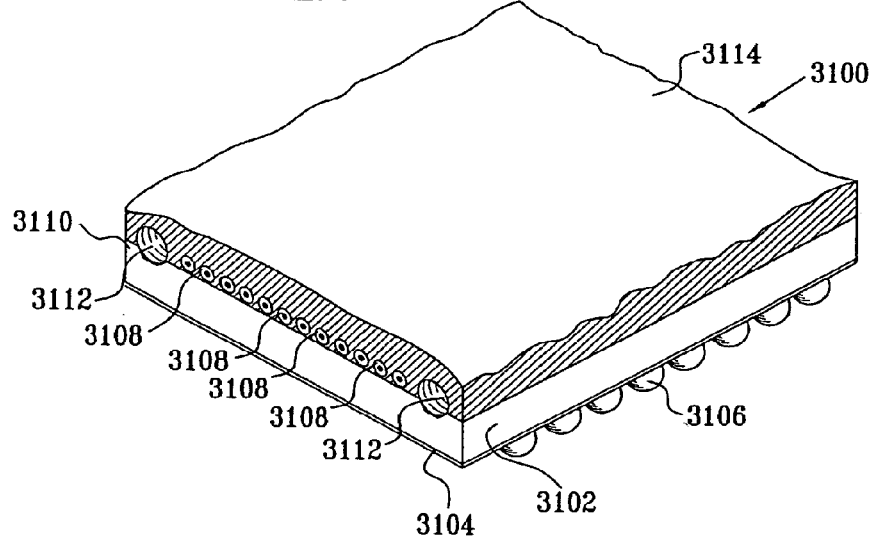
FIGS. 52A and 52B are simplified pictorial illustrations of a packaged electro-optic circuit having integrally formed therein an optical connector and electrical connections, alone and in conjunction with a conventional optical connector.
Figure 52B:
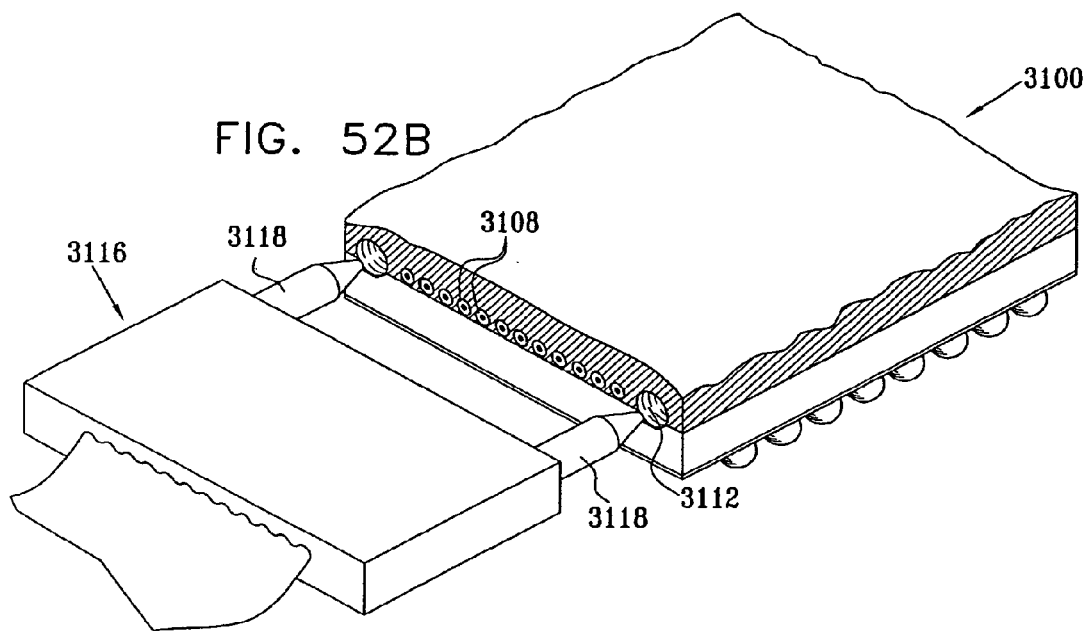

Reference is now made to FIGS. 52A and 52B, which are simplified pictorial illustrations of a packaged electro-optic circuit 3100, having integrally formed therein an optical connector and electrical connections, alone and in conjunction with a conventional optical connector.

As seen in FIGS. 52A and 52B, a packaged electro-optic circuit 3100 is provided in accordance with a preferred embodiment of the present invention and includes an at least partially transparent substrate 3102, typically glass. Electrical circuitry (not shown) is formed, as by conventional photolithographic techniques, over one surface of substrate 3102 and is encapsulated by a layer 3104 of a protective material such as BCB, commercially available from Dow Corning of the U.S.A. An array 3106 of electrical connections, preferably in the form of conventional solder bumps, communicates with the electrical circuitry via conductive pathways (not shown) extending through the protective material of layer 3104.

Formed on a surface of substrate 3102 opposite to that adjacent layer 3104 there are defined optical pathways (not shown) which communicate with an array of optical fibers 3108, whose ends are aligned along an edge 3110 of the substrate 3102. Preferably, physical alignment bores 3112 are aligned with the array of optical fibers 3108. The bores 3112 are preferably defined by cylindrical elements, which, together with the optical fibers 3108 and the optical pathways, are encapsulated by a layer 3114 of protective material, preferably epoxy.

FIG. 52B shows a conventional MPO type optical connector 3116, such as an MPO connector manufactured by SENKO Advanced Components, Inc. of Marlborough, Mass., USA., arranged for mating contact with the packaged electro-optic circuit 3100, wherein alignment pins 3118 of connector 3116 are arranged to seat in alignment bores 3112 of the electro-optic circuit 3100 and optical fiber ends (not shown) of connector 3116 are arranged in butting aligned relationship with the ends of the array 3108 of optical fibers in packaged electro-optic circuit 3100.

Figure 53A:
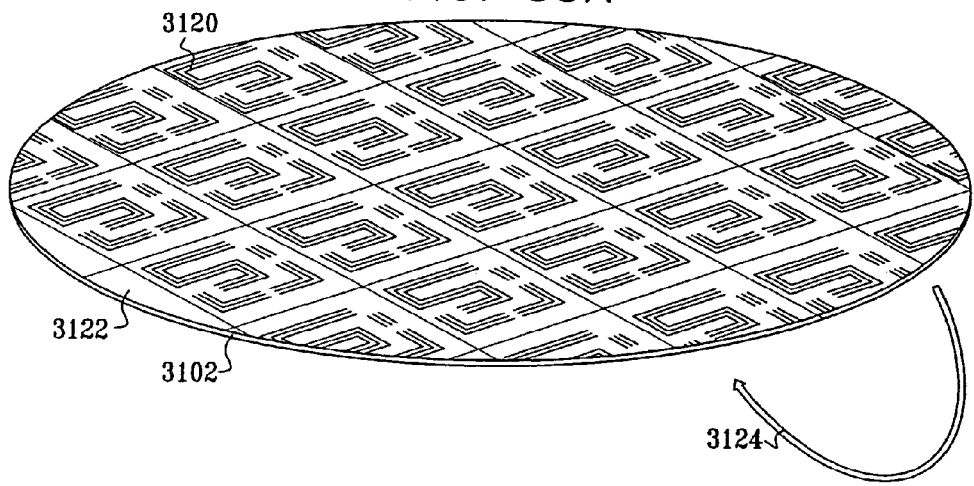

Reference is now made to FIGS. 53A-53F, which are simplified pictorial and sectional illustrations of a first plurality of stages in the manufacture of the packaged electro-optic circuit of FIGS. 52A and 52B. Turning to FIG. 53A, it is seen that electrical circuits 3120 are preferably formed onto a first surface 3122 of substrate 3102, at least part of which is transparent to light within at least part of the wavelength range of 600-1650 nm. Substrate 3102 is preferably of thickness between 200-800 microns. The electrical circuits 3120 are preferably formed by conventional photolithographic techniques employed in the production of integrated circuits.

Figure 53B:
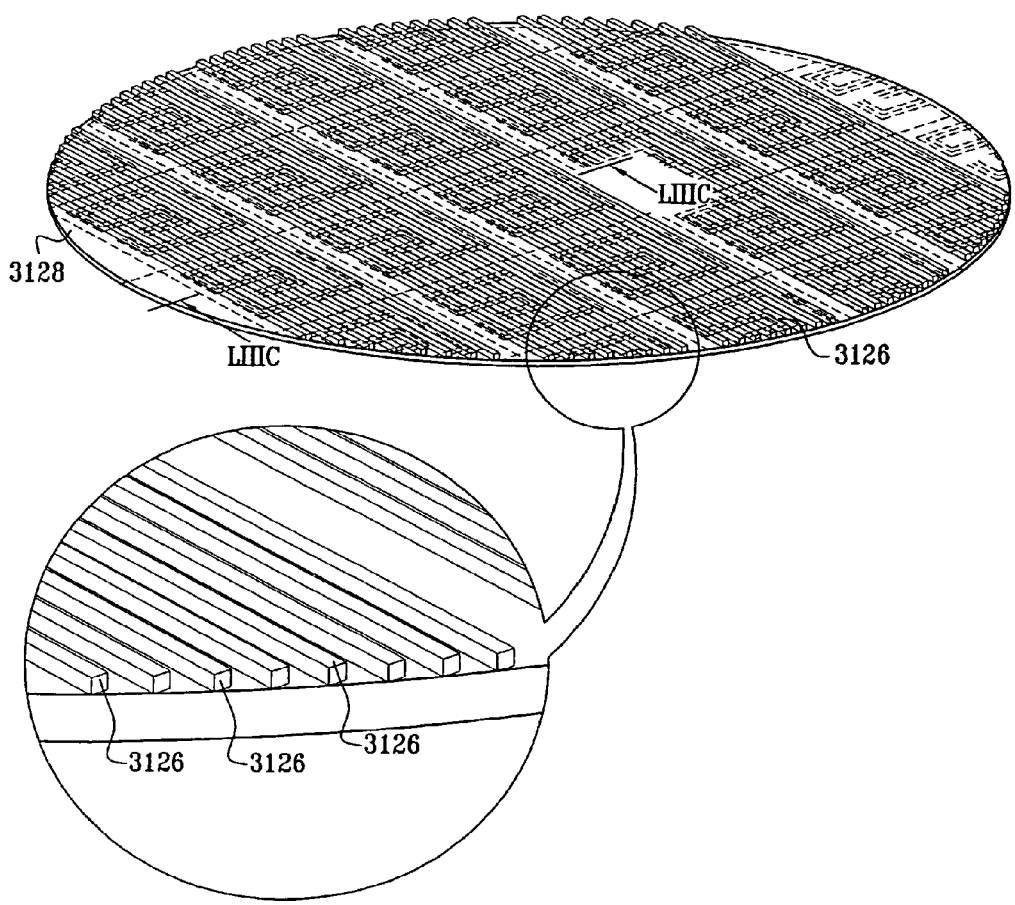

The substrate shown in FIG. 53A is turned over, as indicated by an arrow 3124 and, as seen in FIG. 53B, an array of parallel, spaced, elongate optical fiber positioning elements 3126 is preferably formed, such as by conventional photolithographic techniques, over an opposite surface 3128 of substrate 3102. It is appreciated that the positions of the array of elements 3126 on surface 3128 are preferably precisely coordinated with the positions of the electrical circuits 3120 on first surface 3122 of the substrate 3102, as shown in FIG. 53C.

Turning to FIG. 53D, it is seen that notches 3130 are preferably formed oil surface 3128, as by means of a dicing blade 3132, to precisely position and accommodate alignment bore defining cylinders 3134, as shown in FIG. 53E. FIG. 53E illustrates that the centers of alignment bore defining cylinders 3134 preferably lie in the same plane as the centers 3136 of optical fibers 3108 which are precisely positioned between elements 3126 on surface 3128. FIG. 53F illustrates encapsulation of the fibers 3108, the cylinders 3134 and the positioning elements 3126 by layer 3114 of protective material, preferably epoxy.

Figures 54A, 54B, 54C, 54D:
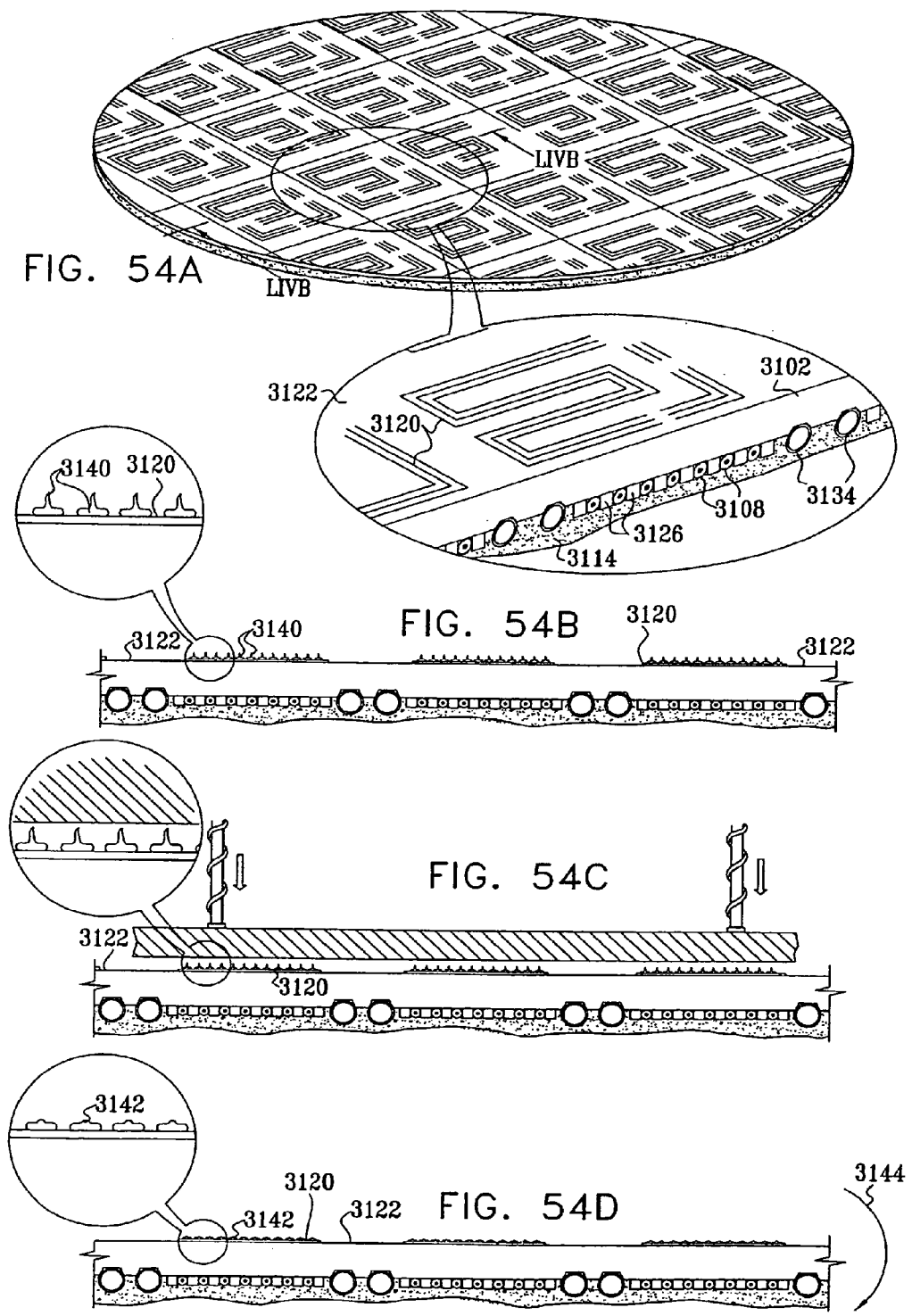

Reference is now made to FIGS. 54A-54J, which are simplified pictorial and sectional illustrations of a second plurality of stages in the manufacture of the packaged electro-optic circuit of FIGS. 52A and 52B. FIG. 54A shows the wafer of FIG. 53F turned over.

As shown in FIG. 54B, a multiplicity of studs 3140, preferably gold studs, are formed onto electrical circuits 3120 lying on surface 3122. The studs 3140 are preferably flattened or "coined", as shown schematically in FIG. 54C, to yield a multiplicity of flattened electrical contacts 3142, as shown in FIG. 54D.

Figure 54E:
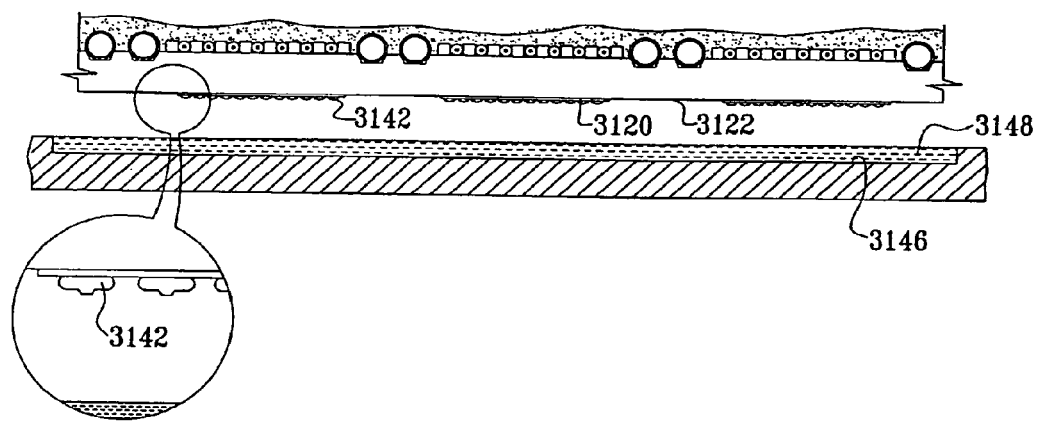
Figure 54F:
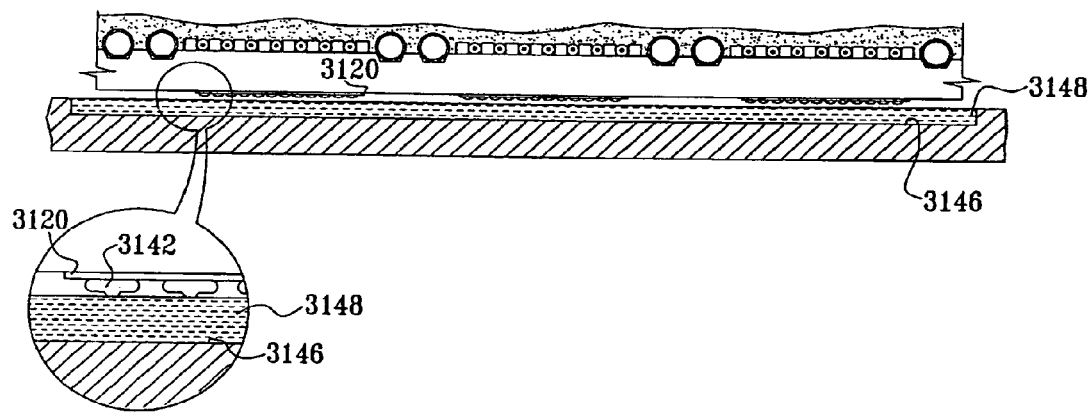
Figure 54G:
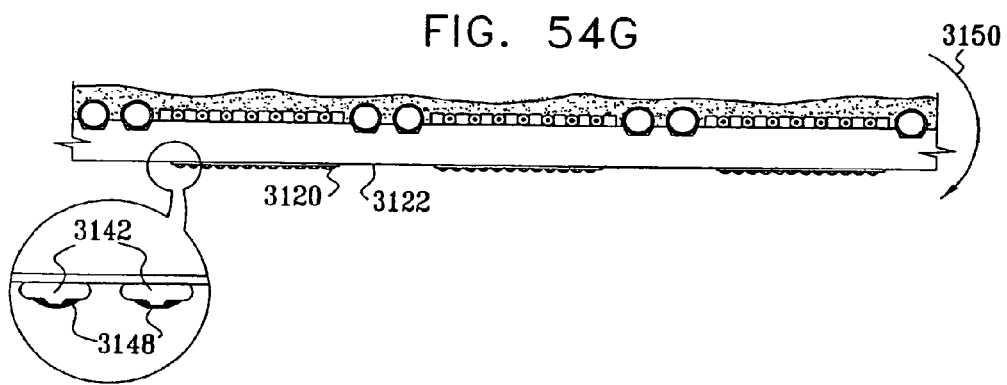

As shown in FIGS. 54E, 54F and 54G, the wafer of FIG. 54D is turned over, as indicated by an arrow 3144, and the electrical contacts 3142 are dipped into a shallow bath 3146 of a conductive adhesive 3148, such as H20E silver filled epoxy, manufactured by Epoxy Technology, 14 Fortune Drive, Billerica, Mass. 01821, USA, so as to coat the tip of each contact 3142 with adhesive 3148, as shown. The wafer of FIG. 54G is then turned over, as indicated by an arrow 3150, and a plurality of integrated circuits 3152 is mounted onto the multiplicity of contacts 3142, as seen in FIG. 54H. Integrated circuits 3152 may be electrical or electro-optic integrated circuits as appropriate.

FIG. 54I illustrates the application of underfill material 3154, such as OG 146 manufactured by Epoxy Technology, 14 Fortune Drive, Billerica, Mass. 01821, USA, at the gap between integrated circuits 3152 and electrical circuits 3120 as well as substrate 3102. If integrated circuits 3152 include electro-optic devices, the underfill material 3154 should be transparent as appropriate.

As shown in FIG. 54J, an encapsulation layer 3156, such as a layer of solder mask, is preferably formed over integrated circuits 3152, electrical circuits 3120, substrate 3102 and underfill material 3154.

For the purposes of the discussion which follows, it is assumed that at least some, if not all, of the integrated circuits 3152 are electro-optic devices. It is appreciated that additional integrated circuits (not shown) which are not electro-optic devices, may be electrically connected to the electrical circuits 3120 on substrate 3102 by other techniques, such as wire bonding.

Reference is now made to FIGS. 55A-55D, which are simplified pictorial and sectional illustrations of a third plurality of stages in the manufacture of the packaged electro-optic circuit of FIGS. 52A and 52B.

Figure 55A:
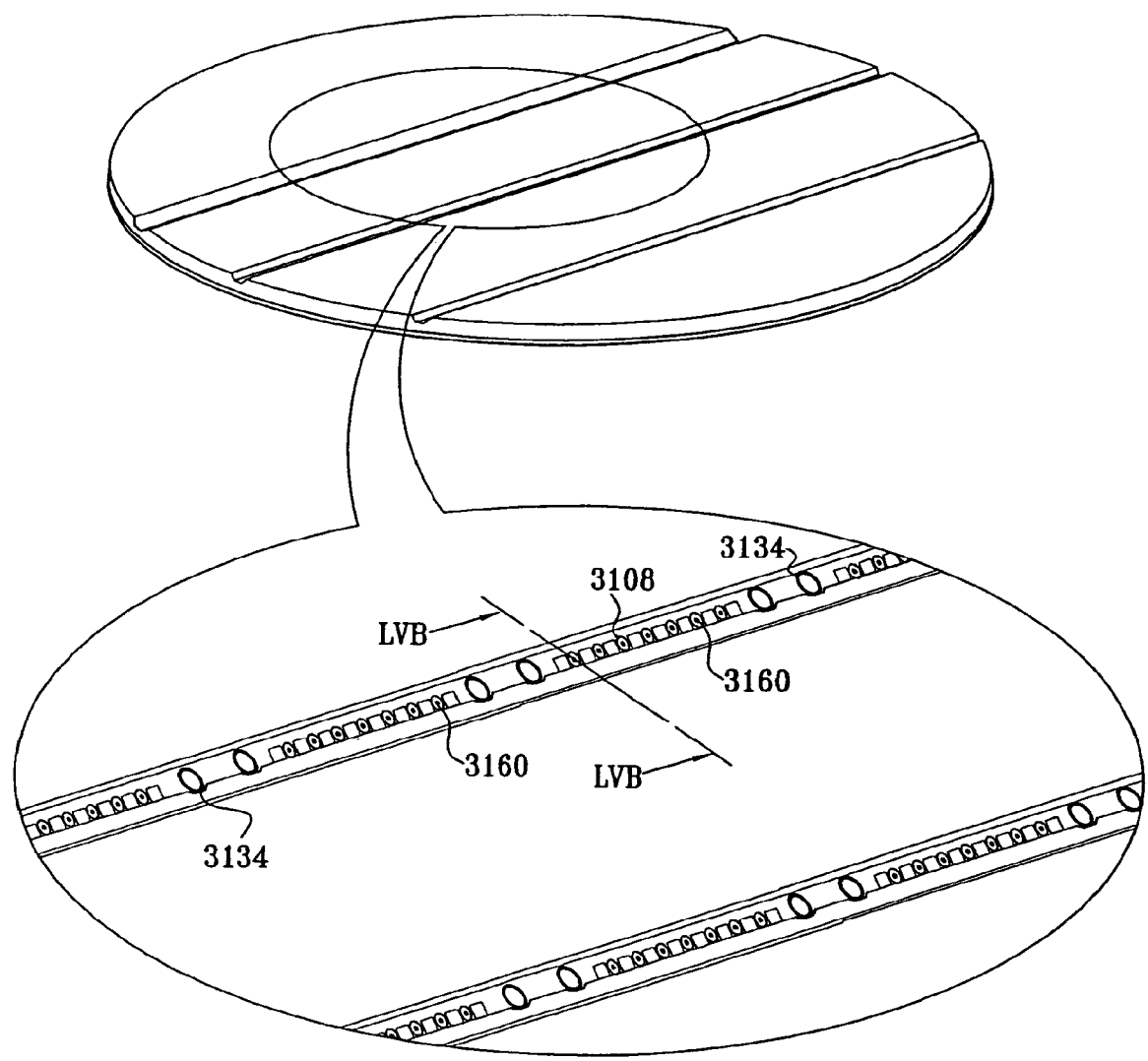
FIGS. 55A-55D are simplified pictorial and sectional illustrations of a third plurality of stages in the manufacture of the packaged electro-optic circuit of FIGS. 52A and 52B.

FIG. 55A illustrates the wafer of FIG. 54J, turned over and notched along lines extending perpendicularly to the array of optical fibers 3108, producing an inclined cut extending, entirely through at least the core 3160 of each fiber 3108 and extending at least partially through cylindrical elements 3134.

Figure 55B:
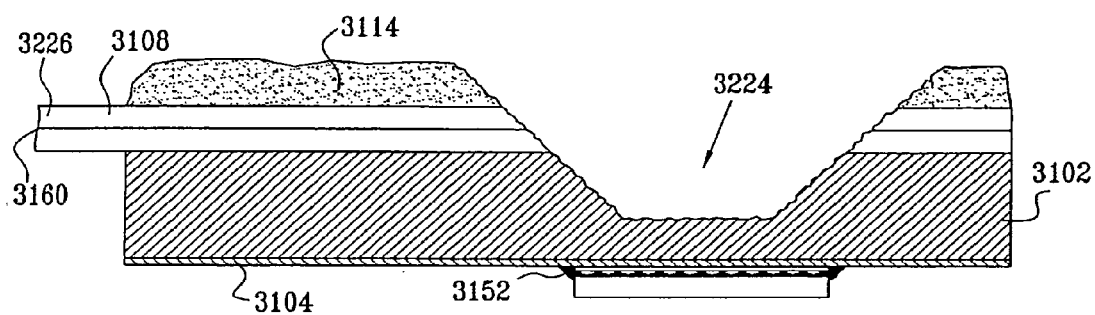
Figure 55C:
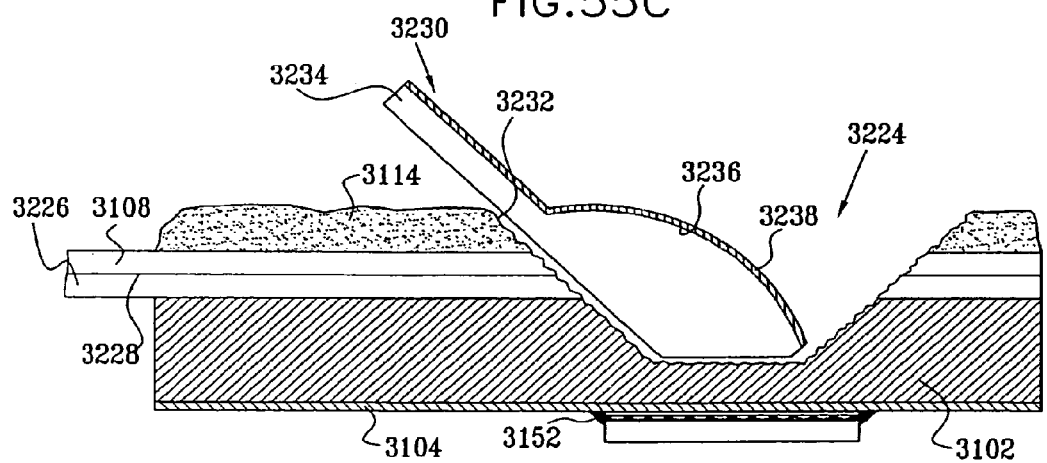
Figure 55D:
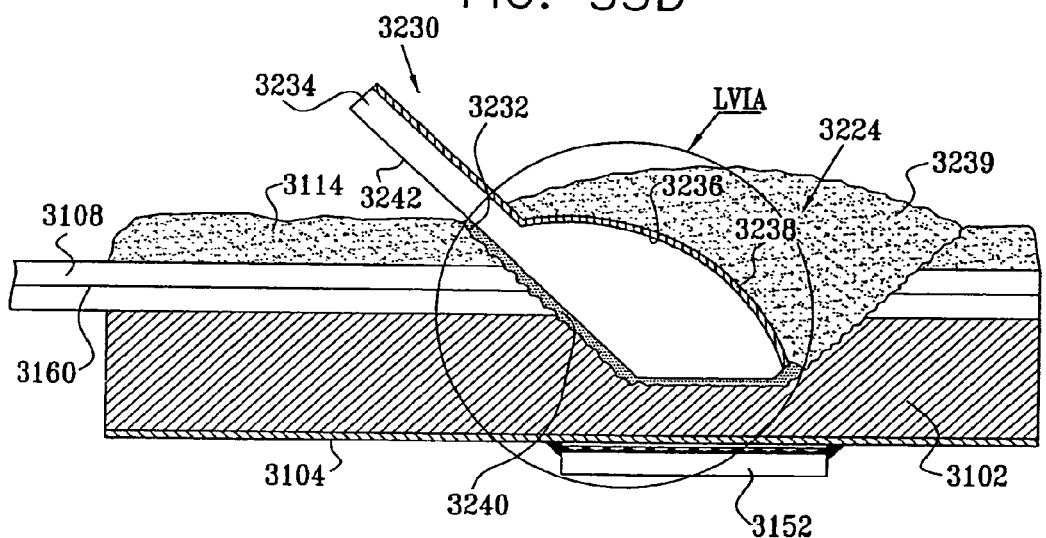

FIGS. 55B-55D are simplified sectional illustrations, taken along the lines LVB-LVB in FIG. 55A, of further stages in the production of the electro-optic integrated circuit.

As shown in FIG. 55B, the notching preferably forms a notch 3224, at least partially overlapping the locations of the integrated circuits 3152, at least some, if not all, of which are electro-optic devices, and extending through the layer 3114 of protective material, entirely through each optical fiber 3108 and partially into substrate 3102. Specifically, in this embodiment, the notch 3224 extends through all of cladding 3226 of each fiber 3108 and entirely through the core 3160 of each fiber. It is appreciated that the surfaces defined by the notch 3224 are relatively rough, as shown.

Turning now to FIG. 55C, it is seen that a partially flat and partially concave mirror assembly 3230 is preferably mounted parallel to one of the rough inclined surfaces 3232 defined by notch 3224. Mirror assembly 3230 preferably comprises a glass substrate 3234 having formed thereon a curved portion 3236 over which is formed a curved metallic layer or a dichroic filter layer 3238. A preferred method of fabrication of mirror assembly 3230 is described hereinabove with reference to FIGS. 19A-19E. As seen in FIG. 55D, preferably, the mirror assembly 3230 is securely held in place partially by any suitable adhesive 3239, such as epoxy, and partially by an optical adhesive 3240, such as OG 146, manufactured by Epoxy Technology, 14 Fortune Drive, Billerica, Mass. 01821, USA, whose refractive index preferably is precisely matched to that of the cores 3160 of the optical fibers 3108. It is appreciated that optical adhesive 3240 may be employed throughout instead of adhesive 3239. Optical adhesive 3240 preferably fills the interstices between the roughened surface 3232 defined by notch 3224 and a surface 3242 of mirror assembly 3230.

Figure 56A:
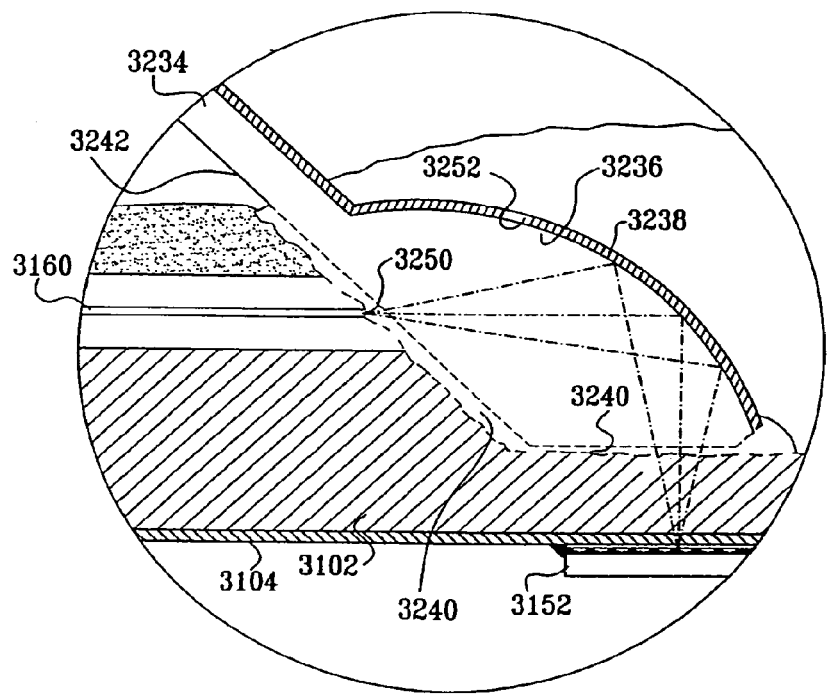
FIGS. 56A, 56B and 56C are enlarged simplified optical illustrations of a portion of FIG. 55D in accordance with various preferred embodiments of the present invention.
Figure 56B:
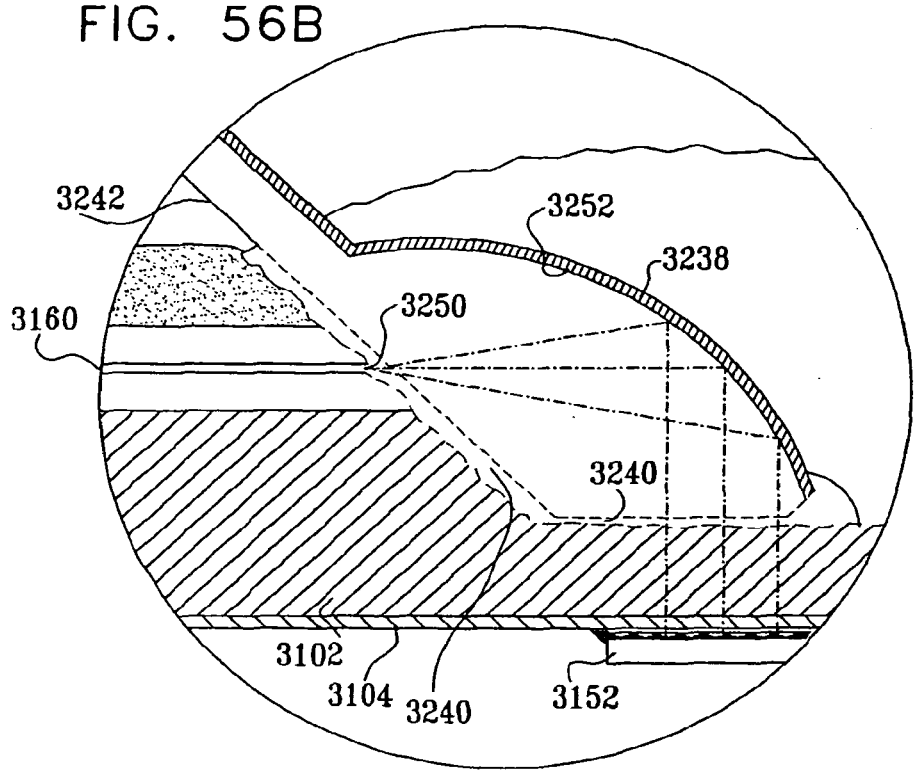
Figure 56C:
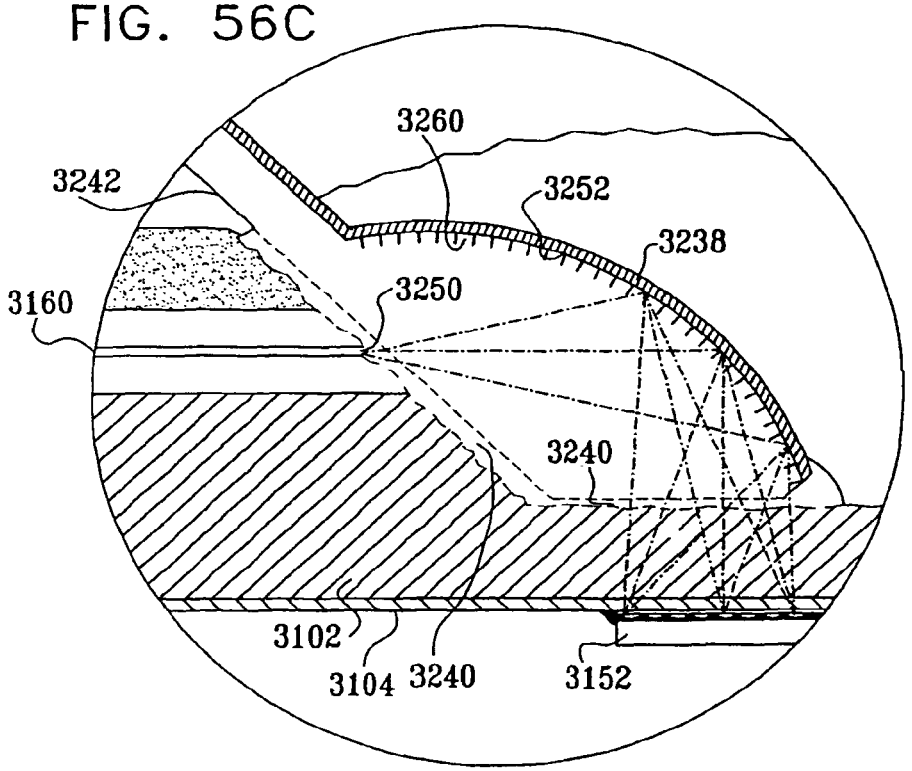

Reference is now made to FIGS. 56A-56C, which are enlarged simplified optical illustrations of a portion of FIG. 55D in accordance with preferred embodiments of the present invention. FIG. 56A is an enlarged simplified optical illustration of a portion of FIG. 55D. Here it is seen that a generally uninterrupted optical path is defined for light, preferably in the wavelength range of 400-1650 nm, from an end 3250 of a core 3160, through adhesive 3240, substrate 3234 and curved portion 3236 to a reflective surface 3252 of layer 3238 and thence through curved portion 3236, adhesive 3240 and substrate 3102 and layer 3104 which are substantially transparent to this light. It is noted that the index of refraction of adhesive 3240 is close to but not identical to that of curved portion 3236 and substrates 3102 and 3234. In the embodiment of FIG. 56A, the operation of curved layer 3238 is to focus light exiting from end 3250 of core 3160 onto the electro-optic component 3152.

FIG. 56B is an enlarged simplified optical illustration of a portion of FIG. 55D in accordance with a further embodiment of the present invention. In this embodiment, the curvature of curved layer 3238 produces collimation rather than focusing of the light exiting from end 3250 of core 3160 onto the electro-optic component 3152.

FIG. 56C is an enlarged simplified optical illustration of a portion of FIG. 55D in accordance with yet another embodiment of the present invention wherein a grating 3260 is added to curved layer 3238. The additional provision of grating 3260 causes separation of light impinging thereon according to its wavelength, such that multispectral light exiting from end 3250 of core 3160 is focused at multiple locations on electro-optic component 3152 in accordance with the wavelengths of components thereof.

Figure 57:
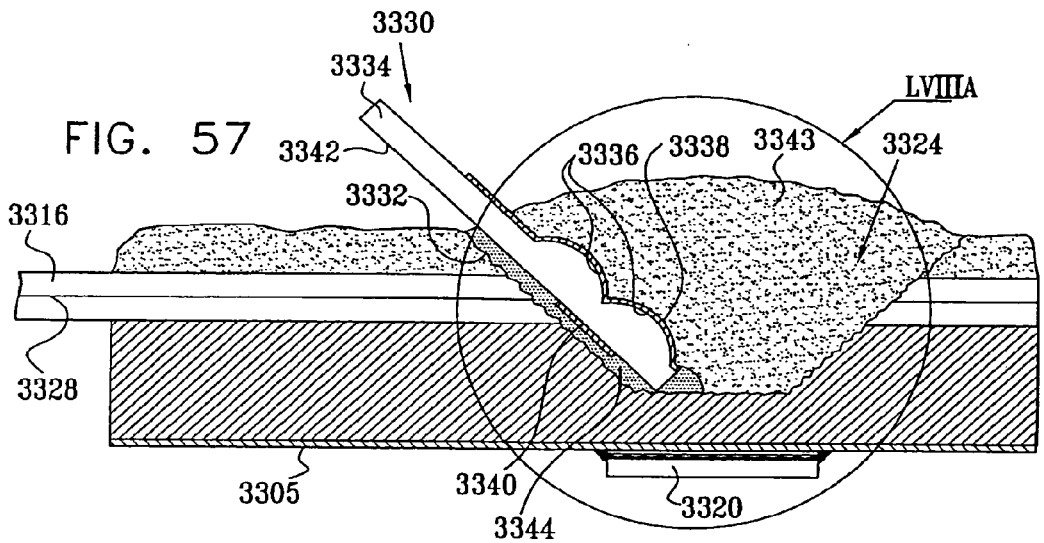
FIG. 57 is a simplified sectional illustration of an electro-optic circuit constructed and operative in accordance with another preferred embodiment of the present invention.

Reference is now made to FIG. 57, which is a simplified sectional illustration of an electro-optic integrated circuit constructed and operative in accordance with yet another preferred embodiment of the present invention. The embodiment of FIG. 57 corresponds generally to that described hereinabove with respect to FIG. 55D other than in that a mirror with multiple concave reflective surfaces is provided rather than a mirror with a single such reflective surface. As seen in FIG. 57, it is seen that light from an optical fiber 3316 is directed onto an electro-optic component 3320 by a partially flat and partially concave mirror assembly 3330, preferably mounted parallel to one of the rough inclined surfaces 3332 defined by notch 3324. Mirror assembly 3330 preferably comprises a glass substrate 3334 having formed thereon a plurality of curved portions 3336 over which are formed a curved metallic layer or a dichroic filter layer 3338. Mirror assembly 3330 also defines a reflective surface 3340, which is disposed on a planar surface 3342 generally opposite layer 3338. A preferred method of fabrication of mirror assembly 3330 is described hereinabove with reference to FIGS. 20A-20F. Preferably, the mirror assembly 3330 is securely held in place partially by any suitable adhesive 3343, such as epoxy, and partially by an optical adhesive 3344, such as OG 146, manufactured by Epoxy Technology, 14 Fortune Drive, Billerica, Mass. 01821, USA, whose refractive index preferably is precisely matched to that of the cores 3328 of the optical fibers 3316. It is appreciated that optical adhesive 3344 may be employed throughout instead of adhesive 3343. The optical adhesive 3344 preferably fills the interstices between the roughened surface 3332 defined by notch 3324 and surface 3342 of mirror assembly 3330.

Figure 58A:
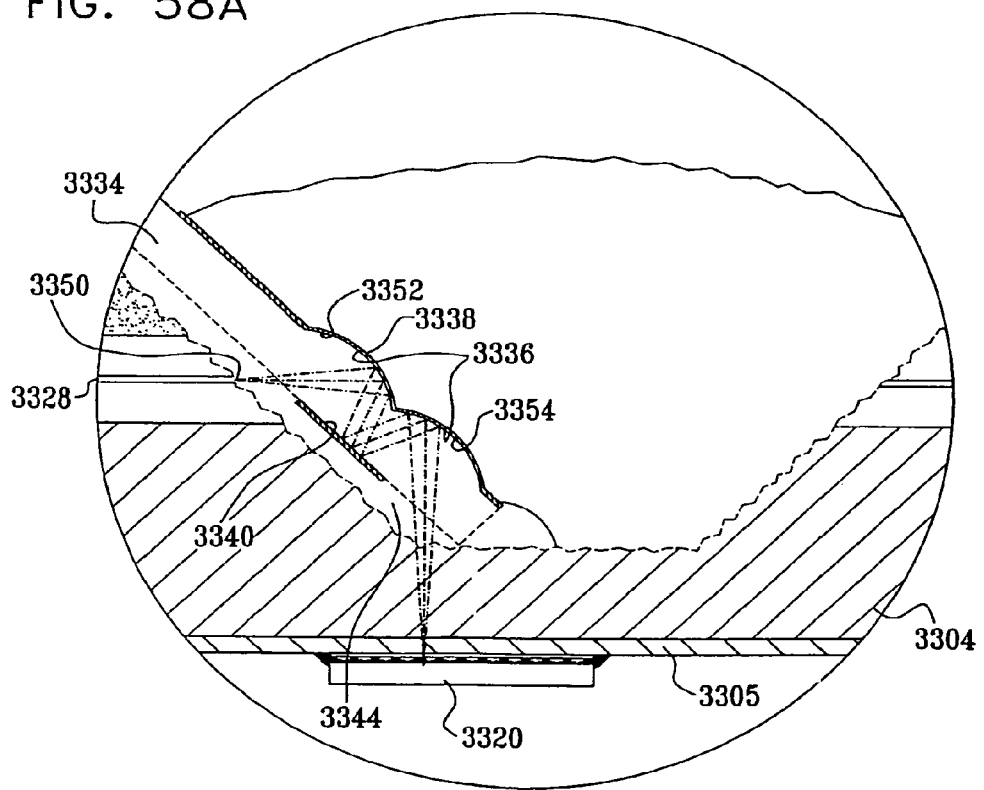
FIGS. 58A, 58B and 58C are enlarged simplified optical illustrations of a portion of FIG. 57 in accordance with various other preferred embodiments of the present invention.

Reference is now made to FIG. 58A, which is an enlarged simplified optical illustration of a portion of FIG. 57. Here it is seen that a generally uninterrupted optical path is defined for light, preferably in the wavelength range of 400-1650 nm, from an end 3350 of a core 3328, through adhesive 3344, substrate 3334 and first curved portion 3336, to a curved reflective surface 3352 of layer 3338 and thence through first curved portion 3336 and substrate 3334 to reflective surface 3340, from reflective surface 3340 through substrate 3334 and second curved portion 3336 to another curved reflective surface 3354 of layer 3338 and thence through second curved portion 3336, substrate 3334, adhesive 3344 and substrate 3304 and layer 3305, which are substantially transparent to this light. It is noted that the index of refraction of adhesive 3344 is close to but not identical to that of substrates 3304 and 3334. In the embodiment of FIG. 58A, the operation of curved layer 3338 and reflective surface 3340 is to focus light exiting from end 3350 of core 3328 onto the electro-optic component 3320.

Figure 58B:
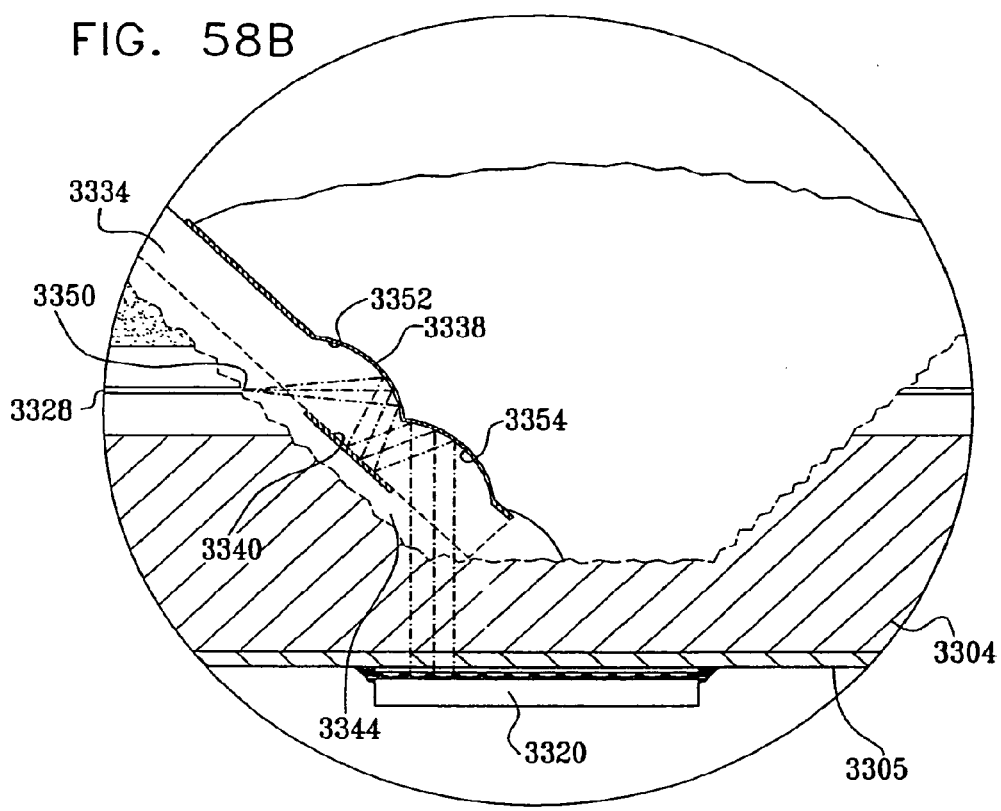

Reference is now made to FIG. 58B, which is an enlarged simplified optical illustration of a portion of FIG. 57 in accordance with a further embodiment of the present invention. In this embodiment, the curvature of curved layer 3338 produces collimation rather than focusing of the light exiting from end 3350 of core 3328 onto the electro-optic component 3320.

Figure 58C:
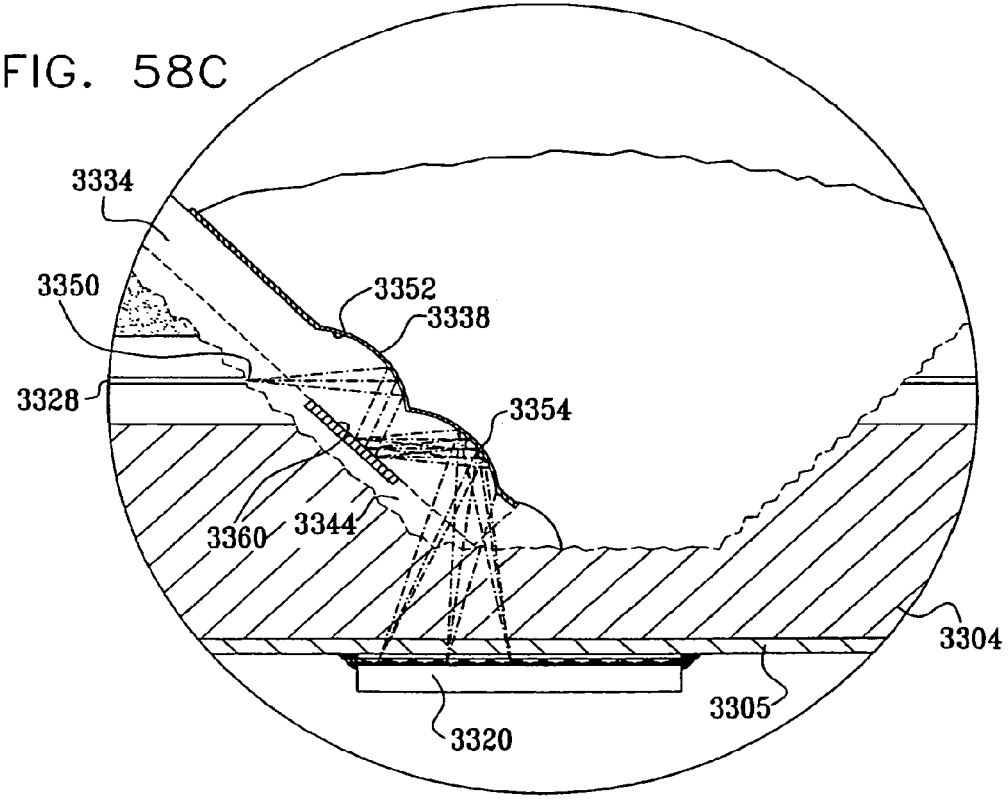

Reference is now made to FIG. 58C, which is an enlarged simplified optical illustration of a portion of FIG. 57 in accordance with yet another embodiment of the present invention wherein a reflective grating 3360 replaces reflective surface 3340. A preferred method of fabrication of mirror assembly 3330 with grating 3360 is described hereinbelow with reference to FIGS. 22A-22F. The additional provision of grating 3360 causes separation of light impinging thereon according to its wavelength, such that multispectral light existing from end 3350 of core 3328 is focused at multiple locations on electro-optic component 3320 in accordance with the wavelengths of components thereof.

It is appreciated that, even though the illustrated embodiments of FIGS. 55C-58C utilize the mirror assemblies whose fabrications are described hereinabove with reference to FIGS. 19A-20F and 22A-22G, any of the mirror assemblies whose fabrications are described hereinabove with reference to FIGS. 18A-24G may alternatively be utilized.

Reference is now made to FIG. 59, which is a simplified pictorial illustration corresponding to sectional illustration 55D. FIG. 59 illustrates the wafer of FIG. 55A, with partially flat and partially concave mirror assembly 3230 mounted thereon, parallel to one of the rough inclined surfaces 3232 defined by notch 3224, as described hereinabove with reference to FIG. 55D. It is appreciated that mirror assembly 3230 extends alone the entire length of substrate 3102.

Figure 60A:
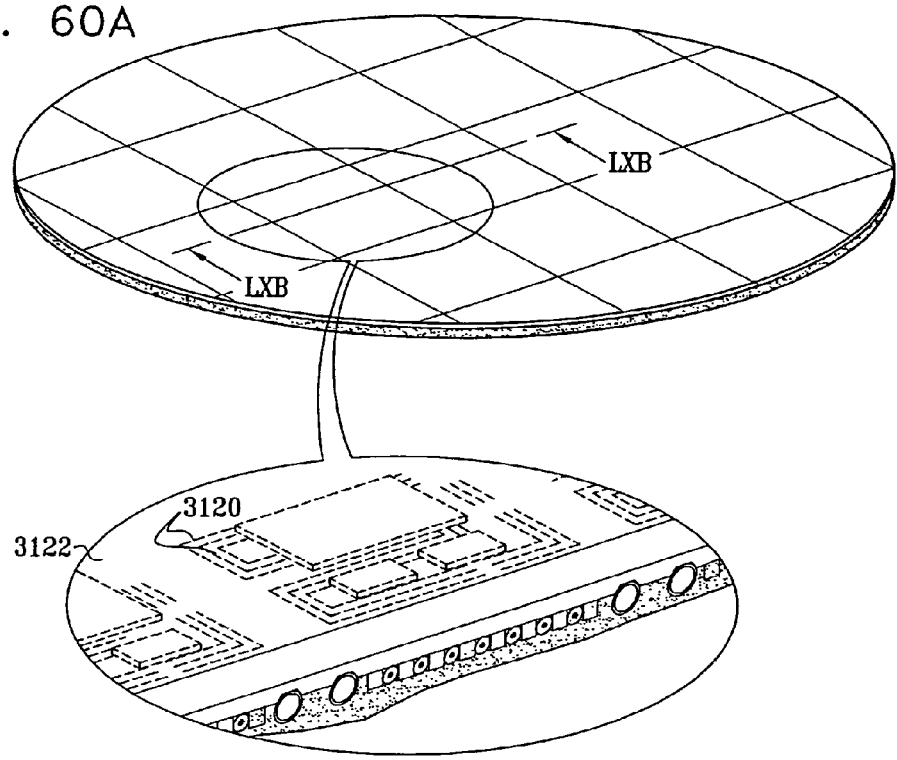
FIGS. 60A-60F are simplified pictorial and sectional illustrations of a fourth plurality of stages in the manufacture of the packaged electro-optic circuit of FIGS. 52A and 52B.
Figure 60B:
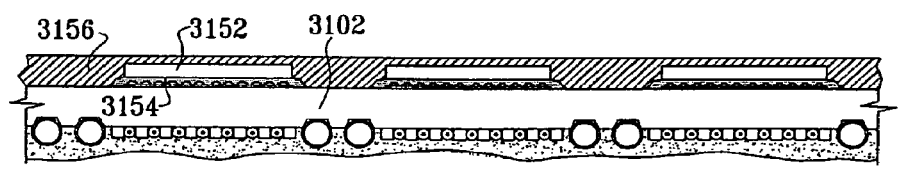
Figure 60C:
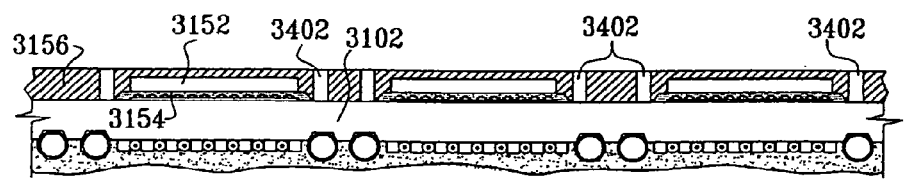
Figure 60D:
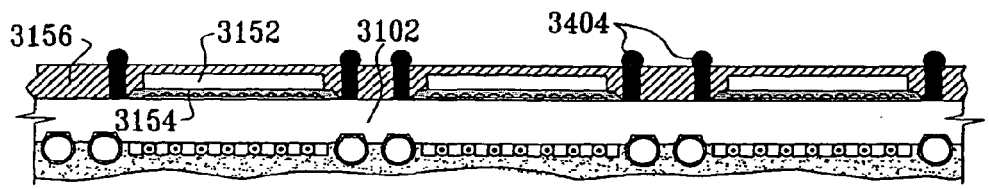

Reference is now made to FIGS. 60A-60F, which are simplified pictorial and sectional illustrations of a fourth plurality of stages in the manufacture of the packaged electro-optic circuit of FIGS. 52A and 52B. FIG. 60A shows the wafer of FIG. 59 turned over. FIG. 60B is a sectional illustration of the wafer of FIG. 60A along lines LXB-LXB. FIG. 60C illustrates the formation of holes 3402 by conventional techniques, such as the use of lasers or photolithography, which communicate with electrical circuits 3120 (FIG. 53A) on substrate 3102. FIG. 60D shows the formation of solder bumps 3404 in holes 3402.

Figure 60E:
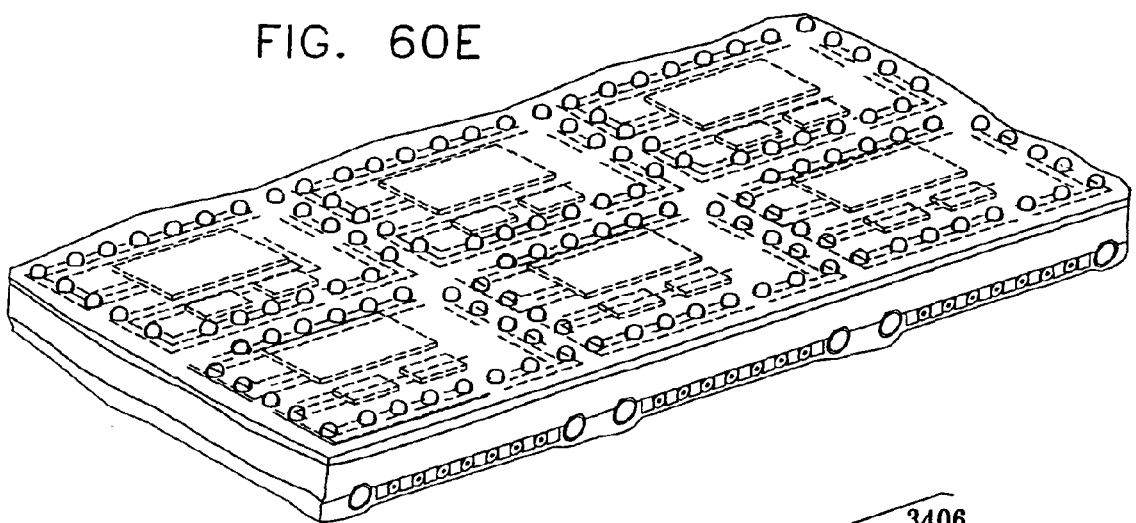
Figure 60F:
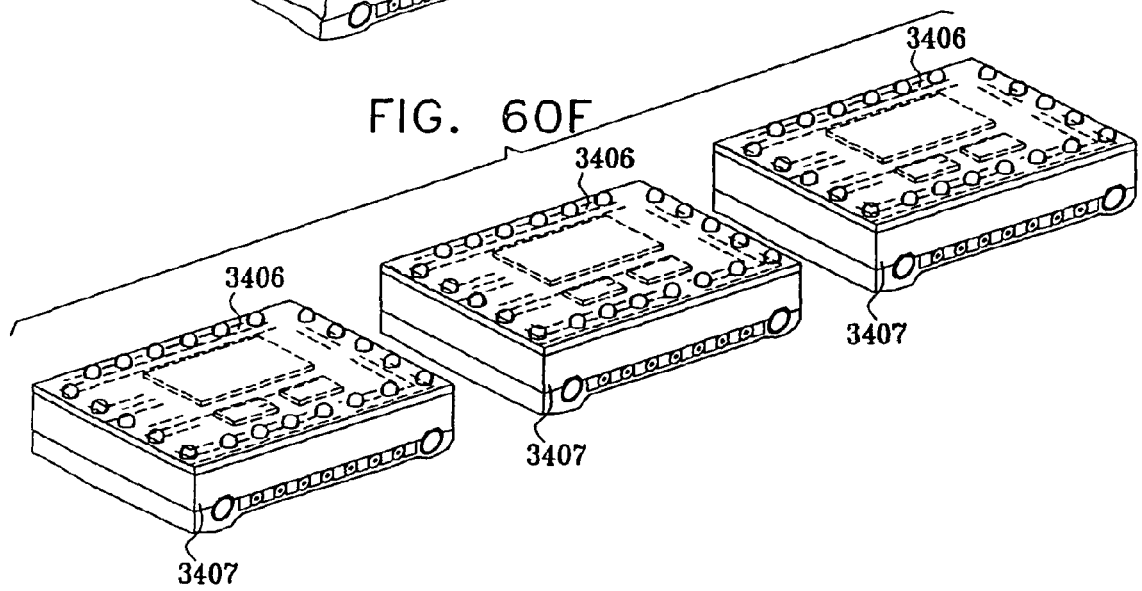

Following the formation of solder bumps 3404 in holes 3402, the wafer, as shown in FIG. 60E, is preferably diced, providing a plurality of packaged electro-optic circuit chips 3406, as illustrated in FIG. 60F. Following dicing of substrate 3102 into a plurality of packaged electro-optic circuit chips 3406, an optical edge surface 3407 of each of the plurality of packaged electro-optic circuit chips 3406 is polished to provide an optical quality planar surface. It is appreciated that the planar surface defined by the polishing may be either parallel, or at any suitable angle, to the plane defined by the dicing.

Figure 61:
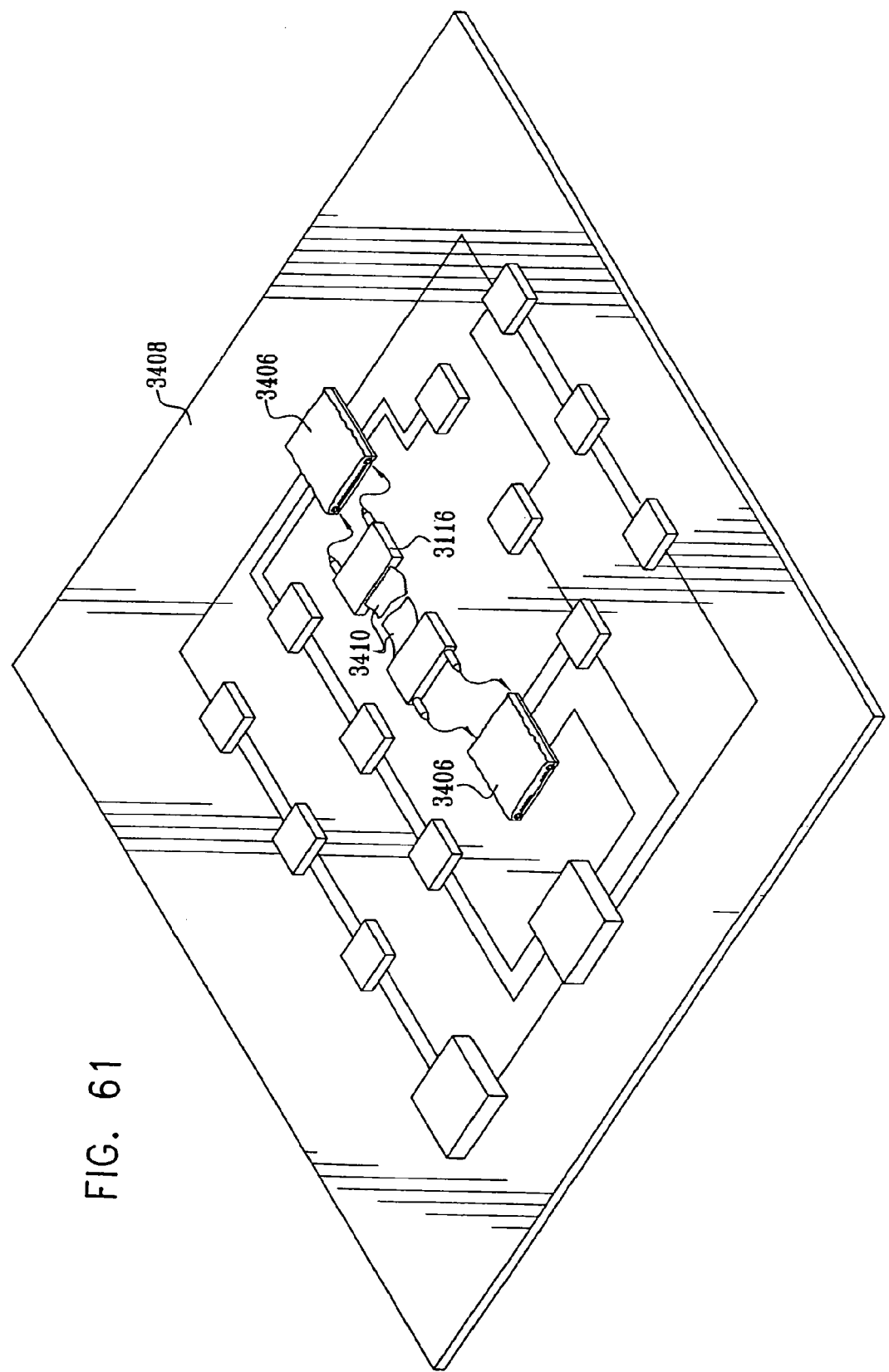
FIG. 61 is a simplified illustration of incorporation of packaged electro-optic circuits of the type shown in FIGS. 52A-52B as parts of a larger electrical circuit.

Reference is now made to FIG. 61, which shows packaged electro-optic circuit chips 3406 mounted on a conventional electrical circuit board 3408 and being interconnected by a conventional optical fiber ribbon 3410 and associated conventional optical fiber connectors 3116 (FIG. 52B).

It will be appreciated by persons skilled in the art that the present invention is not limited by what has been particularly shown and described hereinabove. Rather the scope of the present invention includes both combinations and subcombinations of the various features described hereinabove as well as variations and modifications which would occur to persons skilled in the art upon reading the specification and which are not in the prior art

We claim:

1. A method of fabricating an optoelectronic circuit, comprising:
    forming a plurality of optical fiber positioning elements on a first surface of a semiconductor substrate;
    wherein the plurality of optical fiber positioning elements are physically configured to position an array of optical fibers;
    forming a first plurality of notches substantially perpendicular to the plurality of optical fiber positioning elements, the first plurality of notches, each notch having an inclined surface;
    forming a mirror assembly by forming a plurality of microlenses on a first surface of a glass substrate, depositing a layer of metal over the plurality of microlenses and the glass substrate, and dicing the glass substrate to form individual mirror assemblies; and
    mounting the mirror assembly on the inclined surface of the notch.

2. The method of claim 1, further comprising, mounting a plurality of optical fibers in the plurality of optical fiber positioning elements forming the array of optical fibers, each optical fiber of the array of optical fibers having a core region.

3. The method of claim 1, wherein, each of the first plurality of notches extends through the core region of at least one optical fiber of the array of optical fibers.

4. The method of claim 1, wherein the mounting the mirror assembly comprises:
    depositing optical adhesive between the mirror assembly and the inclined surface; wherein the optical adhesive has a refractive index that is substantially similar to that of the core region of each optical fiber; and
    depositing adhesive within the notch.

5. The method of claim 1, wherein, the glass substrate is substantially within a thickness range of 200-400 micrometers.

6. The method of claim 1, wherein each of the microlens has a refractive index substantially same or similar to that of the glass substrate.

7. The method of claim 1, wherein the layer of metal is deposited via sputtering or evaporation.

8. The method of claim 1, wherein, the layer of metal comprises substantially of aluminum.

9. The method of claim 1, further comprising,
   depositing an additional layer of metal over a second surface of the glass substrate; and
   patterning the additional layer of metal.

10. The method of claim 9, wherein each individual mirror assembly comprises: a pair of microlenses and a flat reflective surface.

11. The method of claim 1, further comprising, forming gratings on the first surface or the second surface of the glass substrate.

12. The method of claim 11, wherein the gratings are formed by etching.

13. The method of claim 12, wherein each individual mirror assembly further comprises: a reflective grating.

14. The method of claim 1, wherein each individual mirror assembly comprises: at least one curved portion.

15. The method of claim 1, further comprising, forming a second plurality of elongated notches substantially parallel to the plurality of optical fiber positioning elements on the first surface.

16. The method of claim 15, further comprising, placing a set of cylindrical elements in the second plurality of elongated notches.

17. The method of claim 15, further comprising, forming an optical connector on a diced edge of each individual mirror assembly.

18. The method of claim 1, wherein, the substrate having a second surface with an electrical circuit formed thereon.

19. The method of claim 18, further comprising, forming a plurality of electrical contacts on the electrical circuit on the second surface of the substrate.

20. The method of claim 19, wherein the plurality of electrical contacts comprises gold studs.

21. The method of claim 19, further comprising, coupling an integrated circuit to the electrical circuit via the plurality of electrical contacts.

22. The method of claim 21, wherein, the integrated circuit comprises electro-optic devices.

23. The method of claim 21, further comprising, depositing an encapsulation layer over the integrated circuit and the electrical circuit.

24. The method of claim 23, wherein, the encapsulation layer comprises solder mask.

25. A method for forming a mirror assembly, comprising:
   forming a plurality of microlenses on a first surface of a glass substrate;
   depositing a layer of metal over the plurality of microlenses and the glass substrate; and
   dicing the glass substrate to form individual mirror assemblies.

26. The method of claim 25, wherein, the glass substrate is substantially within a thickness range of 200-400 micrometers.

27. The method of claim 25, wherein each of the microlens has a refractive index substantially same or similar to that of the glass substrate.

28. The method of claim 25, wherein the layer of metal is deposited via sputtering or evaporation.

29. The method of claim 25, wherein, the layer of metal comprises substantially of aluminum.

30. The method of claim 25, further comprising,
   depositing an additional layer of metal over a second surface of the glass substrate; and
   patterning the additional layer of metal.

31. The method of claim 25, further comprising, forming gratings on the first surface or the second surface of the glass substrate.

* * * * *